(12) United States Patent
Lee et al.

(10) Patent No.: US 9,525,144 B2
(45) Date of Patent: Dec. 20, 2016

(54) ORGANIC LIGHT-EMITTING DIODE

(71) Applicant: Samsung Display Co., LTD., Yongin, Gyeonggi-do (KR)

(72) Inventors: Sun-Young Lee, Yongin (KR); Yoon-Hyun Kwak, Yongin (KR); Bum-Woo Park, Yongin (KR); Jong-Won Choi, Yongin (KR); Wha-Il Choi, Yongin (KR); So-Yeon Kim, Yongin (KR); Ji-Youn Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 609 days.

(21) Appl. No.: 14/016,030

(22) Filed: Aug. 30, 2013

(65) Prior Publication Data

US 2014/0225079 A1 Aug. 14, 2014

(30) Foreign Application Priority Data

Feb. 8, 2013 (KR) .................. 10-2013-0014646

(51) Int. Cl.
*H01L 51/50* (2006.01)
*H01L 51/00* (2006.01)

(52) U.S. Cl.
CPC ....... *H01L 51/0072* (2013.01); *H01L 51/0052* (2013.01); *H01L 51/0058* (2013.01); *H01L 51/0061* (2013.01); *H01L 51/0067* (2013.01); *H01L 51/0073* (2013.01); *H01L 51/5064* (2013.01)

(58) Field of Classification Search
None
See application file for complete search history.

(56) References Cited

U.S. PATENT DOCUMENTS

| 5,635,308 | A | 6/1997 | Inoue et al. |
|---|---|---|---|
| 5,645,948 | A | 7/1997 | Shi et al. |
| 5,972,247 | A | 10/1999 | Shi et al. |
| 6,465,115 | B2 | 10/2002 | Shi et al. |
| 6,596,415 | B2 | 7/2003 | Shi et al. |
| 7,431,997 | B2 | 10/2008 | Hwang et al. |
| 2005/0221124 | A1* | 10/2005 | Hwang ............. C07F 9/5728 428/690 |
| 2011/0193074 | A1 | 8/2011 | Lee et al. |
| 2011/0210318 | A1 | 9/2011 | Bae et al. |
| 2011/0240979 | A1* | 10/2011 | Kim ............. C07D 487/04 257/40 |

FOREIGN PATENT DOCUMENTS

| JP | 8-12600 A | 1/1996 |
|---|---|---|
| JP | 2000-003782 A | 1/2000 |
| KR | 10-2005-0097670 A | 10/2005 |
| KR | 10-0573137 B1 | 4/2006 |
| KR | 10-2010-0023783 A | 3/2010 |
| KR | 10-2010-0039815 A | 4/2010 |
| KR | 10-2010-0108924 A | 10/2010 |
| WO | WO 2010/114264 A2 | 10/2010 |

OTHER PUBLICATIONS

Shi et al., Synthesis, Structure, Properites, and Application of a Carbazole-Based Diaza[7]heliceene in a Deep-Blue-Emitting OLED;2012; Chemistry European Journal;vol. 12, pp. 8091-8099.*
Tang, C.W. et al., Organic Electroluminescent diodes, Appl. Phys. Lett. 51, Sep. 21, 1987, pp. 913-915, vol. (12).
Adachi, Chihaya, et al., Confinement of charge carriers and molecular excitons within 5-nm-thick emitter layer in organic electroluminescent devices with a double heterostructure, Appl. Phys. Lett. 57, Aug. 6, 1990, pp. 531-533, vol. (6).
Sakamoto, Youichi, et al., Synthesis, Characterization, and Electron-Transport Property of Perfluorinated Phenylene Dendrimers, Journal American Chemical Society, Feb. 15, 2000, pp. 1832-1833, vol. 122 (8).
Yamaguchi, Shigehiro, et al., Diphenylamino-Substituted 2,5 Diarylsiloles for Single-Layer Organic Electroluminescent Devices, Chemistry Letters, 2001, pp. 98-99.

\* cited by examiner

*Primary Examiner* — Gregory Clark
(74) *Attorney, Agent, or Firm* — Lewis Roca Rothgerber Christie LLP

(57) ABSTRACT

An organic light-emitting diode includes an emission layer, a hole migration transfer region and an electron migration region between the first and the second electrodes. The organic light-emitting diode (OLED) has low driving voltages, higher luminance, higher efficiency, higher color purity and longer lifetime than a conventional OLED.

20 Claims, 3 Drawing Sheets

ORGANIC LIGHT-EMITTING DIODE

CROSS-REFERENCE TO RELATED APPLICATION

This application claims priority to and the benefit of Korean Patent Application No. 10-2013-0014646, filed on Feb. 8, 2013, in the Korean Intellectual Property Office, the entire content of which is incorporated herein by reference.

BACKGROUND

1. Field

One or more embodiments of the present invention relate to an organic light-emitting diode.

2. Description of the Related Art

Organic light-emitting diodes (OLEDs), which are self-emitting diodes, have advantages such as wide viewing angles, excellent contrast, quick response, high brightness, excellent driving voltage characteristics, and can provide multicolored images.

A typical OLED has a structure including a substrate; and an anode, a hole transport layer (HTL), an second electrode (EML), an electron transport layer (ETL), and a cathode sequentially stacked on the substrate. In this regard, the HTL, the EML, and the ETL are organic thin films formed of organic compounds.

An operating principle of an OLED having the above-described structure is as follows.

When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY

Aspects of one or more embodiments of the present invention are directed toward an organic light-emitting diode having a novel structure.

Additional aspects will be set forth in part in the description which follows and, in part, will be apparent from the description, or may be learned by practice of the presented embodiments.

According to one or more embodiments of the present invention, an organic light-emitting device includes: a substrate; a first electrode on the substrate; a second electrode opposite to the first electrode; an emission layer between the first electrode and the second electrode; a hole migration transfer region between the first electrode and the emission layer; and an electron migration region between the emission layer and the second electrode, wherein the hole migration region includes a first compound represented by Formula 1, and at least one of the hole migration region and the emission layer includes a second compound represented by Formula 100 below:

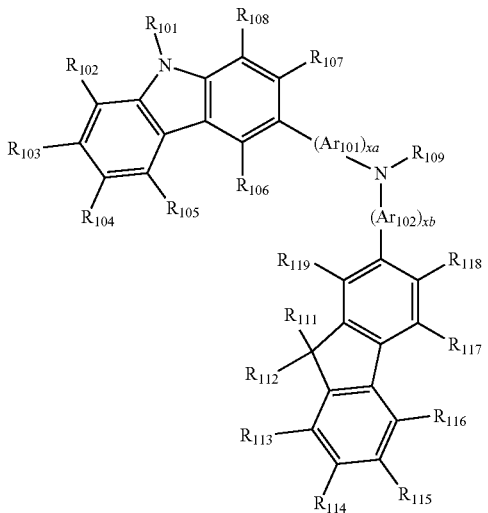

Formula 1

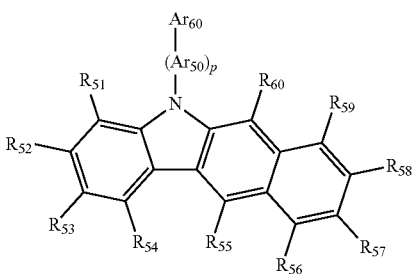

Formula 100 wherein, in Formula 1, $Ar_{101}$ and $Ar_{102}$ are, each independently, a substituted or unsubstituted $C_3$-$C_{10}$ cycloalkylene group, a substituted or unsubstituted $C_2$-$C_{10}$ heterocyclooalkylene group, a substituted or unsubstituted $C_3$-$C_{10}$ cycloalkenylene group, a substituted or unsubstituted $C_2$-$C_{10}$ heterocyclooalkenylene group, a substituted or unsubstituted $C_6$-Cho arylene group, or a substituted or unsubstituted $C_2$-$C_{60}$ heteroarylene group;

xa and xb are, each independently, an integer from 0 to 5;

$R_{101}$ and $R_{109}$ are, each independently, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, or a substituted or unsubstituted $C_2$-$C_{60}$ heteroaryl group; and $R_{102}$ to $R_{108}$, and $R_{111}$ to $R_{119}$ are, each independently, a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —N($Q_1$)($Q_2$), or —Si($Q_3$)($Q_4$)($Q_5$) (where $Q_1$ to $Q_5$ are, each independently, a $C_1$-$C_{60}$ alkyl group, a $C_1$-$C_{60}$ alkoxy group, a $C_6$-$C_{60}$ aryl group, or a $C_2$-$C_{60}$ heteroaryl group), and in Formula 100, i) $R_{56}$ and $R_{57}$ are linked to each other to form a substituted or unsubstituted $C_3$-$C_{60}$ cyclic moiety, or a substituted or unsubstituted $C_2$-$C_{60}$ heterocyclic moiety, and $R_{51}$ to $R_{55}$ and $R_{58}$ to $R_{60}$ are, each independently, a substituent represented by —(Ar$_{51}$)$_q$—(Ar$_{61}$), or ii) $R_{58}$ and $R_{59}$ are linked to each other to form a substituted or unsubstituted $C_3$-$C_{60}$ cyclic moiety, or a substituted or unsubstituted $C_2$-$C_{60}$ heterocyclic moiety, and $R_{51}$ to $R_{57}$ and $R_{60}$ are, each independently, a substituent represented by —(Ar$_{51}$)$_q$—(Ar$_{61}$);

Ar$_{50}$ and Ar$_{51}$ are, each independently, a substituted or unsubstituted $C_3$-$C_{10}$ cycloalkylene group, a substituted or unsubstituted $C_2$-$C_{10}$ heterocyclooalkylene group, a substituted or unsubstituted $C_3$-$C_{10}$ cycloalkenylene group, a $C_2$-$C_{10}$ heterocyclooalkenylene group, a substituted or unsubstituted $C_6$-$C_{60}$ arylene group, or a substituted or unsubstituted $C_2$-$C_{60}$ heteroarylene group;

Ar$_{60}$ and Ar$_{61}$ are, each independently, selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, a substituted or unsubstituted $C_2$-$C_{60}$ heteroaryl group, —N($Q_{21}$)($Q_{22}$), and —Si($Q_{23}$)($Q_{24}$)($Q_{25}$) (where $Q_{21}$ and $Q_{22}$ are, each independently, selected from among a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, and a substituted or unsubstituted $C_2$-$C_{60}$ heteroaryl group; and $Q_{23}$ to $Q_{25}$ are, each independently, selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, and a substituted or unsubstituted $C_2$-$C_{60}$ heteroaryl group); and p and q are, each independently, an integer from 0 to 5.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
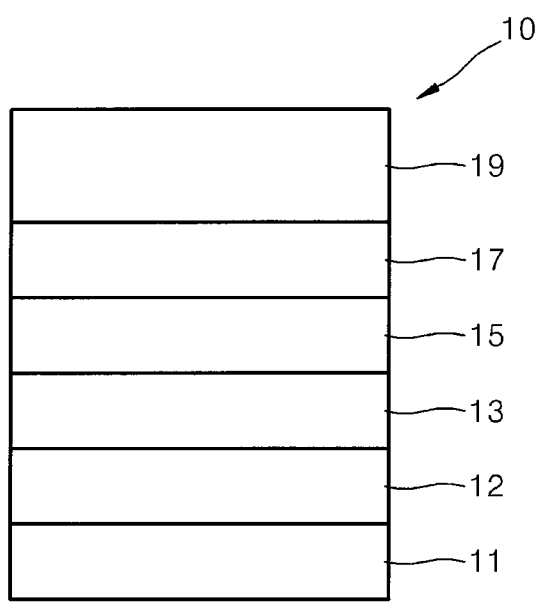
FIG. 1 is a schematic view of a structure of an organic light-emitting diode according to an embodiment of the present invention.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Further, the use of "may" when describing embodiments of the present invention refers to "one or more embodiments of the present invention."

Referring to FIG. 1, an organic light emitting diode 10 according to an embodiment of the present invention has a structure including a substrate 11, a first electrode 12, a hole migration region 13, an emission layer (EML) 15, an electron migration region 17, and a second electrode 19 that are sequentially stacked on one another.

The substrate 11 may be any substrate that is used in existing organic light-emitting diodes. In some embodiments, the substrate 11 may be a glass substrate or a transparent plastic substrate with strong mechanical strength, thermal stability, transparency, surface smoothness, ease of handling, and water resistance.

The first electrode 12 may be formed by depositing or sputtering a first electrode-forming material on the substrate 11. When the first electrode 12 is an anode, a material having a high work function may be used as the first electrode-forming material to facilitate hole injection. The first electrode 12 may be a reflective electrode or a transmission electrode. Transparent and conductive materials (such as ITO, IZO, SnO$_2$, or ZnO) may be used to form the first electrode 12. The first electrode 12 may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode 12 may have a single-layer structure or a multi-layer structure including at least two layers. For example, the first electrode 12 may have a three-layered structure of ITO/Ag/ITO, but is not limited thereto.

The first electrode 12 may be a hole-injecting electrode (anode).

In one embodiment, the second electrode 19 is disposed opposite to the first electrode 12. The second electrode 19 may be a cathode, which is an electron injecting electrode. A metal for forming the second electrode 19 may be a metal, an alloy, an electrically conductive compound, which have a low-work function, or a mixture thereof. In this regard, the second electrode 19 may be formed of lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In some embodiments, to manufacture a top-emission light-emitting diode, the transmission electrode may be formed of indium tin oxide (ITO) or indium zinc oxide (IZO).

In one embodiment, the EML 15 is disposed between the first electrode 12 and the second electrode, the hole migration region 13 is disposed between the first electrode 12 and the EML 15, and the electron migration region 17 is disposed between the EML 15 and the second electrode 19.

In the organic light-emitting diode 10 according to one embodiment, holes are injected through the first electrode 12 to migrate to the EML 15 through the hole migration region 13, while electrons are injected through second electrode 19 to migrate to the EML 15 through the electron migration region 17. The holes and electrons recombine in the EML 15 to generate excitons. When the excitons drop from an excited state to a ground state, light is emitted.

The hole migration region 13 may include at least one layer. That is, the hole migration region 13 may have a single-layered structure or a laminated structure of at least two layers. The electron migration region 17 may include at least one layer. That is, the electron migration region 17 may have a single-layered structure or a laminated structure of at least two layers.

In one embodiment, the hole migration region 13 includes a first compound represented by Formula 1 below, and at least one of the hole migration region 13 and the EML 15 includes a second compound represented by Formula 100 below.

Formula 1

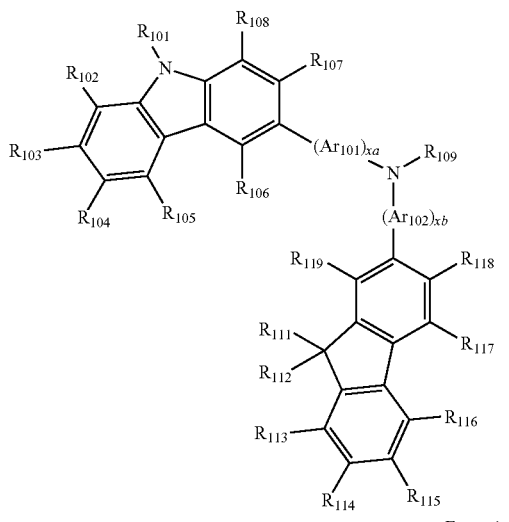

Formula 100

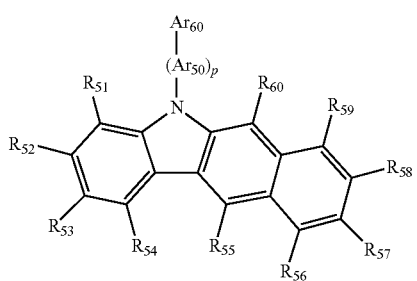

In Formula 1, $Ar_{101}$ and $Ar_{102}$ may be, each independently, a substituted or unsubstituted $C_3$-$C_{10}$ cycloalkylene group, a substituted or unsubstituted $C_2$-$C_{10}$ heterocyclooalkylene group, a substituted or unsubstituted $C_3$-$C_{10}$ cycloalkenylene group, a substituted or unsubstituted $C_2$-$C_{10}$ heterocyclooalkenylene group, a substituted or unsubstituted $C_6$-$C_{60}$ arylene group, or a substituted or unsubstituted $C_2$-$C_{60}$ heteroarylene group.

For example, in Formula 1, $Ar_{101}$ and $Ar_{102}$ may be, each independently, selected from a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted spirofluorenylene group, a substituted or unsubstituted phenalenylene group, a substituted or unsubstituted phenanthrenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinylene group, a substituted or unsubstituted benzo quinolinylene group, a substituted or unsubstituted phthalazinylene group, a substituted or unsubstituted naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzofuranylene group, a substituted or unsubstituted dibenzothiophenylene group, and a substituted or unsubstituted benzocarbazolyl group.

In some embodiments, $Ar_{101}$ and $Ar_{102}$ in Formula 1 may be, each independently, represented by one of Formulae 3-1 to 3-24:

-continued

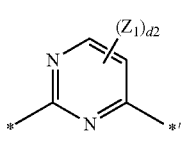

Formula 3-20

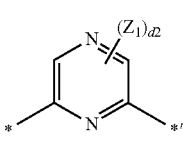

Formula 3-21

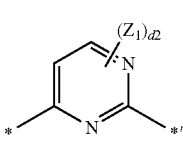

Formula 3-22

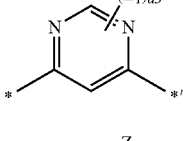

Formula 3-23

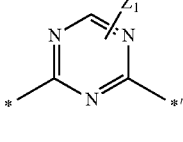

Formula 3-24

In Formulae 3-1 to 3-24, $Y_1$ may be O, S, $C(R_{21})(R_{22})$, or $N(R_{23})$.

In Formulae 3-1 to 3-24, $Z_1$, $Z_2$, and $R_{21}$ to $R_{23}$ may be, each independently, selected from among, a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a $C_6$-$C_{20}$ aryl group and a $C_2$-$C_{20}$ heteroaryl group;

a $C_6$-$C_{20}$ aryl group and a $C_2$-$C_{20}$ heteroaryl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and —$N(Q_{11})(Q_{12})$ and —$Si(Q_{13})(Q_{14})(Q_{15})$ (where $Q_{11}$ to $Q_{15}$ are, each independently, a $C_1$-$C_{20}$alkyl group, a $C_1$-$C_{20}$alkoxy group, a $C_6$-$C_{20}$aryl group, or a $C_2$-$C_{20}$heteroaryl group).

For example, $Z_1$, $Z_2$, and $R_{21}$ to $R_{23}$ may be, each independently, selected from among, a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and —$N(Q_{11})(Q_{12})$ and —$Si(Q_{13})(Q_{14})(Q_{15})$ (where $Q_{11}$ to $Q_{15}$ are, each independently, a $C_1$-$C_{20}$ alkyl group, a $C_1$-$C_{20}$ alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group), but are not limited thereto.

In Formulae 3-1 to 3-24 above, d1 may be an integer from 1 to 4; d2 may be an integer from 1 to 3; d3 may be an integer from 1 to 6; d4 may be an integer from 1 to 8; and d5 may be an integer of 1 or 2.

In some embodiments, $Ar_{101}$, $Ar_{102}$, $Ar_1$, and $Ar_2$ in Formula 1 may be, each independently, represented by one of Formulae 4-1 to 4-7 below, but are not limited thereto:

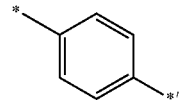

Formula 4-1

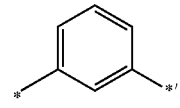

Formula 4-2

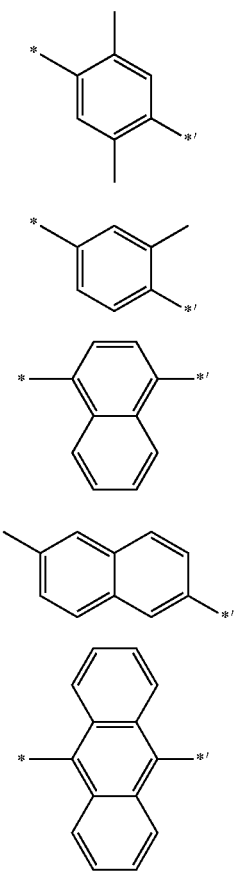

Formula 4-3

Formula 4-4

Formula 4-5

Formula 4-6

Formula 4-7

In Formula 1 above, xa indicates number of $Ar_{101}$s, and xb indicates number of $Ar_{102}$s, wherein xa and xb may be, each independently, an integer from 0 to 5. When xa and/or xb is 0, "carbazole" and/or "fluorene" in Formula 1 may be linked directly to "N". When xa is 2 or greater, the at least two of $Ar_{101}$s may be identical to or different from each other. When xb is 2 or greater, the at least two of $Ar_{102}$s may be identical to or different from each other.

In some embodiments, in Formula 1, i) xa=0 and xb=0; ii) xa=1 and xb=0; iii) xa=2 and xb=0; iv) xa=0 and xb=1; v) xa=0 and xb=2; or vi) xa=1 and xb=1, but not limited thereto.

In Formula 1, $R_{101}$ and $R_{109}$ may be, each independently, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, or a substituted or unsubstituted $C_2$-$C_{60}$ heteroaryl group.

For example, in Formula 1, $R_{101}$ and $R_{109}$ may be, each independently, selected from a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spiro-fluorenyl group, a substituted or unsubstituted phenalenyl group, a substituted or unsubstituted phenanthrenyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzooxazolyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl group, a substituted or unsubstituted dibenzopuranyl group, a substituted or unsubstituted dibenzothiophenyl group, and a substituted or unsubstituted benzocarbazolyl group.

In some other embodiments, $R_{101}$ and $R_{109}$ may be, each independently, represented by one of Formulae 5-1 to 5-22 below:

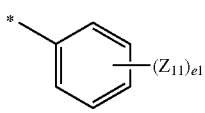

Formula 5-1

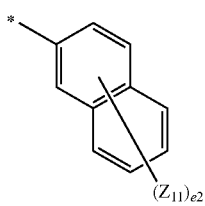

Formula 5-2

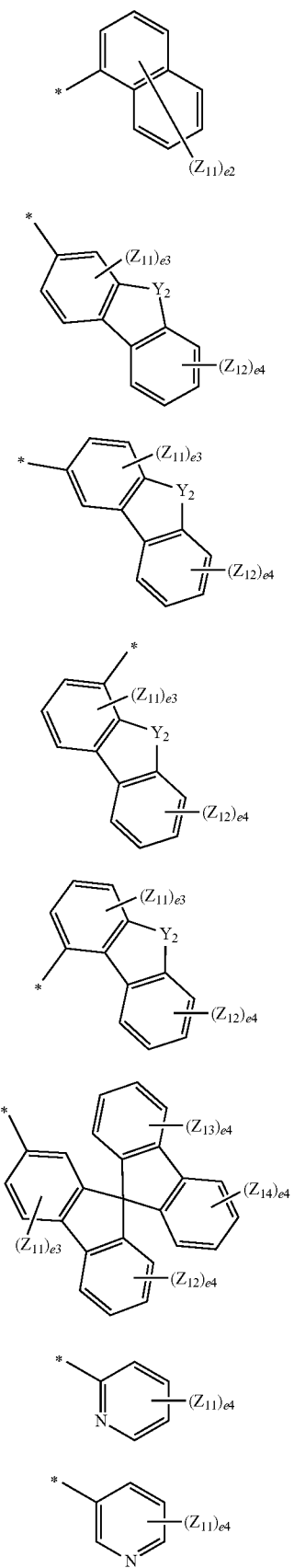
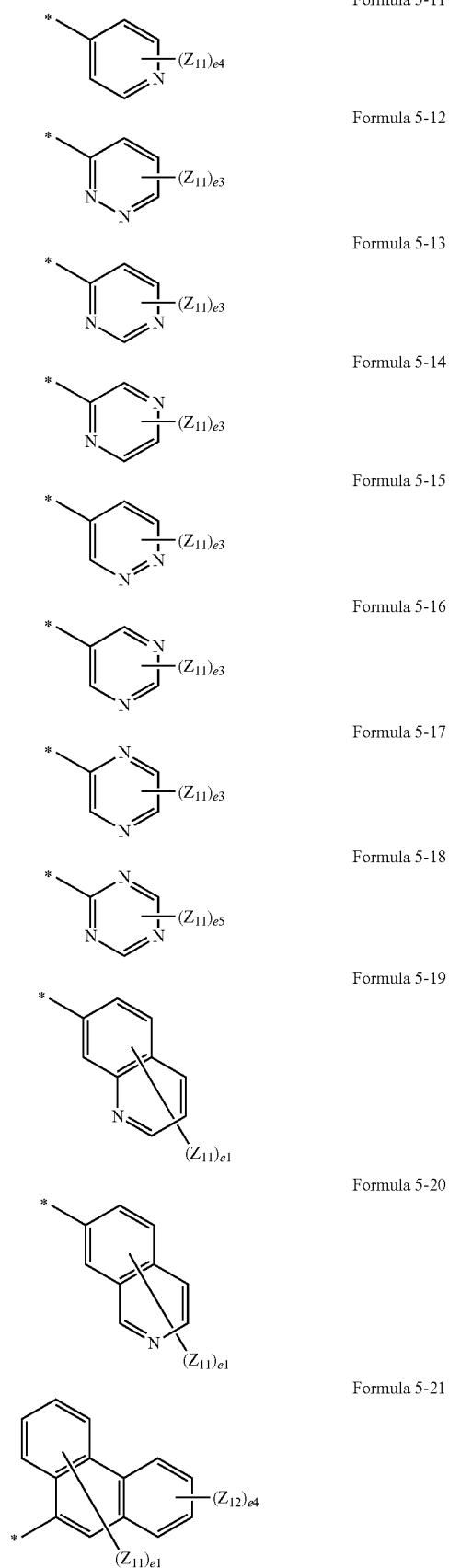

Formula 5-22

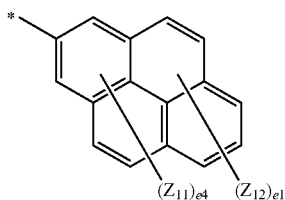

In Formulae 5-1 to 5-22, $Y_2$ may be O, S, $C(R_{25})(R_{26})$, or $N(R_{27})$.

In Formulae 5-1 to 5-22, $Z_{11}$ to $Z_{14}$, and $R_{25}$ to $R_{27}$ may be, each independently, selected from among, a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a $C_6$-$C_{20}$ aryl group, and a $C_2$-$C_{20}$ heteroaryl group;

a $C_6$-$C_{20}$ aryl group and a $C_2$-$C_{20}$ heteroaryl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, $C_1$-$C_{60}$ alkyl group, a $C_2$-$C_{60}$ alkenyl group $C_2$-$C_{60}$ alkynyl group, $C_1$-$C_{60}$ alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and —$N(Q_{11})(Q_{12})$ and —$Si(Q_{13})(Q_{14})(Q_{15})$ (where $Q_{11}$ to $Q_{15}$ are, each independently, a $C_1$-$C_{20}$ alkyl group, a $C_1$-$C_{20}$ alkoxy group, a $C_6$-$C_{20}$ aryl group, or a $C_2$-$C_{20}$ heteroaryl group).

For example, $Z_{11}$ to $Z_{14}$, and $R_{25}$ to $R_{27}$ in Formulae 5-1 to 5-22 may be, each independently, selected from among, a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and —$N(Q_{11})(Q_{12})$ and —$Si(Q_{13})(Q_{14})(Q_{15})$ (where $Q_{11}$ to $Q_{15}$ are, each independently, a $C_1$-$C_{20}$ alkyl group, a $C_1$-$C_{20}$ alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group), but are not limited thereto.

In Formulae 5-1 to 5-22, e1 may be an integer from 1 to 5; e2 may be an integer from 1 to 7; e3 may be an integer from 1 to 3; e4 may be an integer from 1 to 4; and e5 may be an integer of 1 or 2.

For example, $R_{101}$ in Formula 1 may be a group represented by one of Formulae 6-1 to 6-8 below, and $R_{109}$ in Formula 1 may be a group represented by one of Formulae 6-1 to 6-11 below:

Formula 6-1

Formula 6-2
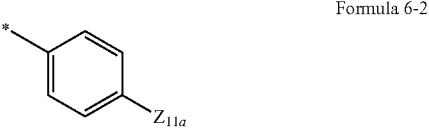

Formula 6-3
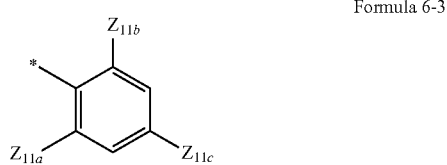

Formula 6-4
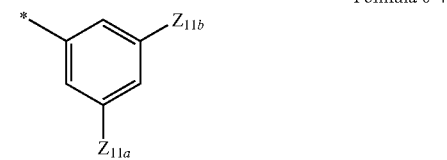

Formula 6-5
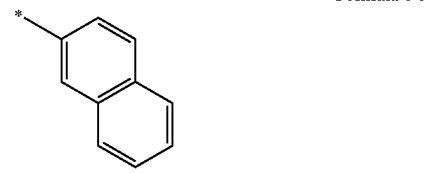

-continued

Formula 6-6
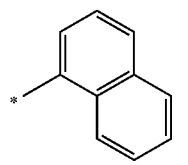

Formula 6-7
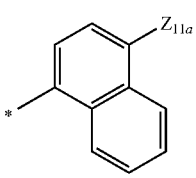

Formula 6-8
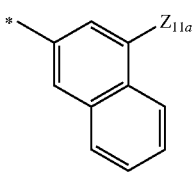

Formula 6-9
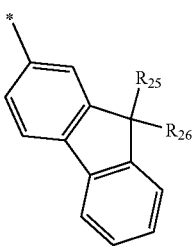

Formula 6-10
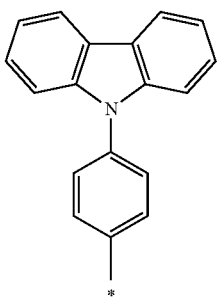

Formula 6-11
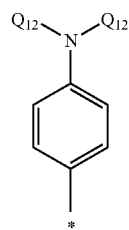

In Formulae 6-1 to 6-11, $Z_{11a}$ to $Z_{11c}$ may be defined the same as $Z_{11}$ described above, and $R_{25}$, $R_{26}$, $Q_{11}$, and $Q_{12}$ may be defined the same as described above.

For example, in Formulae 6-1 to 6-11, $Z_{11a}$ to $Z_{11c}$, $R_{25}$, and $R_{26}$ may be, each independently, selected from among, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and $Q_{11}$ and $Q_{12}$ may be, each independently, a $C_1$-$C_{20}$ alkyl group, a $C_1$-$C_{20}$ alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group.

For example, $R_{111}$ and $R_{112}$ in Formula 1 may be, each independently, selected from among a $C_1$-$C_{20}$ alkyl group;

a $C_1$-$C_{20}$ alkyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group.

In Formula 100, $R_{56}$ and $R_{57}$ may be linked to each other to form a substituted or unsubstituted $C_3$-$C_{60}$ cyclic moiety, or a substituted or unsubstituted $C_2$-$C_{60}$ heterocyclic moiety, and $R_{51}$ to $R_{55}$ and $R_{58}$ to $R_{60}$ may be, each independently, a substituent represented by —$(Ar_{51})_q$—$(Ar_{61})$. In some embodiments, in Formula 100, $R_{58}$ and $R_{59}$ may be linked to each other to form a substituted or unsubstituted $C_3$-$C_{60}$ cyclic moiety, or a substituted or unsubstituted $C_2$-$C_{60}$ heterocyclic moiety, and $R_{51}$ to $R_{57}$ and $R_{60}$ may be, each independently, a substituent represented by —$(Ar_{51})_q$—$(Ar_{61})$.

The second compound may be a compound represented by Formula 100A or 100B below:

Formula 100A

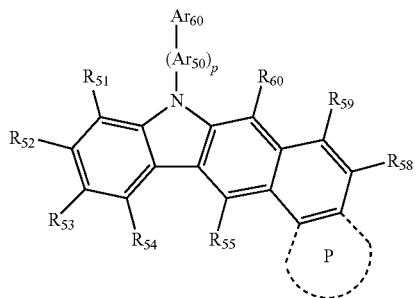

Formula 100B

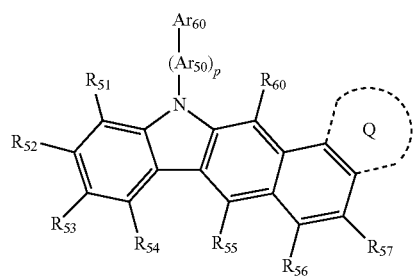

In Formulae 100A and 100B, $Ar_{50}$, $Ar_{60}$, p, and $R_{51}$ to $R_{60}$ may be the same as those described above.

In Formulae 100A and 100B, P ring and Q ring may be, each independently, selected from among, i) benzene, naphthalene, fluorene, carbazole, dibenzofuran, and dibenzothiophene; and ii) benzene, naphthalene, fluorene, carbazole, dibenzofuran, and dibenzothiophene, substituted with one selected from among a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{60}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —$N(Q_{11})(Q_{12})$ (where $Q_{11}$ and $Q_{12}$ may be, each independently, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group).

In some embodiments, $R_{51}$ to $R_{54}$ in Formulae 100A and 100B may all be hydrogen atoms.

In some other embodiments, the second compound may be a compound represented by one of Formulae 100A-1 to 100A-8 and 100B-1 to 100B-9, but is not limited thereto:

Formula 100A-1

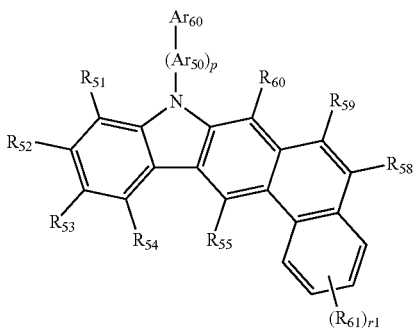

Formula 100A-2

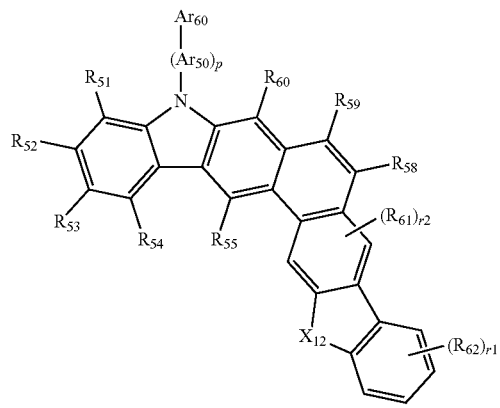

-continued
Formula 100A-3
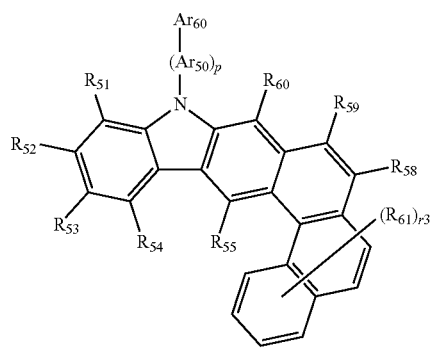
Formula 100A-4
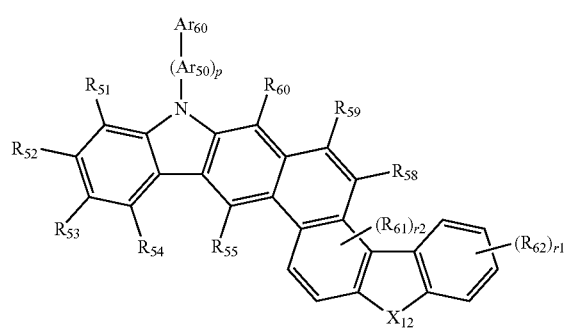
Formula 100A-5
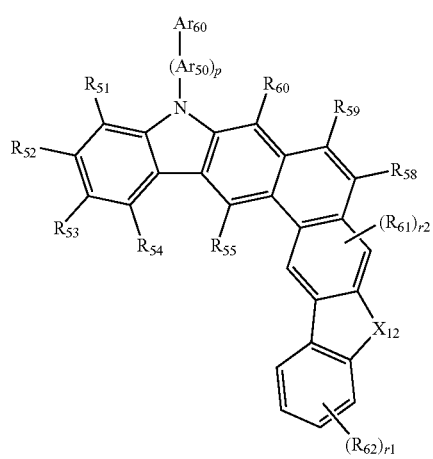
Formula 100A-6
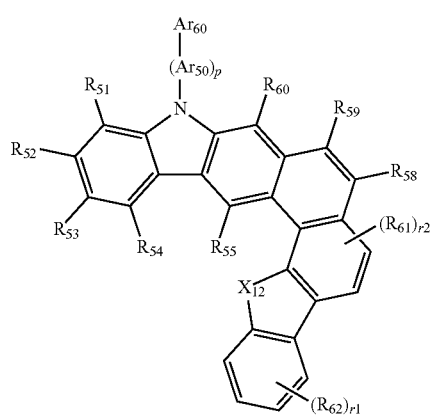
Formula 100A-7
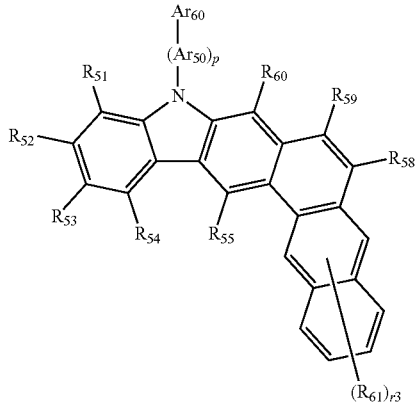
Formula 100A-8
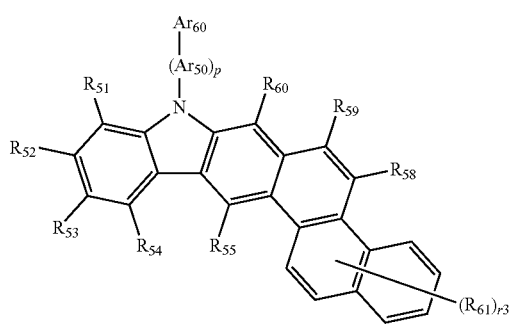
Formula 100B-1
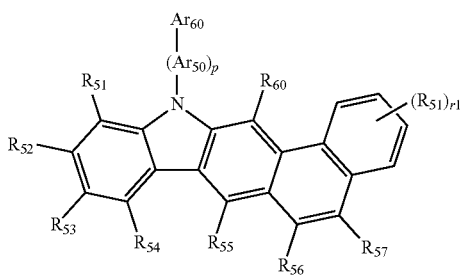
Formula 100B-2
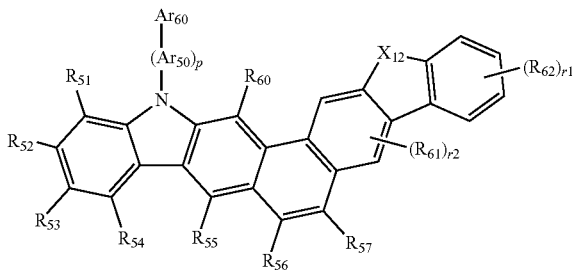

-continued

Formula 100B-3
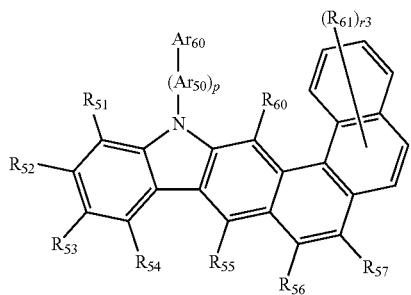

Formula 100B-4
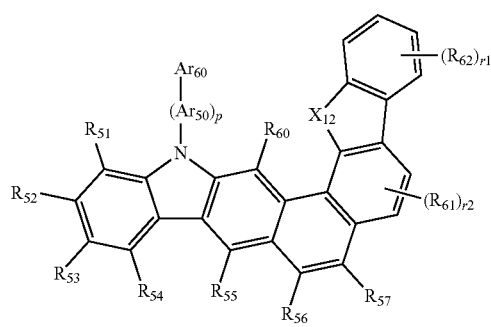

Formula 100B-5
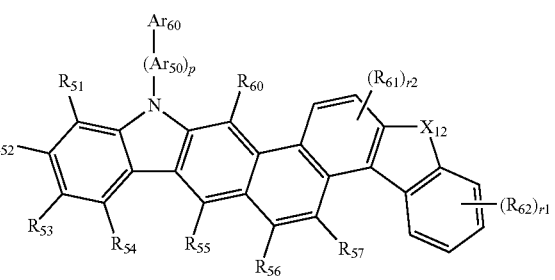

Formula 100B-6
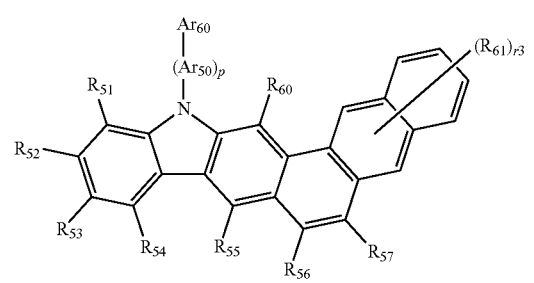

Formula 100B-7
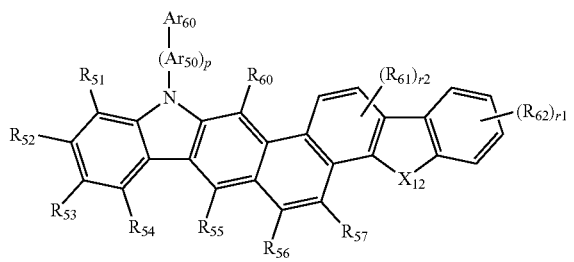

-continued

Formula 100B-8
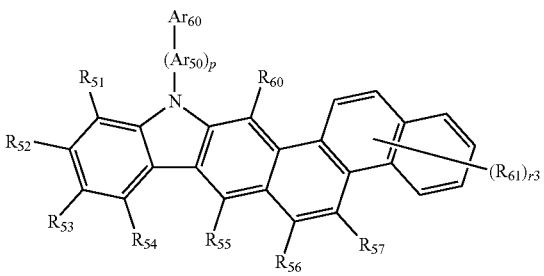

Formula 100B-9
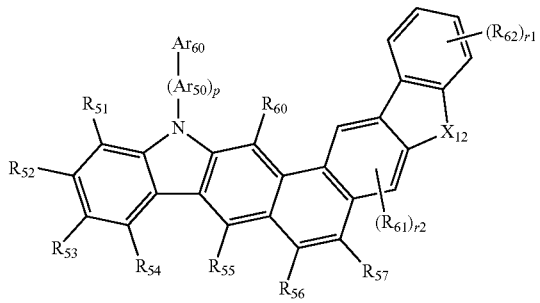

In Formulae 100A-1 to 100A-8 and 100B-1 to 100B-9,
$R_{51}$ to $R_{60}$, $Ar_{50}$, $Ar_{60}$, and p may be the same as those described above;

$X_{12}$ may be O, S, $C(R_{71})(R_{72})$, or $N(R_{73})$;

$R_{61}$, $R_{62}$, and $R_{71}$ to $R_{73}$ may be, each independently, selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{50}$ aryloxy group, a $C_6$-$C_{60}$ arylthio group, and a $C_2$-$C_{60}$ heteroaryl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —$N(Q_{11})(Q_{12})$, and —$Si(Q_{11})(Q_{12})(Q_{13})$ (where $Q_{11}$ and $Q_{12}$ may be, each independently, a $C_6$-$C_{60}$ aryl group or a $C_2$-$C_{60}$ heteroaryl group, and $Q_{13}$ to $Q_{15}$ are, each independently, a $C_1$-$C_{60}$ alkyl group, a $C_1$-$C_{60}$ alkoxy group, a $C_6$-$C_{60}$ aryl group, or a $C_2$-$C_{60}$ heteroaryl group);

r1 may be an integer from 1 to 4; r2 may be 1 or 2; and r3 may be an integer from 1 to 6.

For example, in Formulae 100A-1 to 100A-8 and 100B-1 to 100B-9, $R_{61}$, $R_{62}$, and $R_{71}$ to $R_{73}$ may be, each independently, selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{60}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —$N(Q_{11})(Q_{12})$, and —$Si(Q_{11})(Q_{12})(Q_{13})$ (where $Q_{11}$ and $Q_{12}$ may be, each independently, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group; and $Q_{13}$ to $Q_{15}$ may be, each independently, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group), but are not limited thereto.

In Formula 100, $Ar_{50}$ and $Ar_{51}$ may be, each independently, selected from a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted spiro-fluorenylene group, a substituted or unsubstituted phenalenylene group, a substituted or unsubstituted phenanthrenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinylene group, a substituted or unsubstituted benzoquinolinylene group, a substituted or unsubstituted phthalazinylene group, a substituted or unsubstituted naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzopuranylene group, a substituted or unsubstituted dibenzothiophenylene group, and a substituted or unsubstituted benzocarbazolylene group, but are not limited thereto.

In some embodiments, in Formula 100, $Ar_{50}$ and $Ar_{51}$ may be, each independently, selected from among i) a phenylene group, a naphthylene group, a fluorenylene group, a pyridinylene group, a pyrazinylene group, a pyrimidinylene group, a pyridazinylene group, a quinolinylene group, a carbazolylene group, a triazinylene group, a dibenzofuranylene group, and a dibenzothiophenylene group, and ii) a phenylene group, a naphthylene group, a fluorenylene group, a pyridinylene group, a pyrazinylene group, a pyrimidinylene group, a pyridazinylene group, a quinolinylene group, a carbazolylene group, a triazinylene group, a dibenzofuranylene group, and a dibenzothiophenylene group, substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group.

In some other embodiments, in Formula 100, $Ar_{50}$ and $Ar_{51}$ may be, each independently, selected from among groups represented by Formulae 102-1 to 102-5:

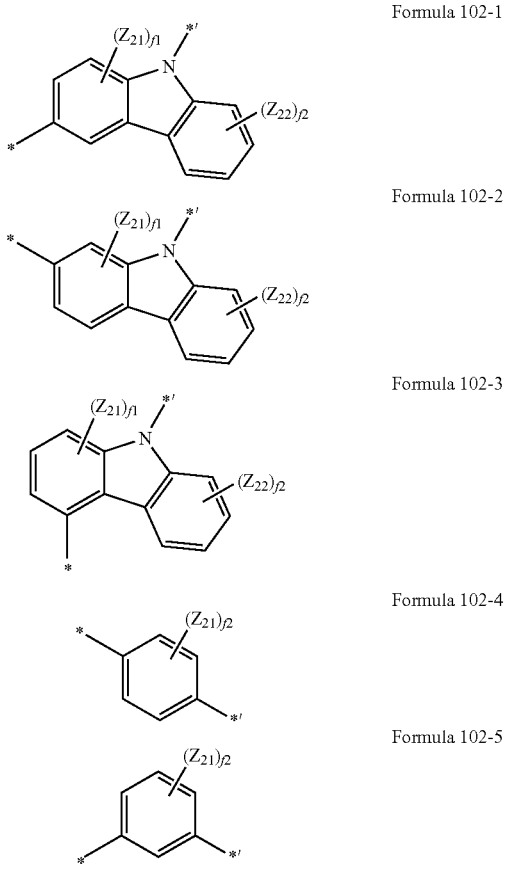

Formula 102-1

Formula 102-2

Formula 102-3

Formula 102-4

Formula 102-5

In Formulae 102-1 to 102-5, $Z_{21}$ and $Z_{22}$ may be, each independently, selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group;

$f_1$ may be an integer from 1 to 3;
$f_2$ may be an integer from 1 to 4;

\* indicates a binding site of a core in Formula 1, or a binding site of other $Ar_{50}$ or $Ar_{51}$ spaced from the core of Formula 1;

\*' indicates a binding site of $Ar_{50}$ or $Ar_{51}$ spaced from the core of Formula 1, or a binding site of $Ar_{60}$ or $Ar_{61}$.

In Formula 100, $Ar_{60}$ and $Ar_{61}$ may be, each independently, selected from among a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphtyl group, a substituted or unsubstituted fluorenyl group, a substituted or unsubstituted spiro-fluorenyl group, a substituted or unsubstituted phenalenyl group, a substituted or unsubstituted phenanthrenyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzooxazolyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl group, a substituted or unsubstituted dibenzopuranyl group, a substituted or unsubstituted dibenzothiophenyl group, a substituted or unsubstituted benzocarbazolylene group, and —$N(Q_{21})(Q_{22})$ (where $Q_{21}$ and $Q_{22}$ may be, each independently, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group).

In some other embodiments, $Ar_{60}$ and $Ar_{61}$ in Formula 100 may be, each independently, selected from among groups represented by Formulae 103-1 to 103-16:

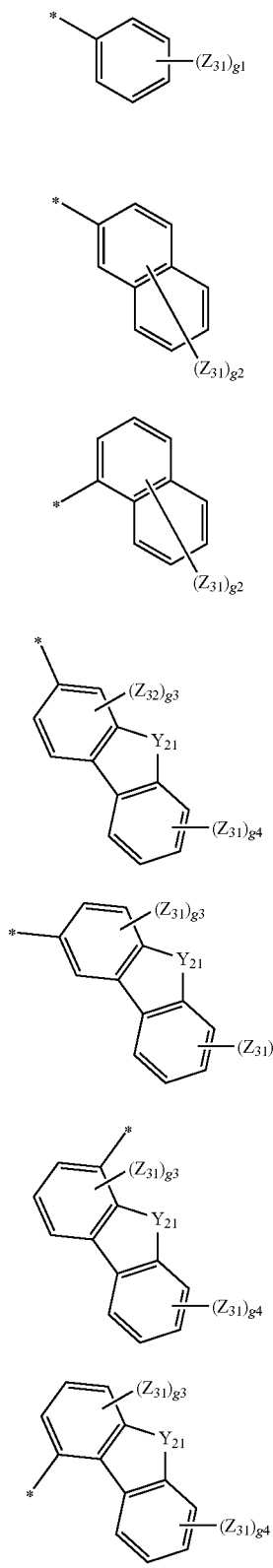

Formula 103-1

Formula 103-2

Formula 103-3

Formula 103-4

Formula 103-5

Formula 103-6

Formula 103-7

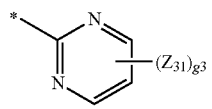

Formula 103-8

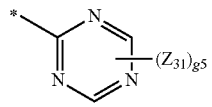

Formula 103-9

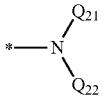

Formula 103-10

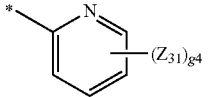

Formula 103-11

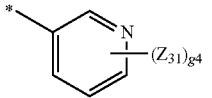

Formula 103-12

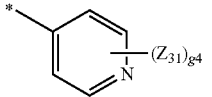

Formula 103-13

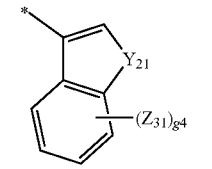

Formula 103-14

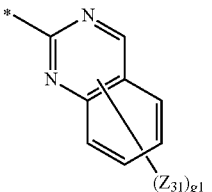

Formula 103-15

Formula 103-16

In Formulae 103-1 to 103-16, $Y_{21}$ may be O, S, $C(Z_{41})(Z_{42})$, or $N(Z_{43})$;

$Z_{31}$, $Z_{32}$, and $Z_{41}$ to $Z_{43}$ may be, each independently, selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group;

$Q_{21}$ and $Q_{22}$ may be, each independently, selected from among a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group;

g1 may be an integer from 1 to 5; g2 may be an integer from 1 to 7; g3 may be an integer from 1 to 3; g4 may be an integer from 1 to 4; and g5 may be 1 or 2. However, embodiments of the present invention are not limited thereto.

In Formula 100, "p" in —$(Ar_{50})_p$—$(Ar_{60})$ indicates the number of $Ar_{50}$s, and may be an integer from 0 to 5. When p is 0, $Ar_{60}$ may be directly linked to nitrogen in Formula 100. When p is 2 or greater, the two or more $Ar_{50}$s may be identical to or differ from each other. In Formula 100, "q" in —$(Ar_{51})_q$—$(Ar_{61})$ indicates the number of $Ar_{51}$s, and may be an integer from 0 to 5. When q is 0, $Ar_{61}$ may be directly linked to the core of Formula 100. When q is 2 or greater, the two or more $Ar_{51}$s may be identical to or differ from each other.

In some embodiments, the first compound may be a compound represented by Formula 1A, 1B, or 1C below:

Formula 1A

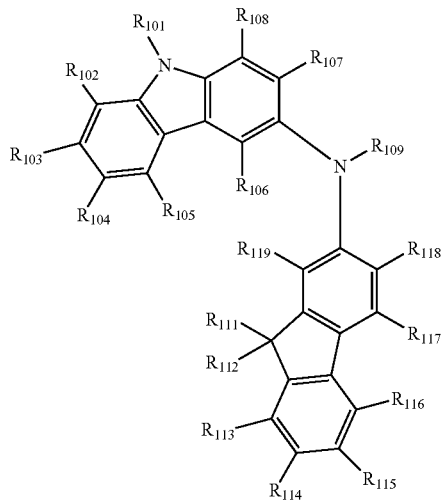

Formula 1B

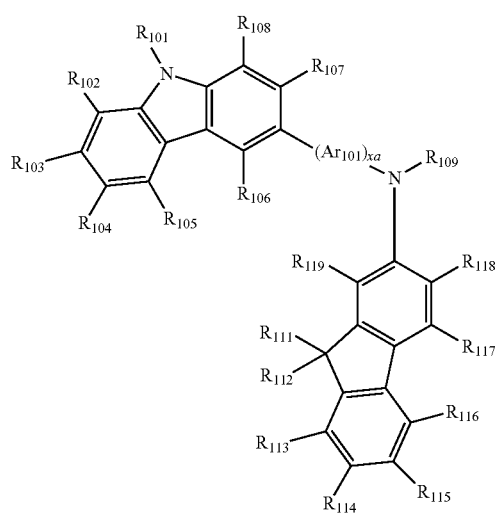

Formula 1C

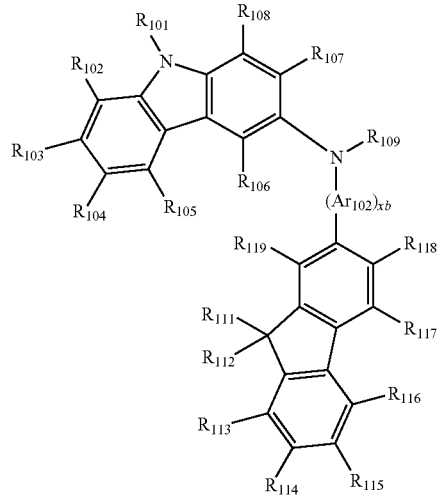

The substitutents in Formulae 1A, 1B, and 1C may be the same as those described above.

For example, in Formulae 1A, 1B, and 1C, $Ar_{101}$ and $Ar_{102}$ may be, each independently, a group represented by one of Formulae 3-1 to 3-24;

xa and xb may be, each independently, 1 or 2;

$R_{101}$ and $R_{109}$ may be, each independently, a group represented by one of Formulae 5-1 to 5-22;

$R_{111}$ and $R_{112}$ may be, each independently, one selected from among a $C_1$-$C_{20}$ alkyl group;

a $C_1$-$C_{20}$ alkyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and $R_{102}$ to $R_{108}$ and $R_{113}$ to $R_{119}$ may be, each independently, selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, but are not limited thereto.

For example, in Formulae 1A, 1B, and 1C, $Ar_{101}$ and $Ar_{102}$ may be, each independently, a group represented by one of Formulae 4-1 to 4-7;

xa and xb may be, each independently, 1 or 2;

$R_{101}$ may be a group represented by one of Formulae 6-1 to 6-8;

$R_{109}$ may be a group represented by one of Formulae 6-1 to 6-11;

$R_{111}$ and $R_{112}$ may be, each independently, one selected from among a $C_1$-$C_{20}$ alkyl group;

a $C_1$-$C_{20}$ alkyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and $R_{102}$ to $R_{108}$ and $R_{113}$ to $R_{119}$ may be hydrogen atoms.

In some other embodiments, the second compound may be represented by Formula 100A-HLT or 100B-HLT.

Formula 100A-HLT

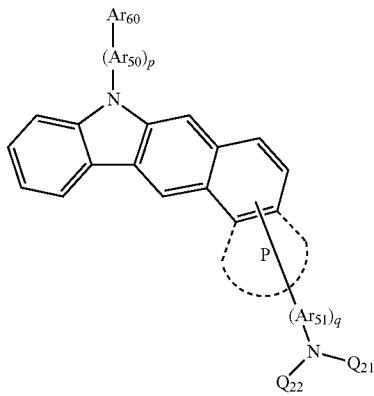

Formula 100B-HLT

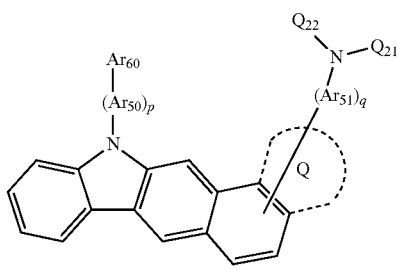

The substituents in Formulae 100A-HLT and 100B-HLT may be the same as those described above.

For example, in Formulae 100A-HLT and 100B-HLT,

P ring and Q ring may be, each independently, selected from among i) benzene, naphthalene, fluorene, carbazole, dibenzofuran, and dibenzothiophene; and ii) benzene, naphthalene, fluorene, carbazole, dibenzofuran, and dibenzothiophene, substituted with at least one selected from among a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{60}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —N($Q_{11}$)($Q_{12}$) (where $Q_{11}$ and $Q_{12}$ are, each independently, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group);

$Ar_{50}$ and $Ar_{51}$ may be, each independently, selected from among i) a phenylene group, a naphthylene group, a fluorenylene group, a pyridinylene group, a pyrazinylene group, a pyrimidinylene group, a pyridazinylene group, a quinolinylene group, a carbazolylene group, a triazinylene group, a dibenzopuranylene group, and a dibenzothiophenylene group, and ii) a phenylene group, a naphthylene group, a fluorenylene group, a pyridinylene group, a pyrazinylene group, a pyrimidinylene group, a pyridazinylene group, a quinolinylene group, a carbazolylene group, a triazinylene group, a dibenzopuranylene group, and a dibenzothiophenylene group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group;

p and q may be, each independently, 0, 1, or 2; and $Ar_{61}$, $Q_{21}$, and $Q_{22}$ may be, each independently, selected from among a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group.

In some embodiments, the second compound may be a compound represented by Formula 100A-H1 or 100B-H1 below:

Formula 100A-H1

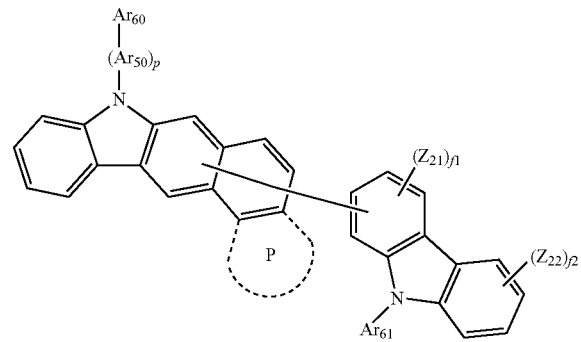

-continued

Formula 100B-H1

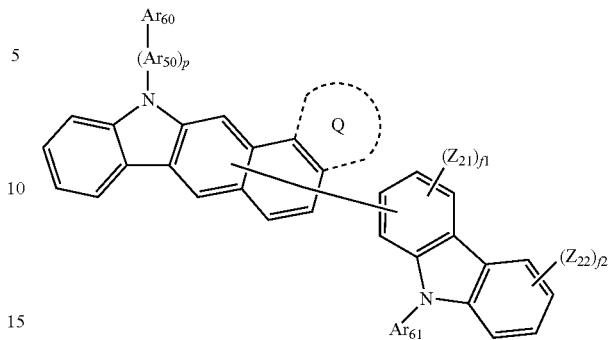

The substituents in Formulae 100A-H1 and 100B-H1 may be the same as those described above.

For example, in Formulae 100A-H1 and 100B-H1,

P ring and Q ring may be, each independently, selected from among i) benzene, naphthalene, fluorene, carbazole, dibenzofuran, and dibenzothiophene, and ii) benzene, naphthalene, fluorene, carbazole, dibenzofuran, and dibenzothiophene, substituted with at least one selected from among a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{60}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —N($Q_{11}$)($Q_{12}$) (where $Q_{11}$ and $Q_{12}$ may be, each independently, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group);

Ar$_{50}$ and Ar$_{51}$ may be, each independently, selected from among i) a phenylene group, a naphthylene group, a fluorenylene group, a pyridinylene group, a pyrazinylene group, a pyrimidinylene group, a pyridazinylene group, a quinolinylene group, a carbazolylene group, a triazinylene group, a dibenzopuranylene group, and a dibenzothiophenylene group, and ii) a phenylene group, a naphthylene group, a fluorenylene group, a pyridinylene group, a pyrazinylene group, a pyrimidinylene group, a pyridazinylene group, a quinolinylene group, a carbazolylene group, a triazinylene group, a dibenzopuranylene group, and a dibenzothiophenylene group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group;

p and q may be, each independently, 0, 1, or 2;

$Z_{21}$ and $Z_{22}$ may be, each independently, selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group;

f1 and f2 may be, each independently, 0, 1, or 2; and

Ar$_{60}$ and Ar$_{61}$ may be, each independently, selected from among groups represented by Formulae 103-1 to 103-16.

In some other embodiments, the first compound of Formula 1 may be one of Compounds 1-1 to 1-19 below, but is not limited thereto:

1-1

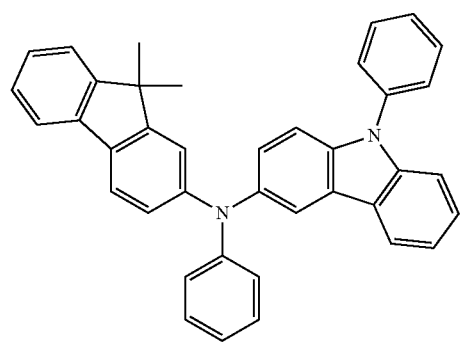

1-2

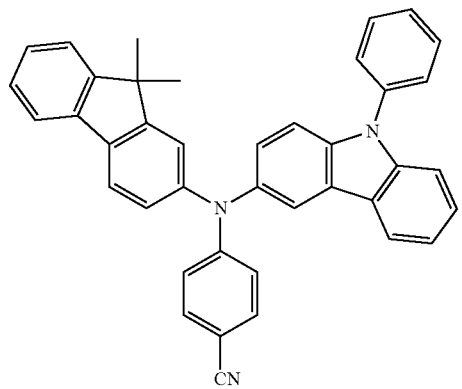

1-3

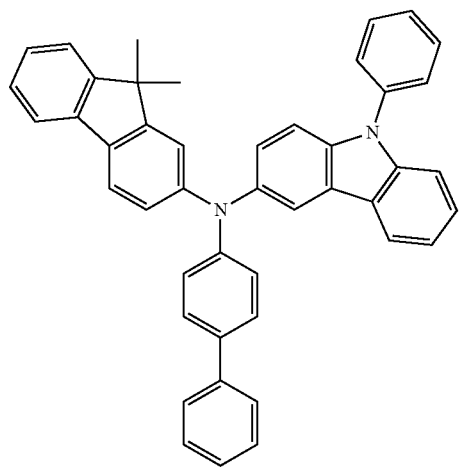

1-4

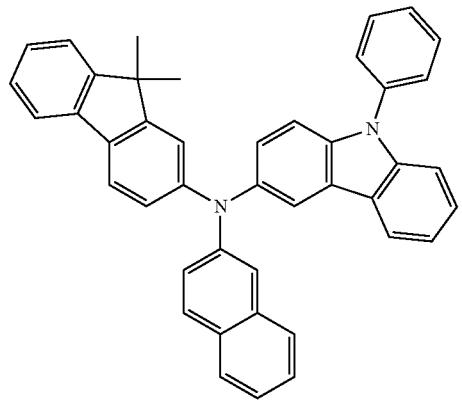

1-5
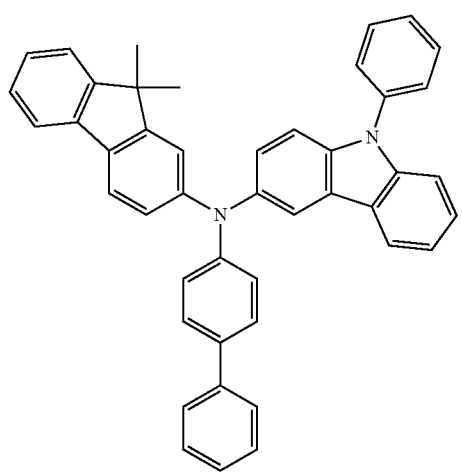
1-6
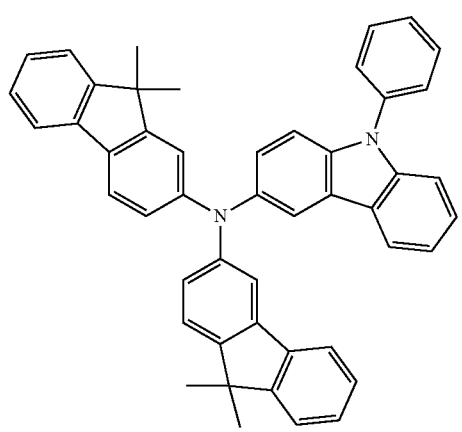
1-7
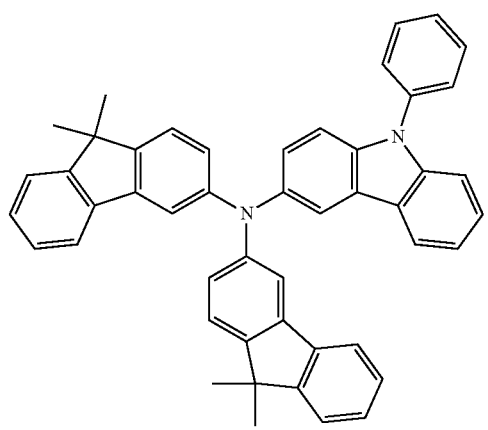
1-8
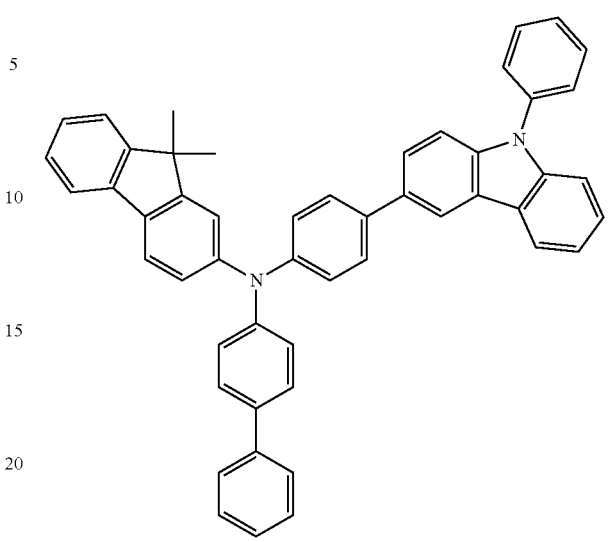
1-9
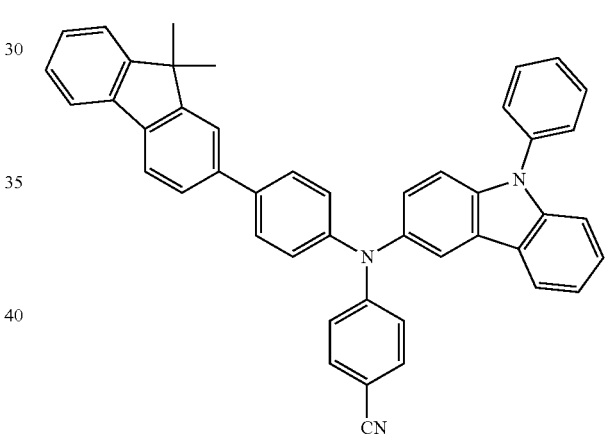
1-10
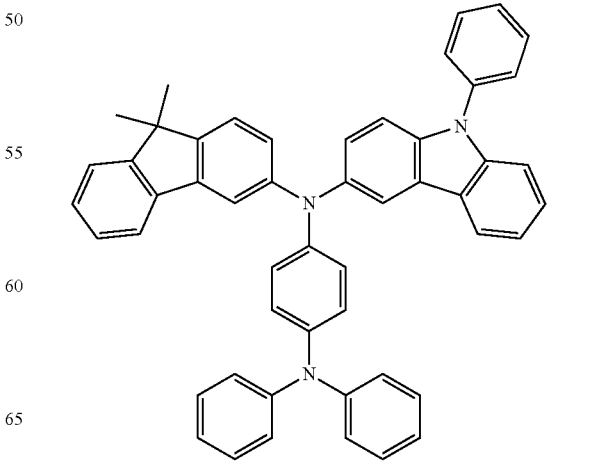

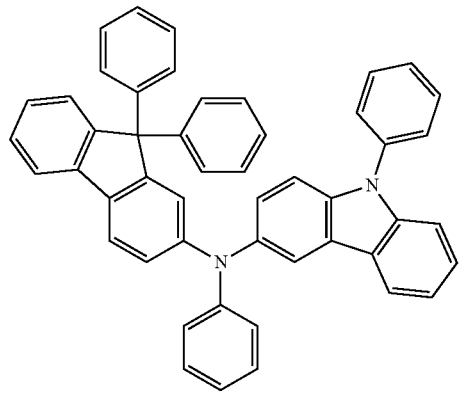
1-11
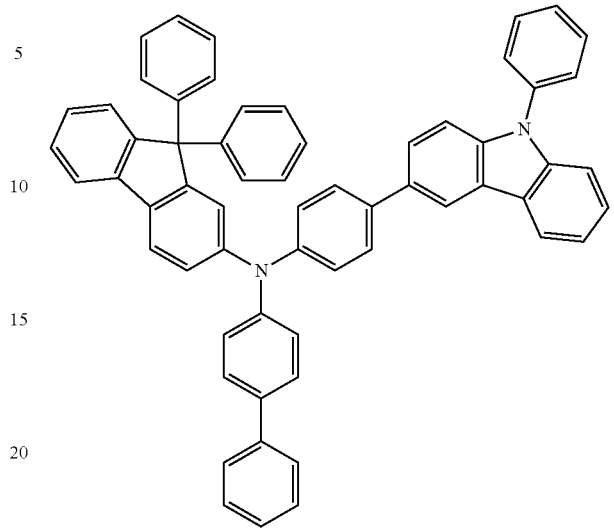
1-14
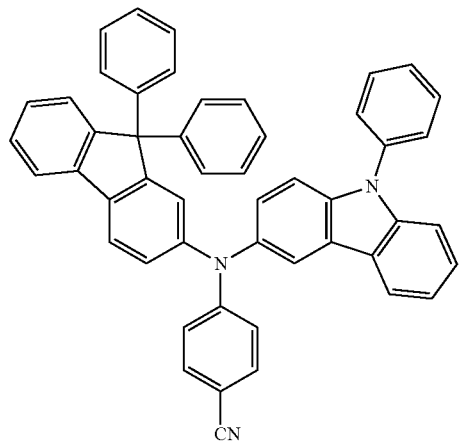
1-12
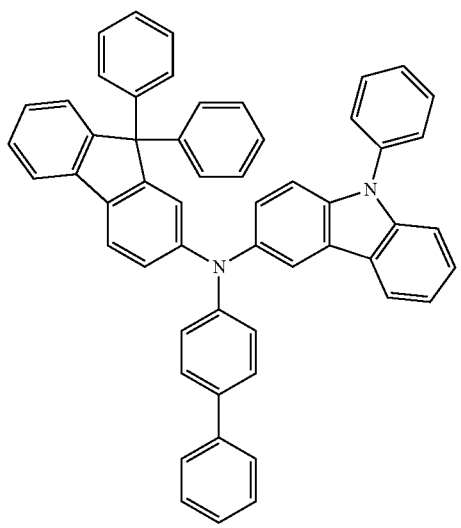
1-15
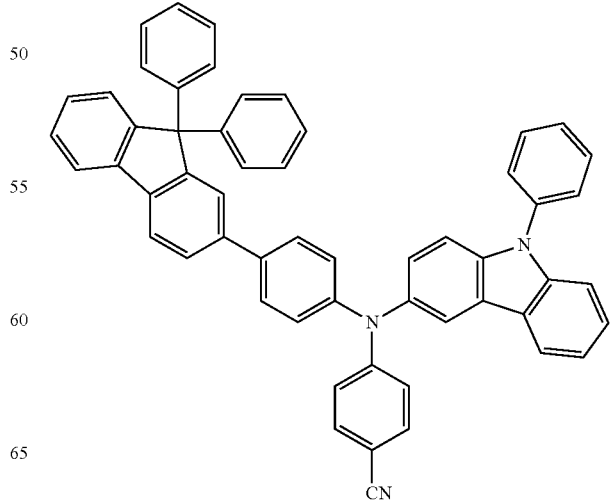
1-16
1-13

1-17
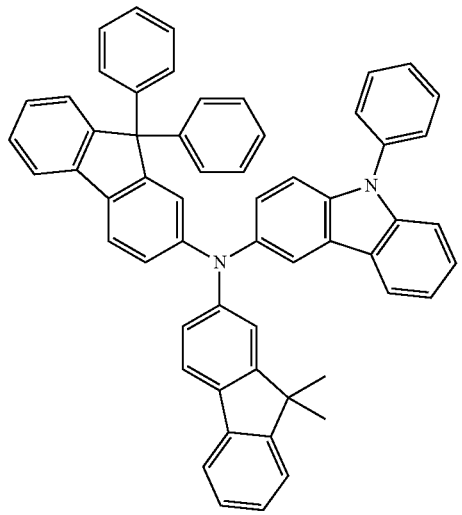
In some other embodiments, the second compound of Formula 100 may be one of Compounds 2-1 to 2-30 below, but is not limited thereto:
2-1
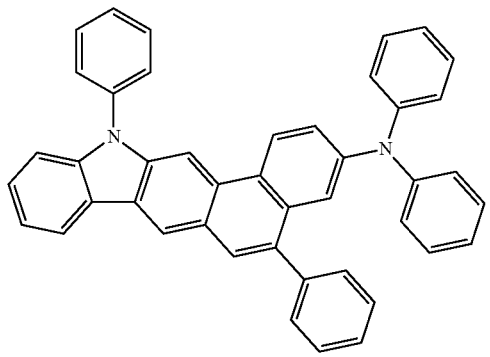
1-18
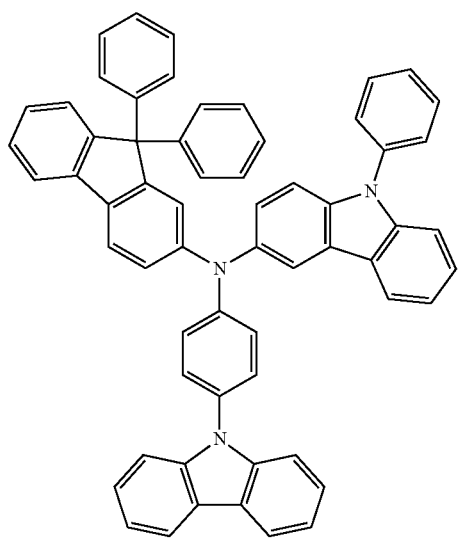
2-2
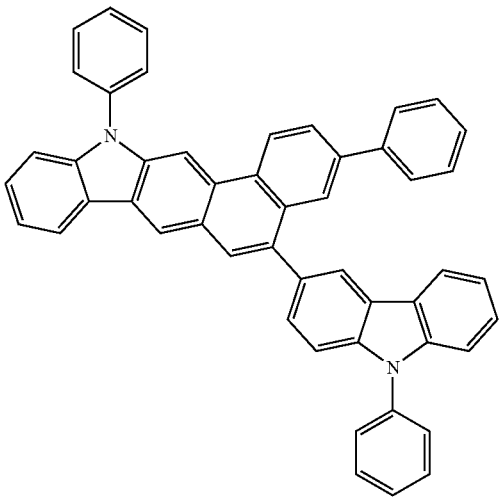
1-19
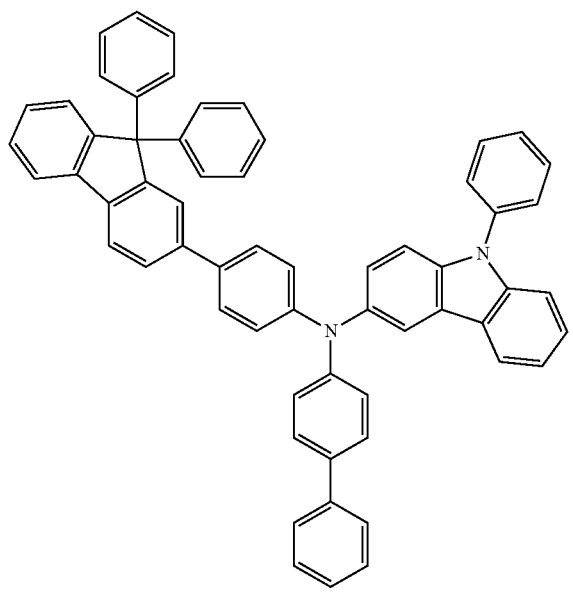
2-3
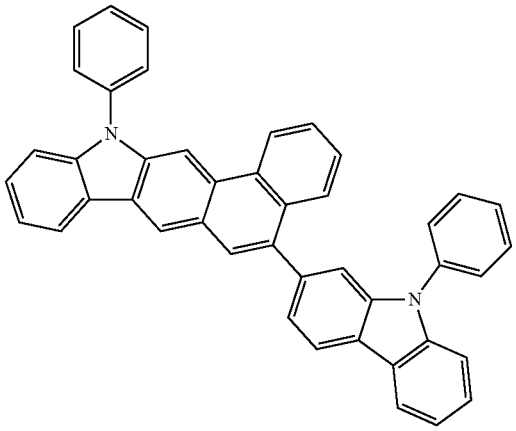

-continued
2-4
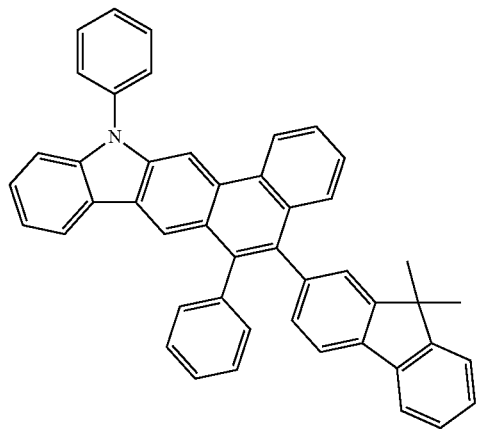
2-5
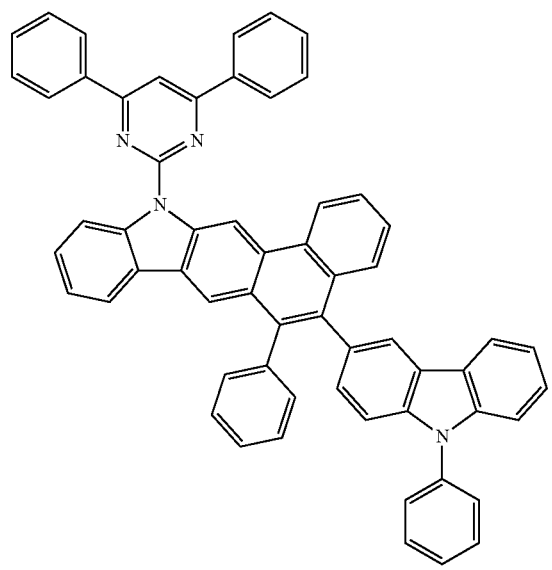
2-6
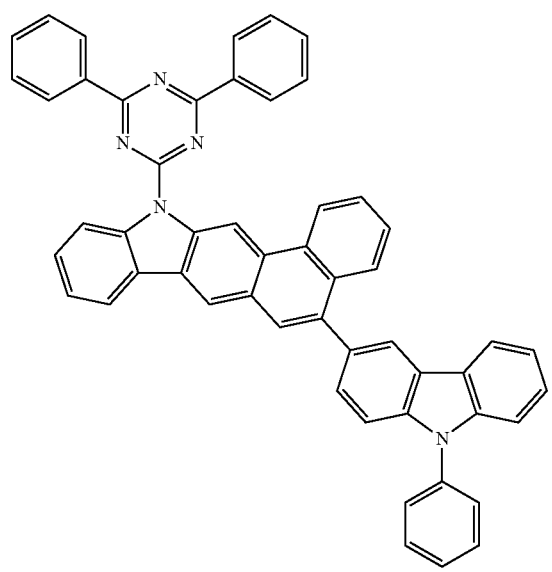
-continued
2-7
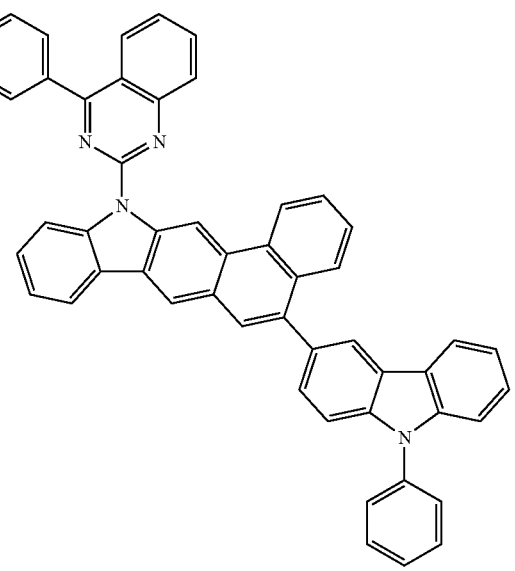
2-8
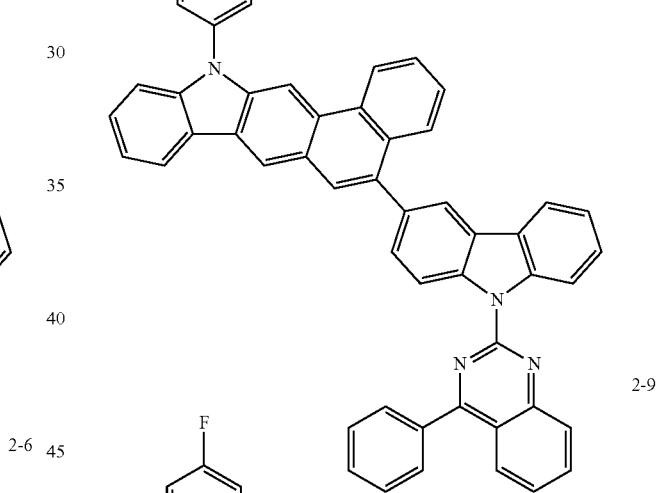
2-9
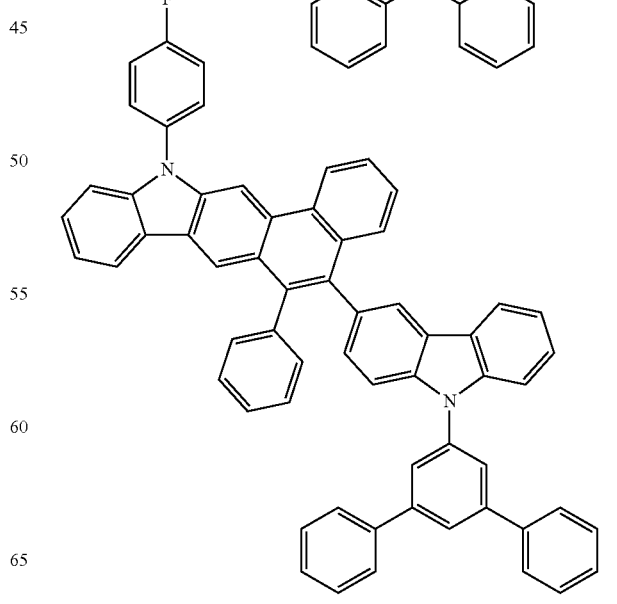

2-10
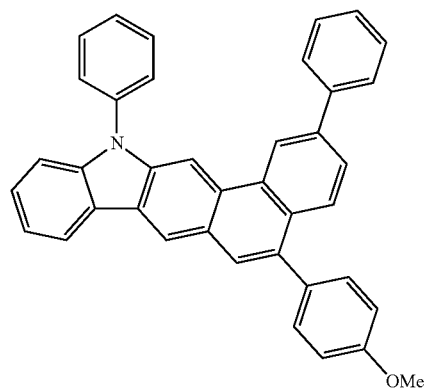
2-13
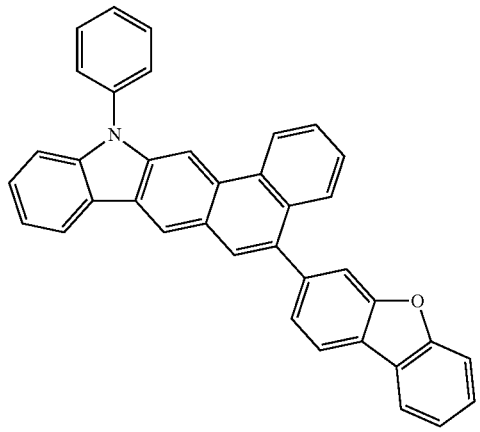
2-11
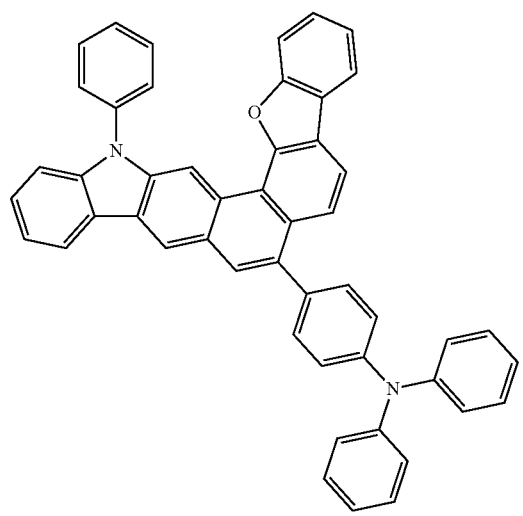
2-14
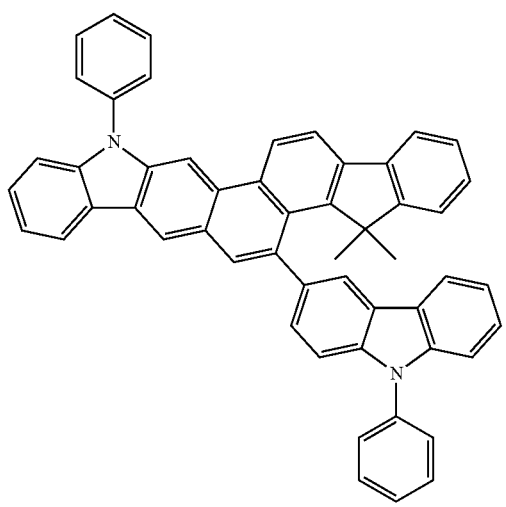
2-12
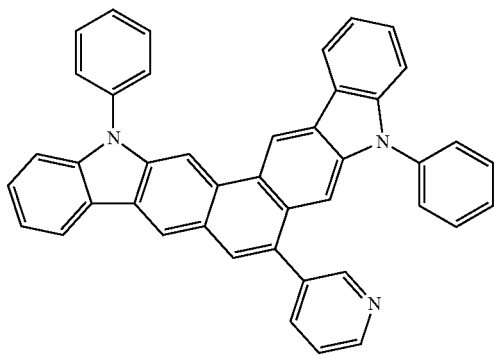
2-15
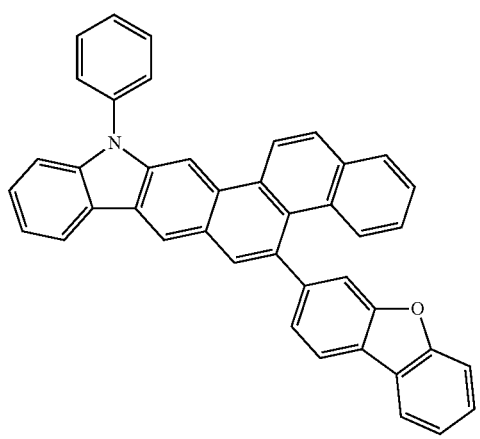

2-16
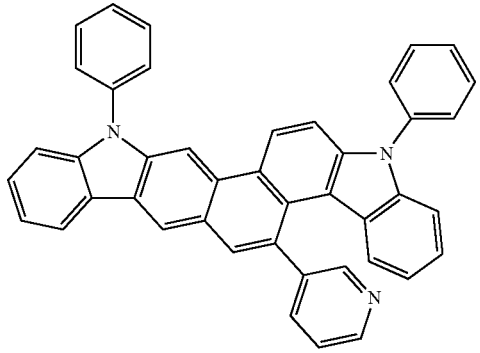
2-20
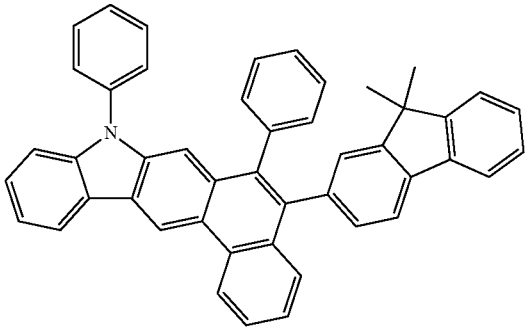
2-17
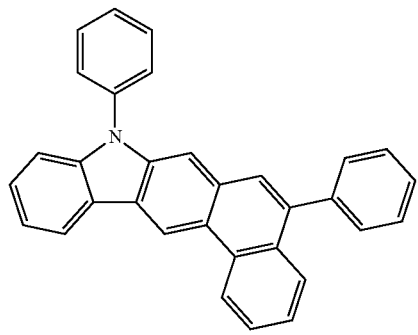
2-21
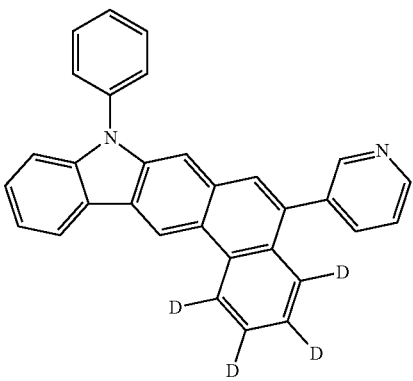
2-18
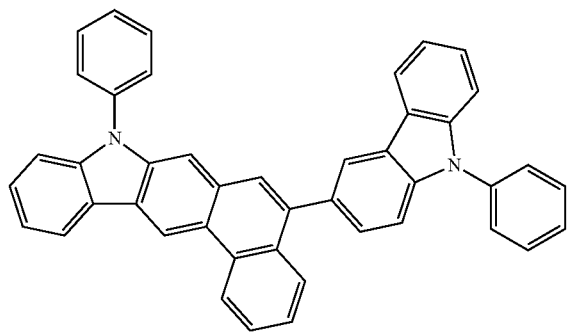
2-19
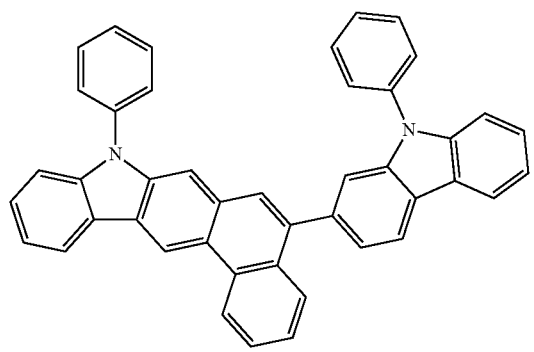
2-22
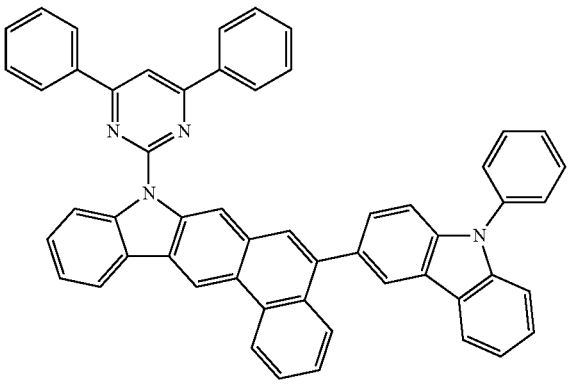

2-23
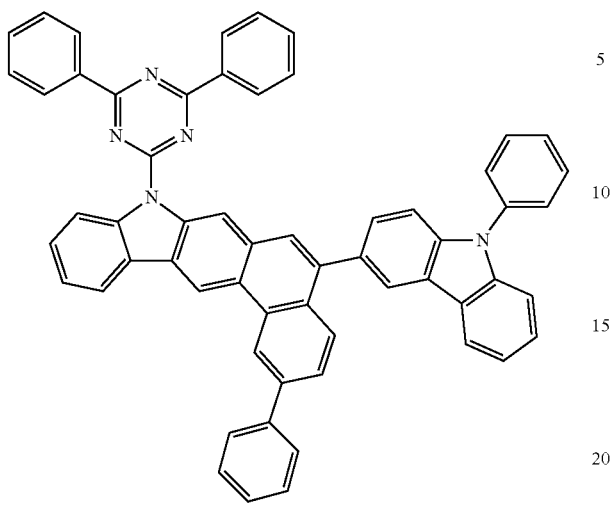
2-24
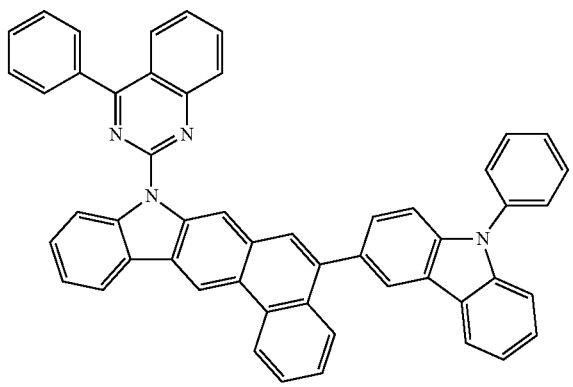
2-25
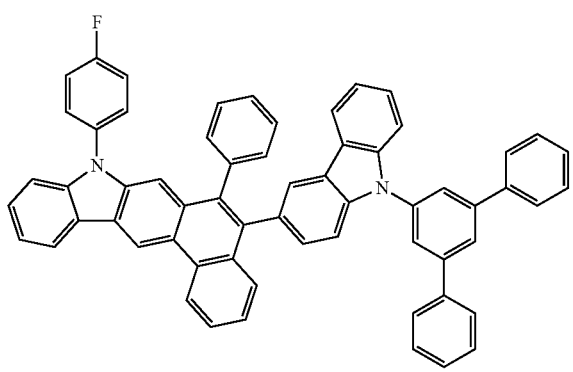
2-26
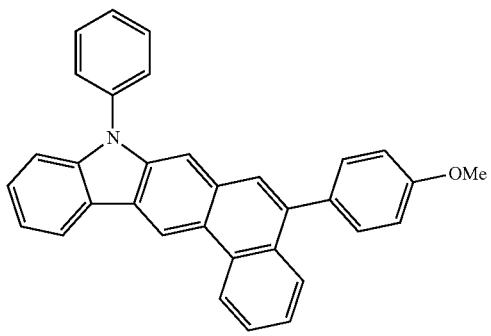
2-27
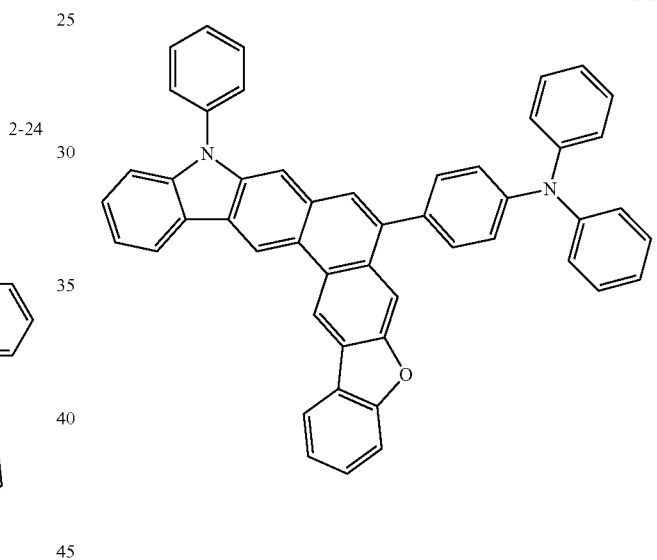
2-28

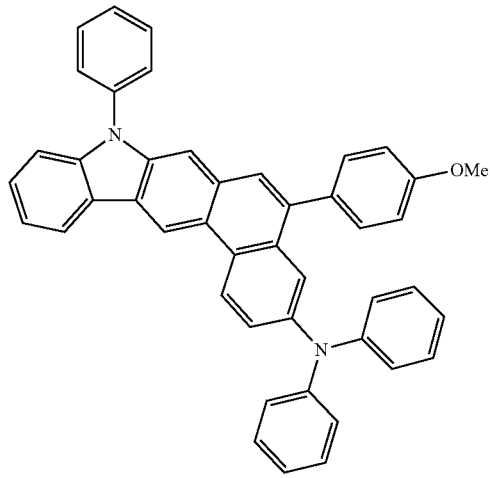

2-29

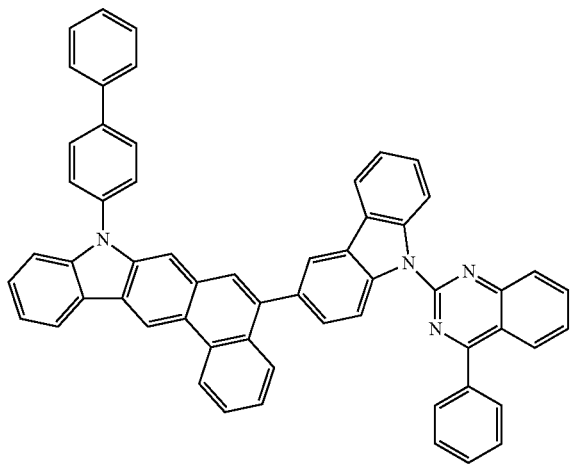

2-30

At least one substituent of the substituted $C_3$-$C_{10}$ cycloalkylene group, the substituted $C_2$-$C_{10}$ heterocycloalkylene group, the substituted $C_3$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted $C_3$-$C_{10}$ cycloalkyl group the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_2$-$C_{60}$ heteroaryl group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_6$-$C_{60}$ aryloxy group, and the substituted $C_6$-$C_{60}$ arylthio group may be selected from among, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, $C_2$-$C_{60}$ alkynyl group, $C_1$-$C_{60}$ alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and —Si($Q_{13}$)($Q_{14}$)($Q_{15}$) (where $Q_{13}$ to $Q_{15}$ may be, each independently, a $C_1$-$C_{60}$ alkyl group, a $C_1$-$C_{60}$ alkoxy group, a $C_6$-$C_{60}$ aryl group, or a $C_2$-$C_{60}$ heteroaryl group), but not limited thereto.

The first compound of Formula 1 above has good charge (hole) transporting ability. The second compound of Formula 100 above has good charge (hole) transporting ability, good light-emitting ability, and has a high band gap energy between the highest occupied molecular orbital (HOMO) and lowest unoccupied molecular orbital (LUMO), and thus allows easy energy level adjustment. When including the first compound in the hole migration region 13 and the second compound in at least one of the hole migration region 13 and the EML 15, the organic light-emitting diode 10 may have a low driving voltage, a high luminance, a high efficiency, and a long lifetime.

In some embodiments, the first compound of Formula 1 and the second compound of Formula 100 may be both in the hole migration region 13.

In some other embodiments, the first compound of Formula 1 above may be in the hole migration region 13, and the second compound of Formula 100 above may be in the EML 15.

In some other embodiments, the first compound of Formula 1 above and the second compound of Formula 100 above may be both in the hole migration region 13, and the second compound of Formula 100 above may be in the EML 15. In this regard, the second compound in the hole migration region 13 and the second compound in the EML 15 may be the same or different from each other.

Figure 2:
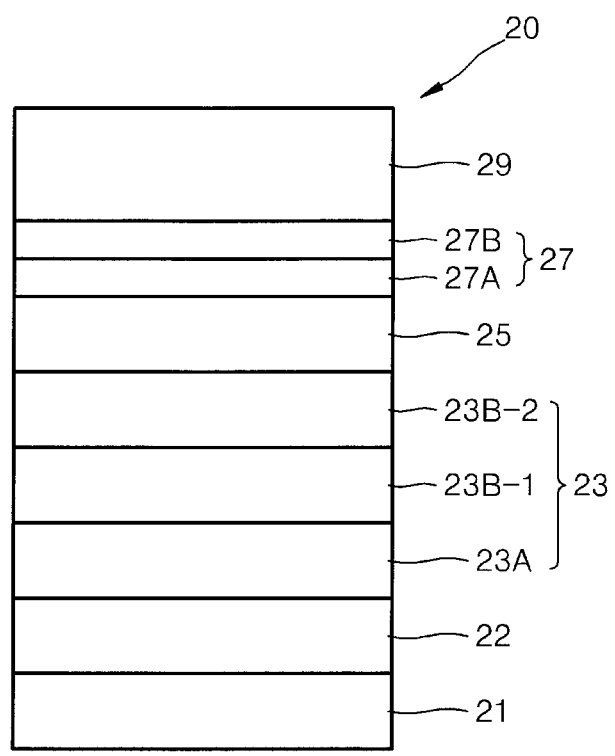
FIG. 2 is a schematic view of a structure of an organic light-emitting diode according to another embodiment of the present invention.

FIG. 2 is a schematic view of a structure of an organic light-emitting diode 20 according to another embodiment of the present invention. Referring to FIG. 2, the organic light emitting diode 20 has a structure including a substrate 21, a first electrode 22, a hole migration region 23, an emission layer (EML) 25, an electron migration region 27, and a second electrode 29 that are sequentially stacked on one another. The hole migration region 23 includes a hole injection layer (HIL) 23A, a first hole transport layer (HTL) 23B-1, and a second HTL 23B-2 that are sequentially stacked on the first electrode 22. The electron migration region 27 includes an electron transport layer (ETL) 27A and an electron injection layer (EIL) 27B that are sequentially stacked on the EML 25.

The above-detailed descriptions of the substrate 11, the first electrode 12, and the second electrode 19 may be referred to as detailed descriptions of the substrate 21, the first electrode 22, and the second electrode 29 of FIG. 2.

The HIL 23A may be formed on the first electrode 22 by any of a variety of methods, including vacuum deposition, spin coating, casting, and Langmuir-Blodgett (LB) deposition.

When the HIL 23A is formed using vacuum deposition, vacuum deposition conditions may vary according to the compound that is used to form the HIL 23A, and the desired structure and thermal properties of the HIL 23A to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the HIL 23A is formed using spin coating, the coating conditions may vary according to the compound that is used to form the HIL 23A, and the desired structure and thermal properties of the HIL 23A to be formed. For example, the coating rate may be in the range of about 2000 rpm to about 5000 rpm, and a temperature at which heat treatment is performed to remove a solvent after coating may be in the range of about 80° C. to about 200° C. However, the coating conditions are not limited thereto.

Non-limiting examples of materials for the HIL 23A are N,N'-diphenyl-N,N'-bis-[4-(phenyl-m-tolyl-amino)-phenyl]-biphenyl-4,4'-diamine (DNTPD), a phthalocyanine compound (such as copperphthalocyanine), 4,4',4"-tris(3-methylphenylphenylamino)triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly (4-styrenesulfonate) (PEDOT/PSS), polyaniline/camphor sulfonicacid (Pani/CSA), and polyaniline)/poly(4-styrene-sulfonate (PANI/PSS):

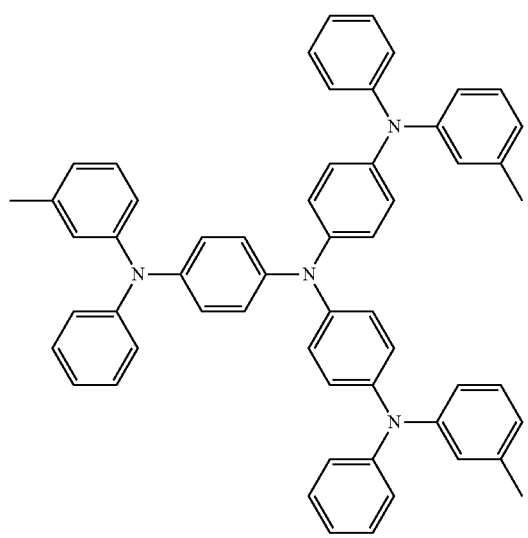

m-MTDATA

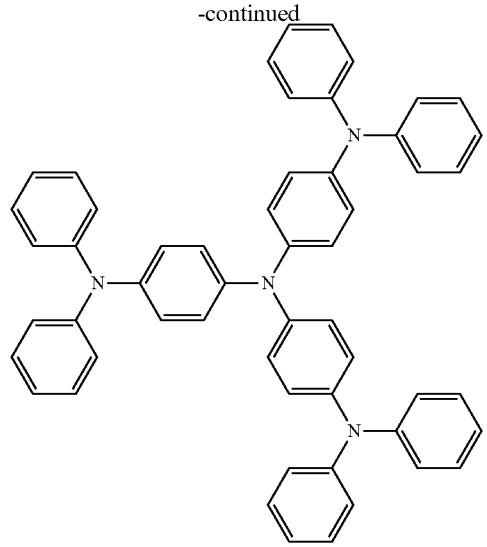

TDATA

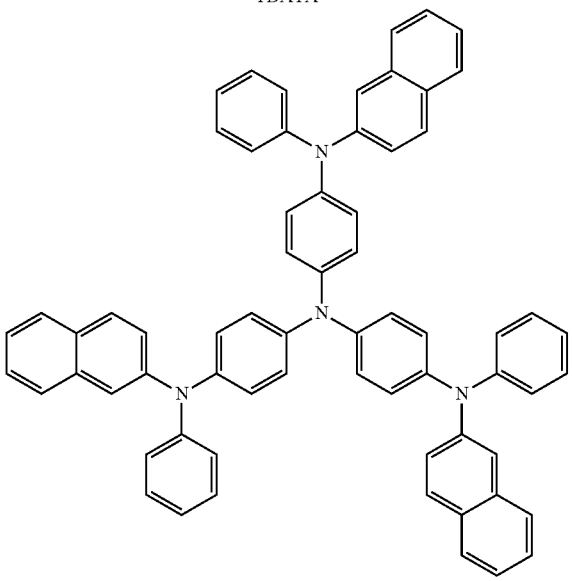

2-TNATA

The thickness of the HIL 23A may be from about 100 Å to about 10000 Å, and in some embodiments, may be from about 100 Å to about 1000 Å. When the thickness of the HIL 23A is within these ranges, the HIL 23A may have good hole injecting ability without a substantial increase in driving voltage.

Then, a first HTL 23B-1 may be formed on the HIL 23A by using any of a variety of methods, for example, vacuum deposition, spin coating, casting, Langmuir-Blodgett (LB) deposition, or the like. When the first HTL 23B-1 is formed using vacuum deposition or spin coating, the conditions for deposition and coating may be similar to those for the formation of the HIL 23A, although the conditions for the deposition and coating may vary depending on the material that is used to form the first HTL 23B-1.

The first HTL 23B-1 may be formed using the first compound represented by Formula 1 above. The above-detailed description of Formula 1A above may be referred to here. For example, the first HTL 23B-1 may include a first compound represented by Formula 1A, 1B, or 1C above, wherein, in Formula 1A, 1B, and 1C, $Ar_{101}$ and $Ar_{102}$ may be, each independently, a group represented by one of Formulae 4-1 to 4-7; xa and xb may be, each independently, 1 or 2; $R_{101}$ may be a group represented by one of Formulae 6-1 to 6-8; $R_{109}$ may be a group represented by one of Formulae 6-1 to 6-11; $R_{111}$ and $R_{112}$ may be, each independently, one of a $C_1$-$C_{20}$ alkyl group; a $C_1$-$C_{20}$ alkyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and $R_{102}$ to $R_{108}$ and $R_{113}$ to $R_{119}$ may be hydrogen atoms.

In some other embodiments, a material for the first HTL 23B-1 may be one of Compounds 1-1 to 1-19 above.

Then, a second HTL 23B-2 may be formed on the first HIL 23B-1 by using any of a variety of methods, for example, vacuum deposition, spin coating, casting, Langmuir-Blodgett (LB) deposition, or the like. When the second HTL 23B-2 is formed using vacuum deposition or spin coating, the conditions for deposition and coating may be similar to those for the formation of the HIL 23A, although the conditions for the deposition and coating may vary depending on the material that is used to form the second HTL 23B-2.

A material for the second HTL 23B-2 may be a second compound represented by Formula 100 above. The above-detailed description of Formula 100 above may be referred to here. In some embodiments, the second HTL 23B-2 may include a second compound of Formula 100A-HLT or 100B-HLT. The above-detailed descriptions of Formulae 100A-HLT and 100B-HLT may be referred to here. The second compound may be Compound 2-1 or 2-27, but is not limited thereto.

A sum (total) of thicknesses of the first HTL 23B-1 and the second HTL 23B-2 may be from about 50 Å to about 2000 Å, and in some embodiments, from about 100 Å to about 1500 Å. In one embodiment, when the sum of thicknesses of the first HTL 23B-1 and the second HTL 23B-2 is within these ranges, the first HTL 23B-1 and second HTL 23B-2 have satisfactory hole transporting ability without a substantial increase in driving voltage.

A thickness ratio of the first HTL 23B-1 to the second HTL 23B-2 may be from about 1:9 to about 9:1, and in some embodiments, from about 3:7 to about 7:3, but is not limited thereto.

At least one of the HIL 23A, the first HTL 23B-1, and the second HTL 23B-2 may further include a charge-generating material, in addition to the above-described materials, to improve conductivity of the layers.

The charge-generating material may be, for example, a p-dopant. The p-dopant may be one of quinine derivatives, metal oxides, and compounds with a cyano group, but are not limited thereto. Non-limiting examples of the p-dopant are quinone derivatives such as tetracyanoquinonedimethane (TCNQ), 2,3,5,6-tetrafluoro-tetracyano-1,4-benzoquinonedimethane (F4-TCNQ), or the like; metal oxides such as tungsten oxide, molybdenum oxide, or the like; and cyano-containing compounds such as Compound 200 below.

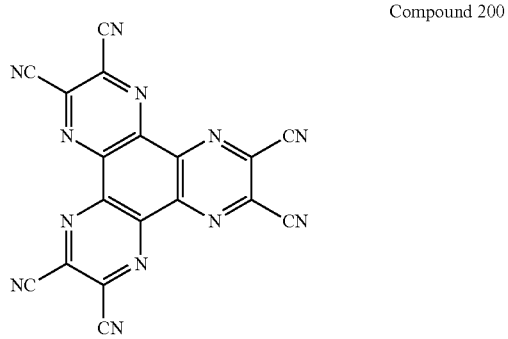

Compound 200

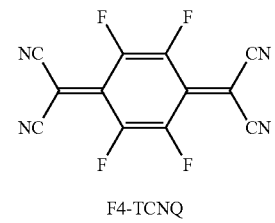

F4-TCNQ

The charge-generating material may be homogeneously dispersed or inhomogeneously distributed in at least one of the HIL 23A, the first HTL 23B-1 and the second HTL 23B-2. The charge-generating material may be present in any form.

Then, the EML 25 may be formed on the second HTL 23B-2 by using vacuum deposition, spin coating, casting, LB deposition, or the like. When the EML 25 is formed using vacuum deposition or spin coating, the deposition and coating conditions may be similar to those for the formation of the HIL 23A, though the conditions for deposition and coating may vary depending on the material that is used to form the EML 25.

The EML 25 may include a host and a dopant.

Non-limiting examples of the host are $Alq_3$, 4,4'-N,N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di-2-naphthylanthracene (TBADN), E3, distyrylarylene (DSA), dmCBP (see a formula below), and Compounds 501 to 509 below.

-continued
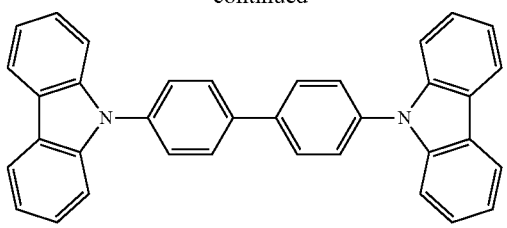
CBP
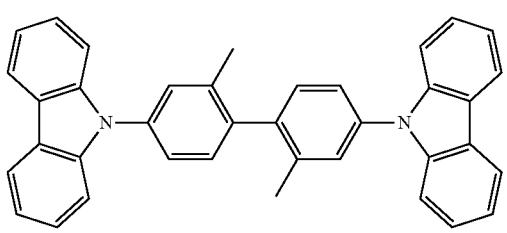
dmCBP
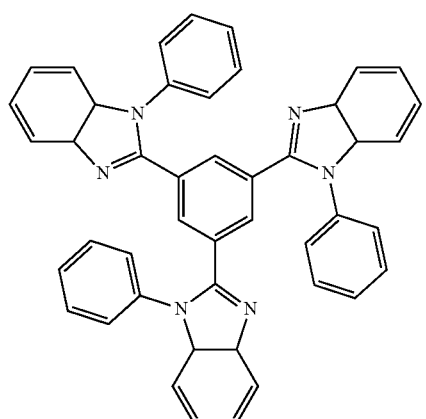
TPBI
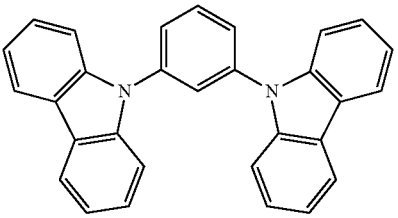
501
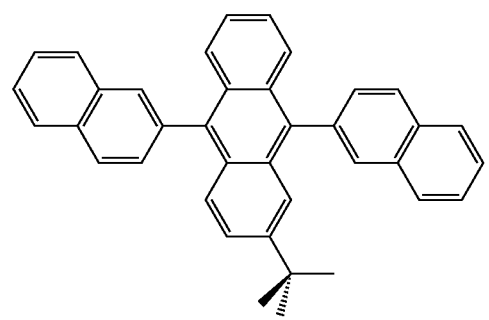
TBADN
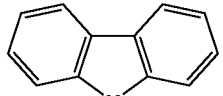
502
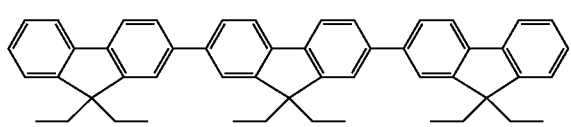
E3
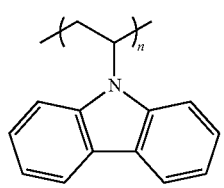
PVK
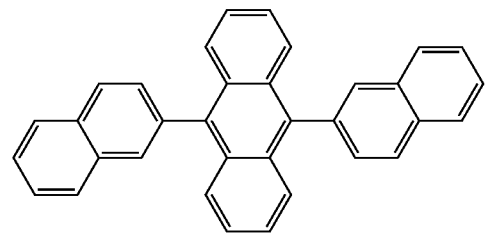
ADN
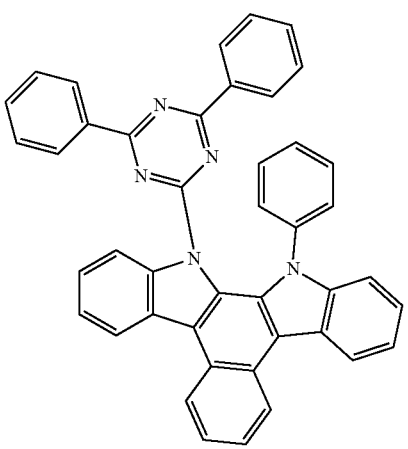
503

504

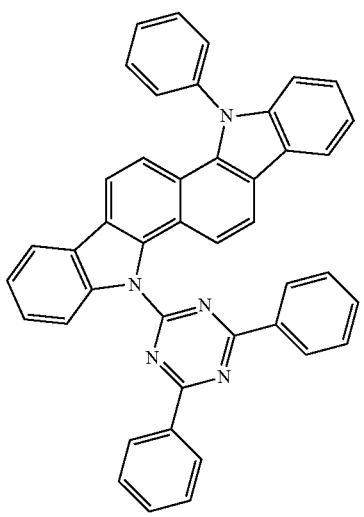

505

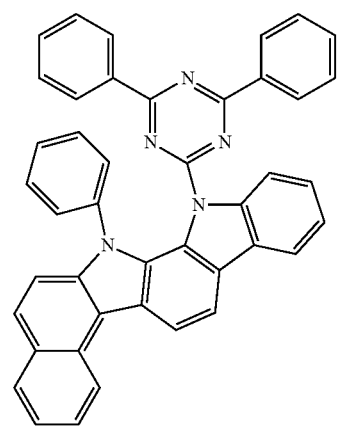

506

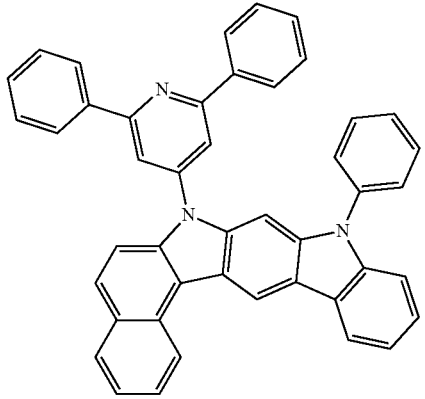

507

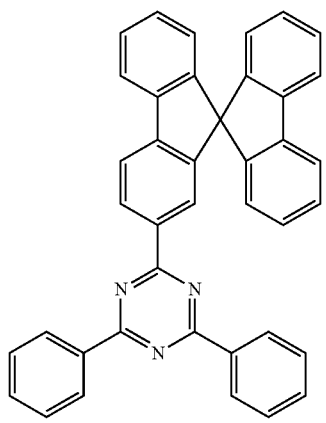

508

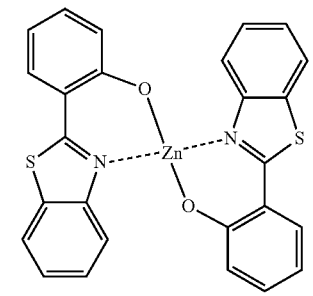

509

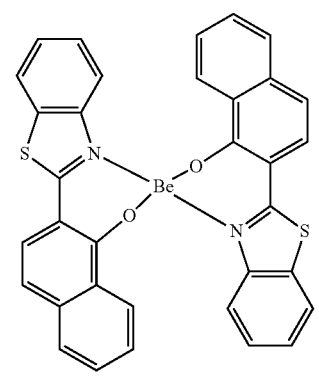

In some embodiments, an anthracene-based compound represented by Formula 400 below may be used as the host.

Formula 400

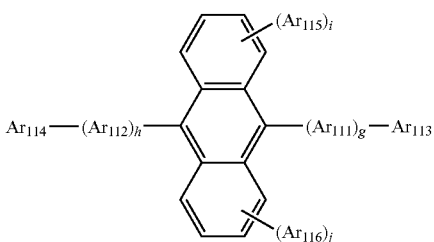

In Formula 400, $Ar_{111}$ and $Ar_{112}$ may be, each independently, a substituted or unsubstituted $C_6$-$C_{60}$ arylene group; $Ar_{113}$ to $Ar_{116}$ may be, each independently, a substituted or unsubstituted $C_1$-$C_{10}$ alkyl group or a substituted or unsubstituted $C_6$-$C_{60}$ aryl group; and g, h, i, and j may be, each independently, an integer from 0 to 4.

In some embodiments, $Ar_{111}$ and $Ar_{112}$ in Formula 400 may be, each independently, selected from a phenylene group, a naphthylene group, a phenanthrenylene group, and a pyrenylene group; and a phenylene group, a naphthylene group, a phenanthrenylene group, a fluorenyl group, and a pyrenylene group, substituted with at least one of a phenyl group, a naphthyl group, and an anthryl group.

In Formula 400 above, g, h, i, and j may be, each independently, 0, 1, or 2.

In some embodiments, $Ar_{113}$ to $Ar_{116}$ in Formula 400 may be, each independently, selected from a $C_1$-$C_{10}$ alkyl group substituted with at least one of a phenyl group, a naphthyl group, and an anthryl group;

a phenyl group, a naphthyl group, an anthryl group, a pyrenyl group, a phenanthrenyl group and a fluorenyl group;

a phenyl group, a naphthyl group, an anthryl group, a pyrenyl group, a phenanthrenyl group, and a fluorenyl group, substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, and a fluorenyl group; and

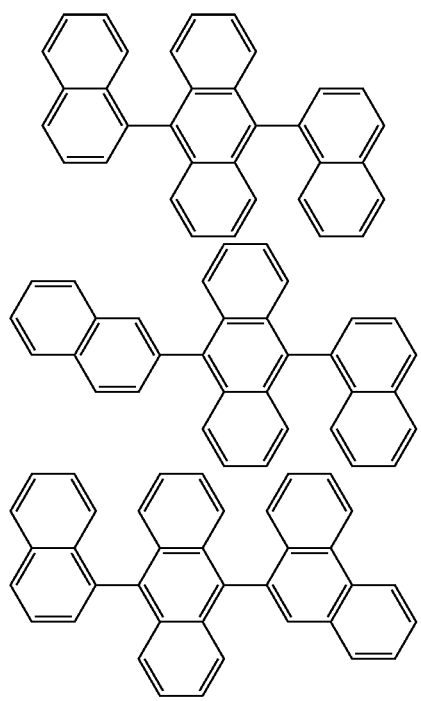

but are not limited thereto.

For example, the anthracene-based compound of Formula 400 above may be one of the compounds represented by the following formulae, but is not limited thereto:

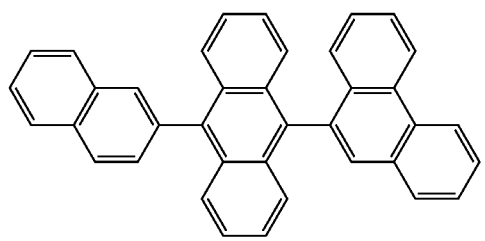

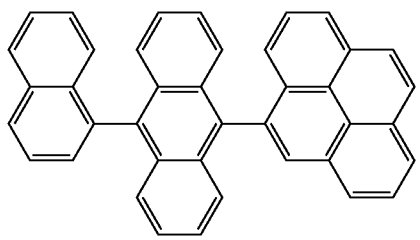

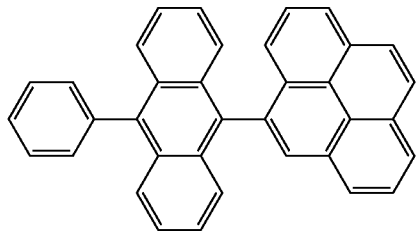

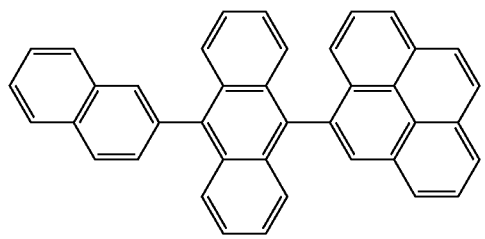

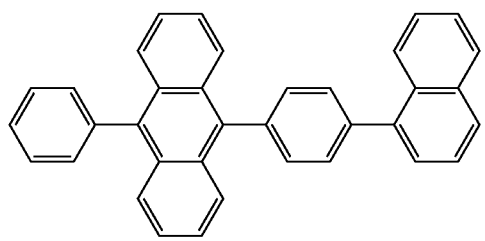

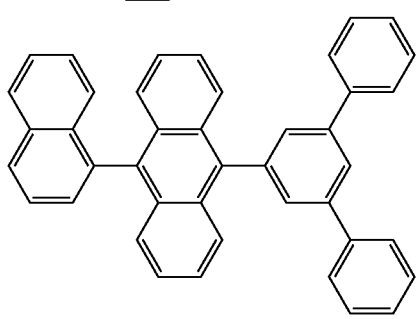

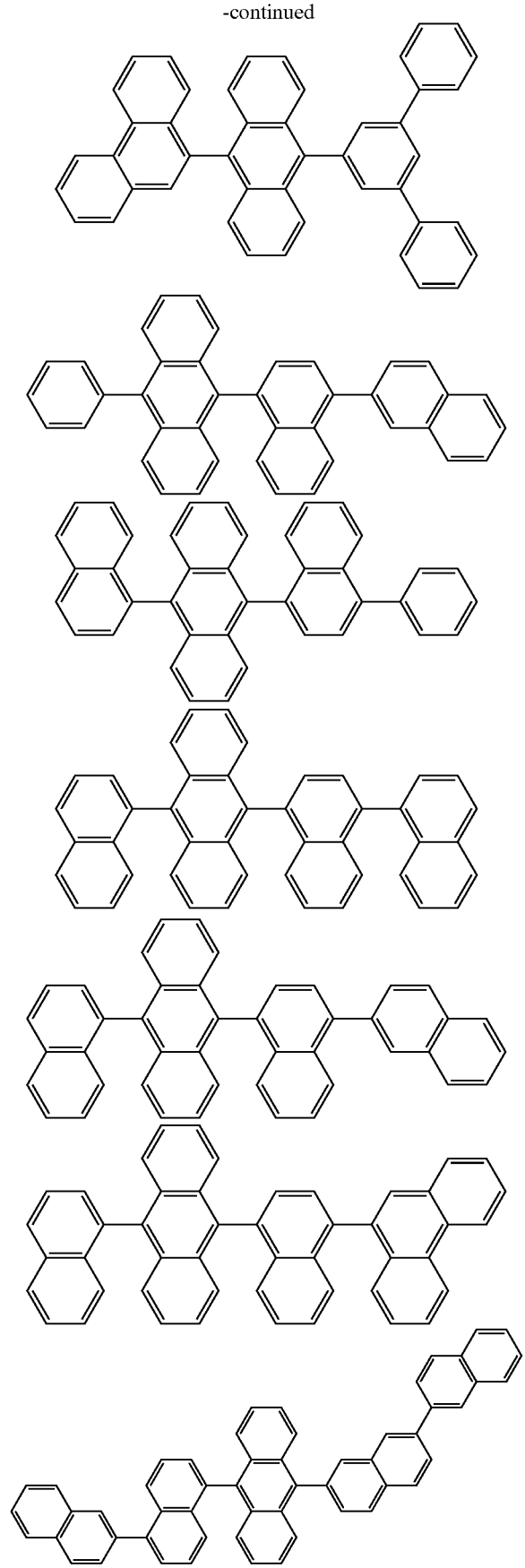

67
-continued
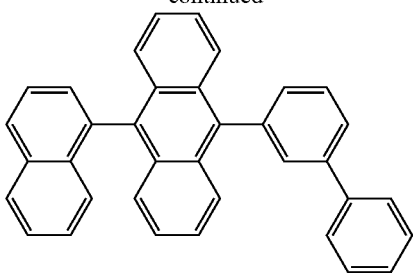
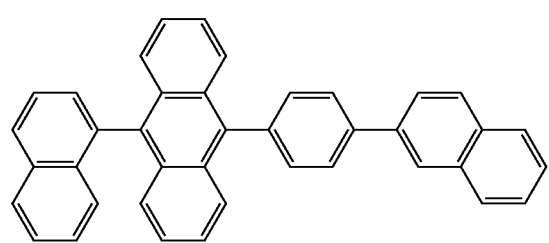
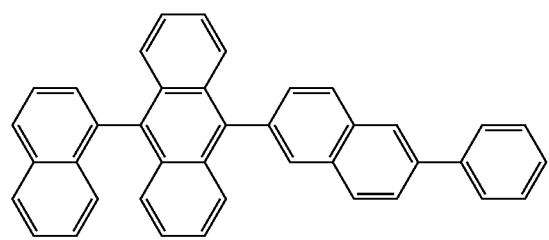
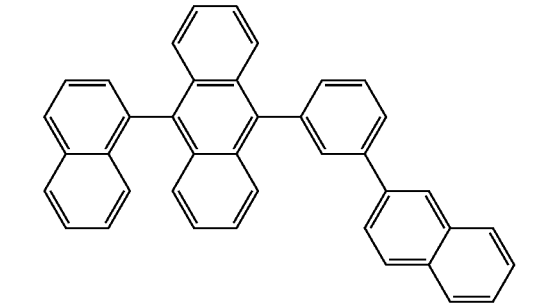
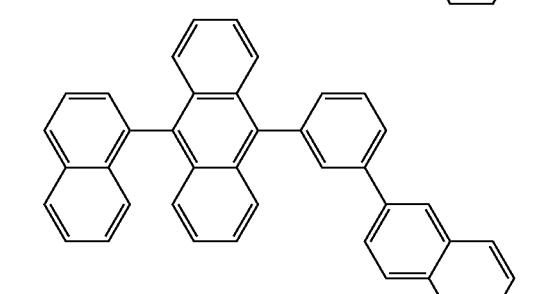
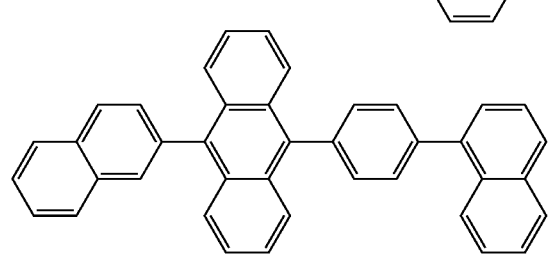
68
-continued
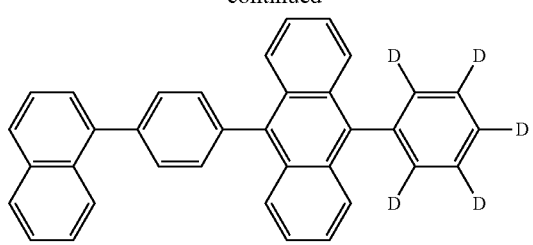
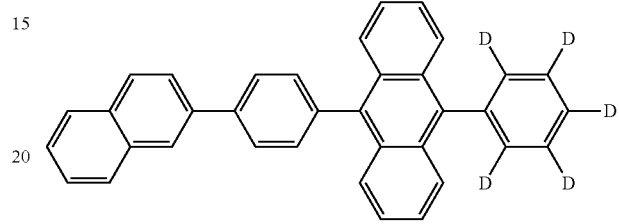
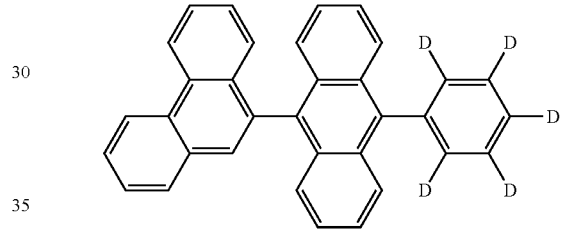
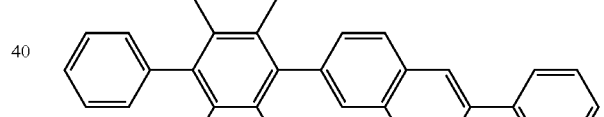
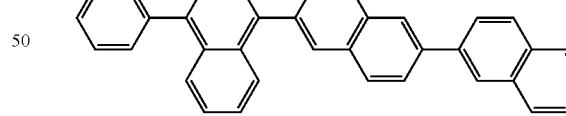
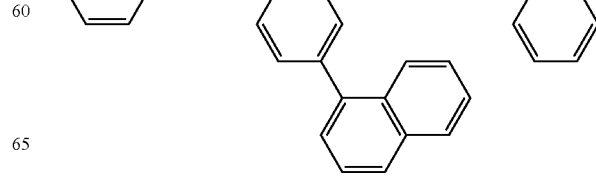

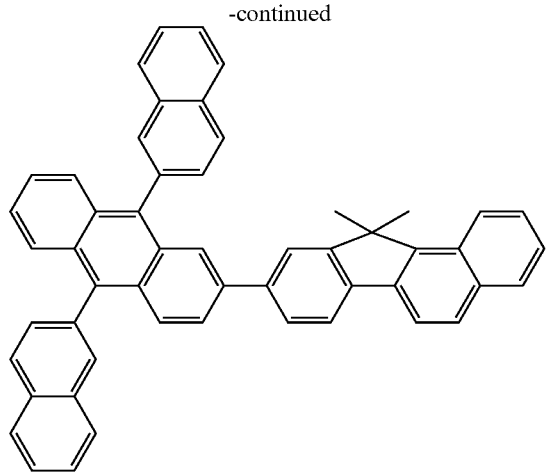
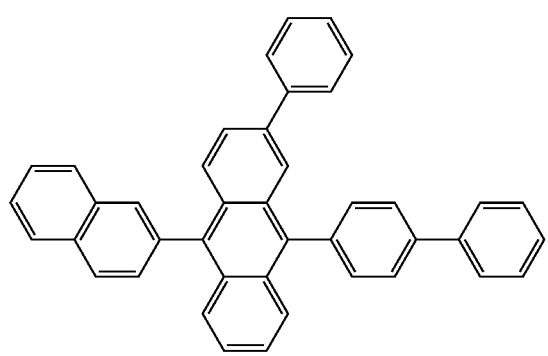
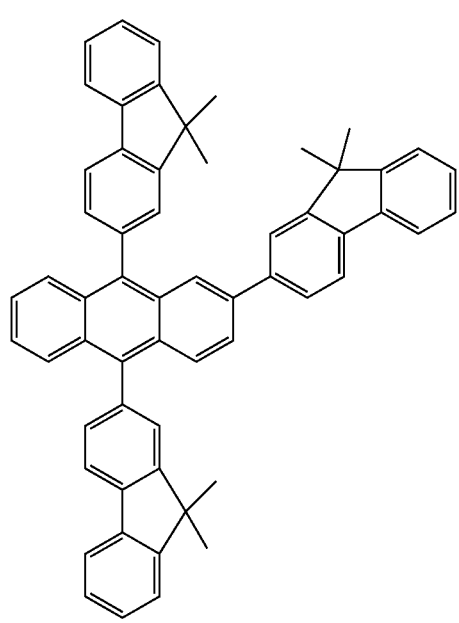
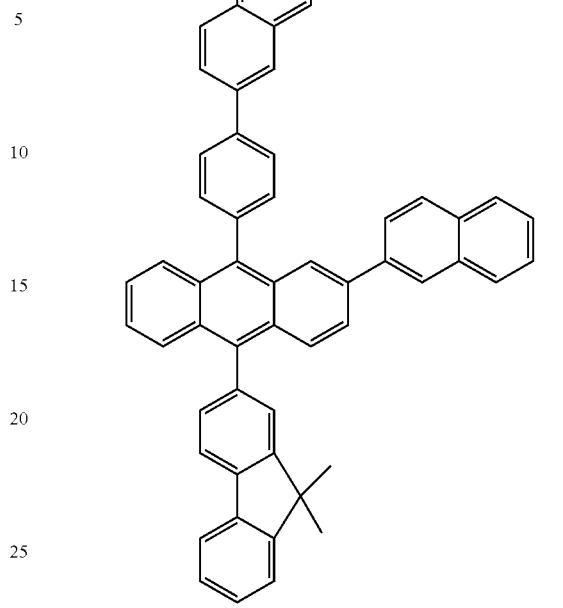
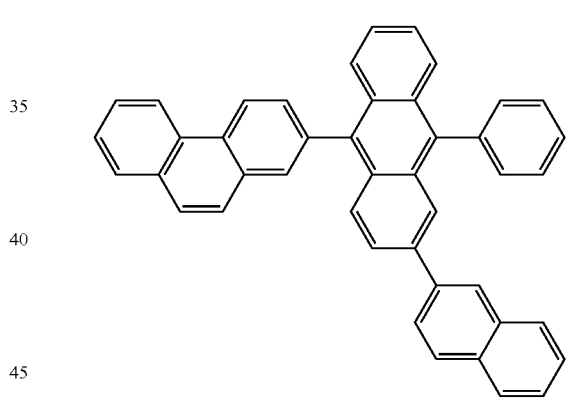
In some embodiments, an anthracene-based compound represented by Formula 401 below may be used as the host.
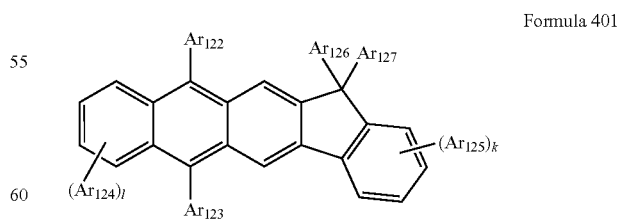
Formula 401
$Ar_{122}$ to $Ar_{125}$ in Formula 401 above may be defined as described above in conjunction with $Ar_{113}$ of Formula 400, and thus detailed descriptions thereof will not be provided here.

Ar₁₂₆ and Ar₁₂₇ in Formula 401 above may be, each independently, a C₁-C₁₀ alkyl group, for example, a methyl group, an ethyl group, or a propyl group.

In Formula 401, k and l may be, each independently, an integer from 0 to 4, for example, 0, 1, or 2.

For example, the anthracene compound of Formula 401 above may be one of the compounds represented by the following formulae, but is not limited thereto:

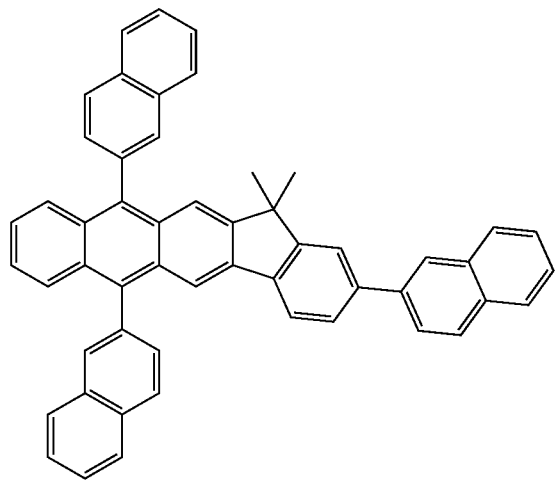

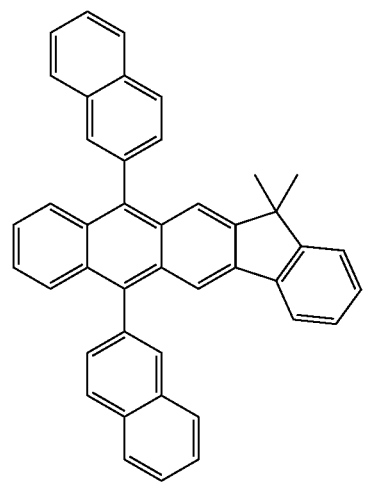

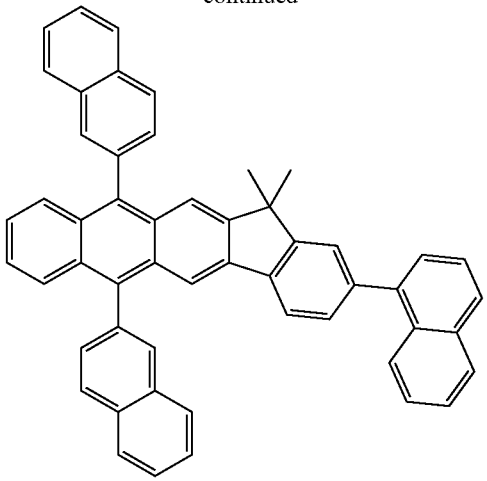

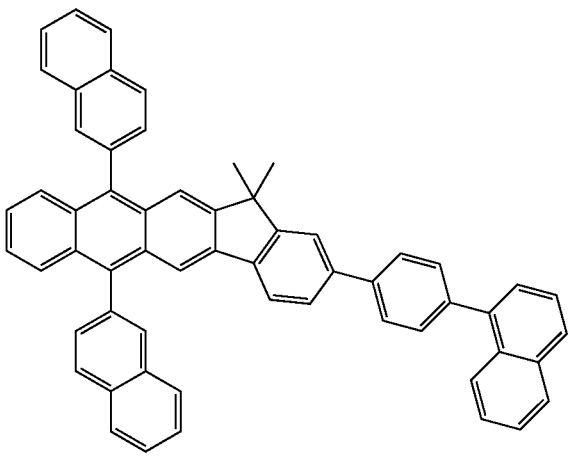 [SMILES: CC1(C)c2cc(-c3ccc(-c4cccc5ccccc45)cc3)ccc2-c2cc3c(-c4ccc5ccccc5c4)c4ccccc4c(-c4ccc5ccccc5c4)c3cc21]

The EML 25 may include the second compound represented by Formula 100 above as a host. When the EML 25 includes the second compound of Formula 100 as a host, the host in the EML 25 and the material of the second HTL 23B-2 may be the same or differ from each other.

When the organic light-emitting diode is a full color organic light-emitting diode, the second electrode may be patterned into a red second electrode, a green second electrode, and a blue second electrode. In some embodiments, the EML 23 may include a red second electrode, a green second electrode, and/or a blue second electrode that are stacked upon one another to emit white light, but is not limited thereto.

The dopant in the EML 25 may be a suitable dopant.

Non-limiting examples of the blue dopant are compounds represented by the following formulae.

73 74
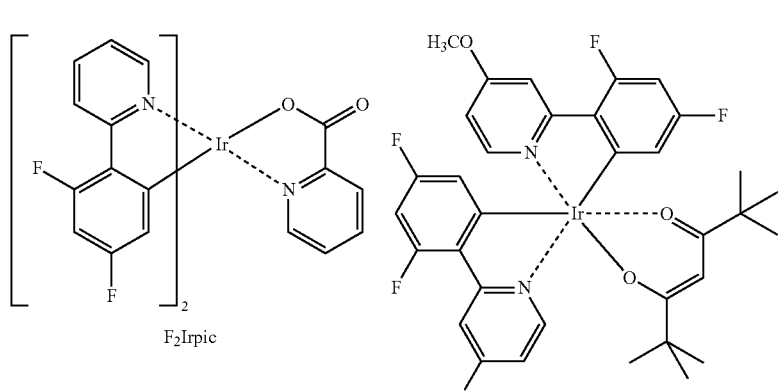
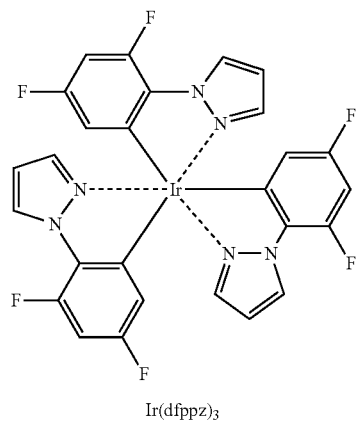
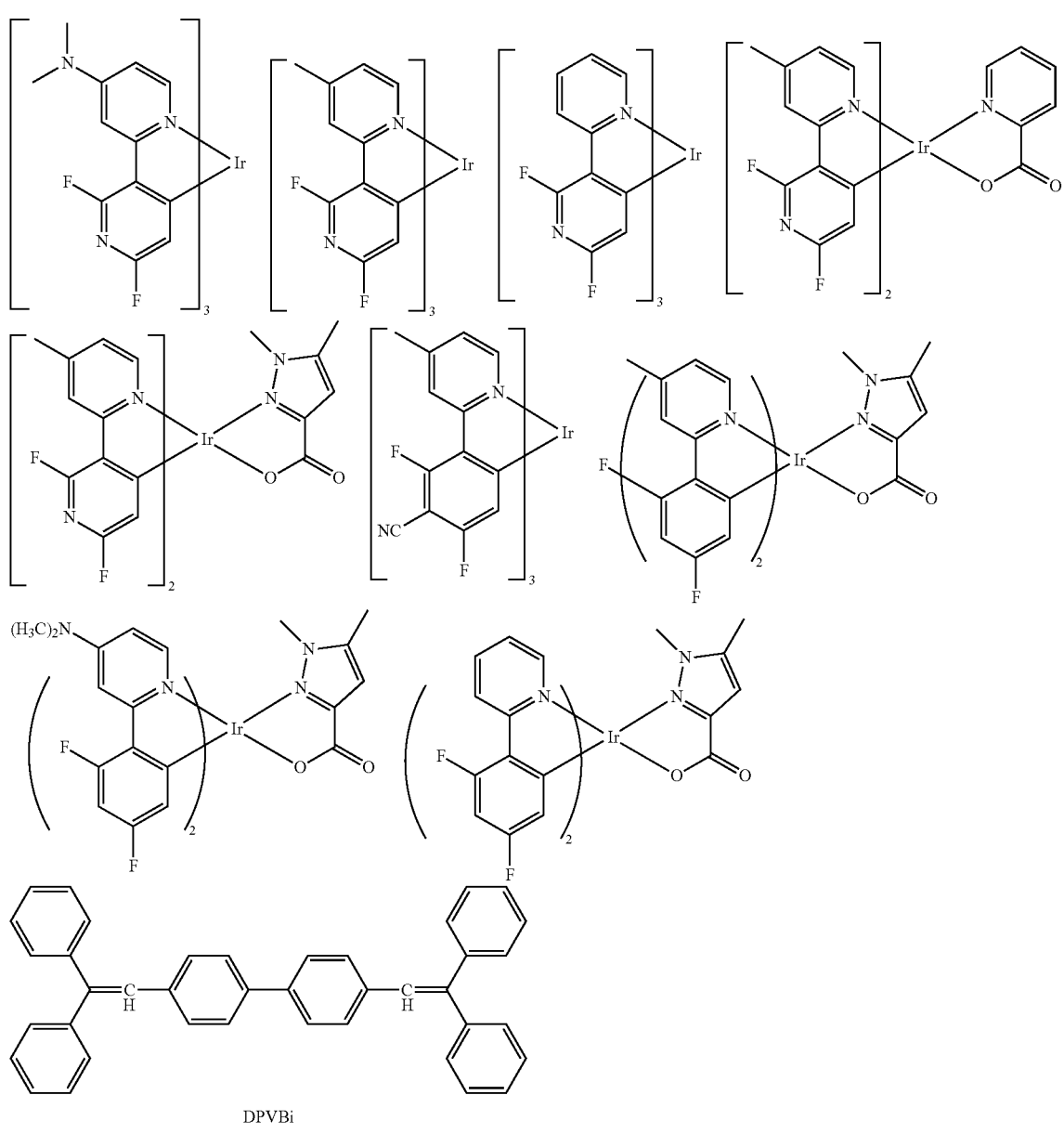

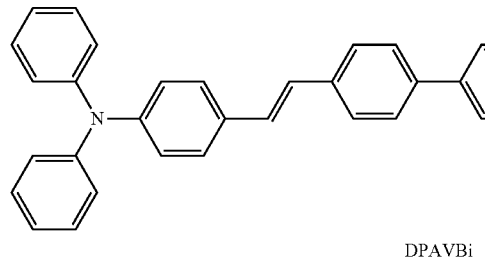
DPAVBi
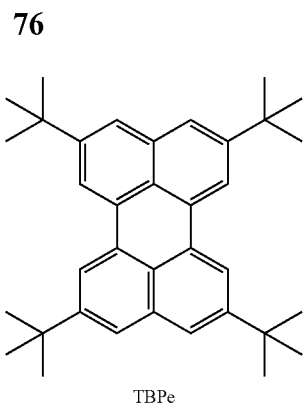
TBPe
Non-limiting examples of red dopant are compounds represented by the following formulae. In some embodiments, the red dopant may be DCM or DCJTB, which will be described later.
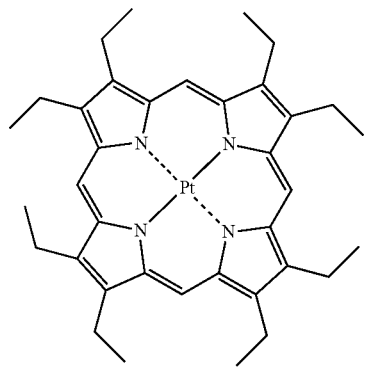
PtOEP
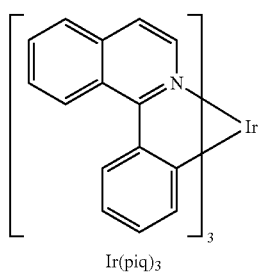
Ir(piq)$_3$
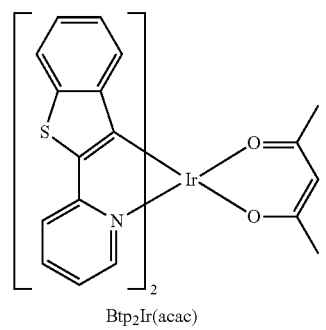
Btp$_2$Ir(acac)
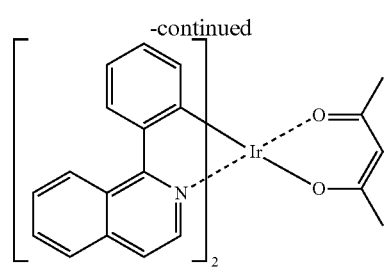
Ir(pq)$_2$(acac)
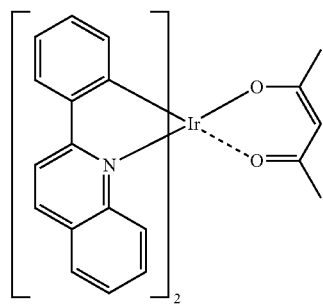
Ir(2-phq)$_3$
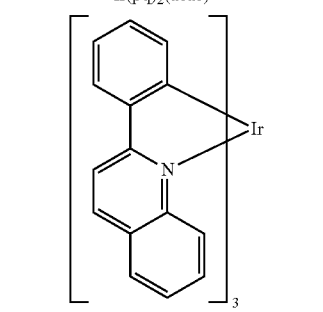
Ir(BT)$_2$(acac)

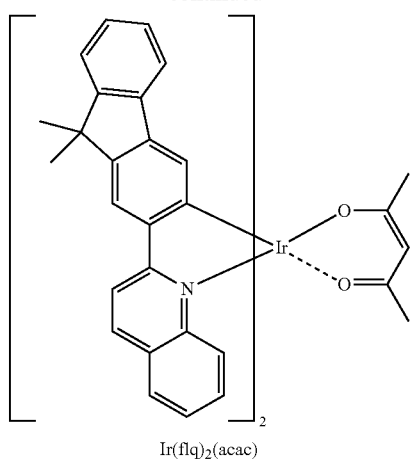
Ir(flq)₂(acac)
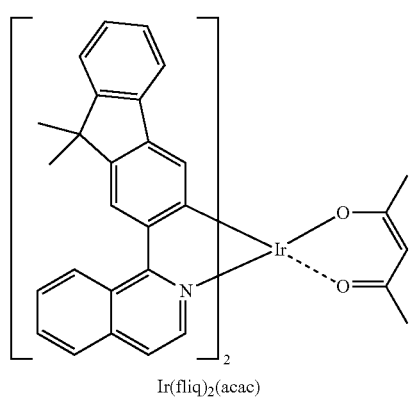
Ir(fliq)₂(acac)
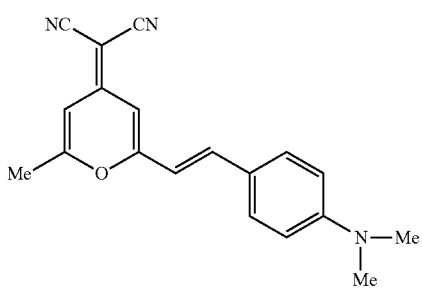
DCM
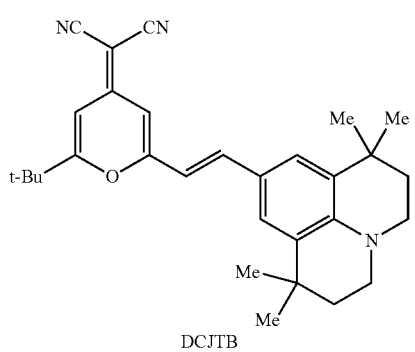
DCJTB
Non-limiting examples of green dopant are compounds represented by the following formulae. For example, the green dopant may be C545T represented below.
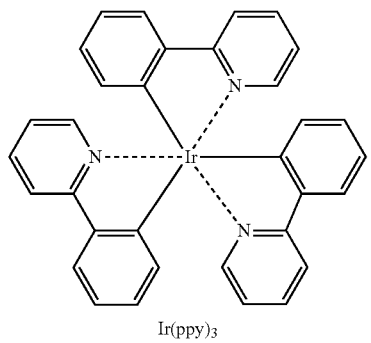
Ir(ppy)₃
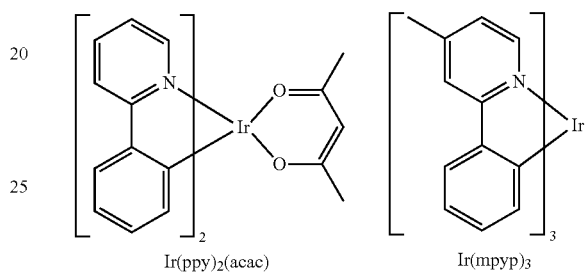
Ir(ppy)₂(acac)    Ir(mpyp)₃
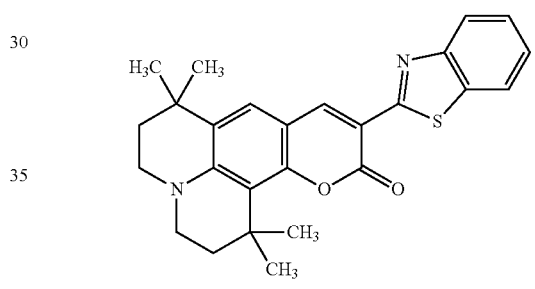
C545T
Non-limiting examples of the dopant that may be used in the EML are complexes represented by the following formulae:
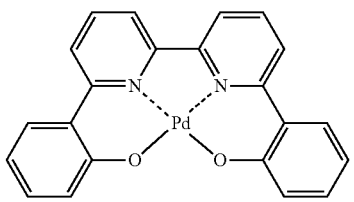
D1
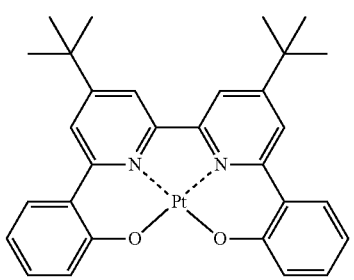
D2

-continued
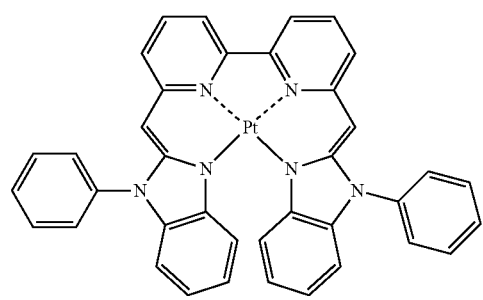
D3
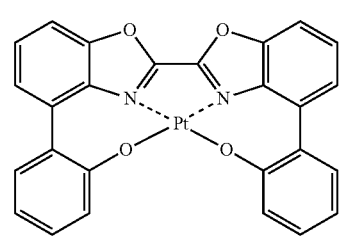
D4
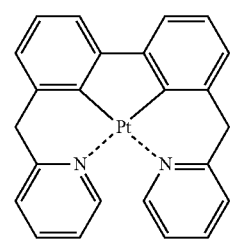
D5
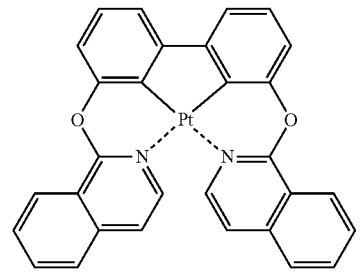
D6
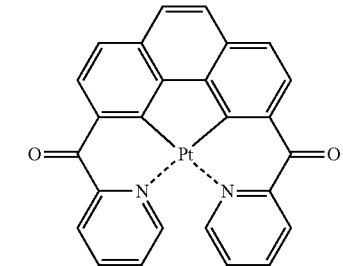
D7
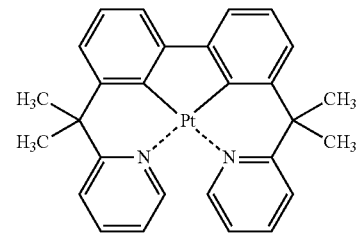
D8
-continued
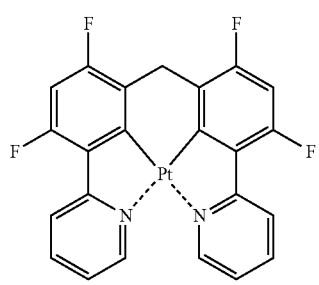
D9
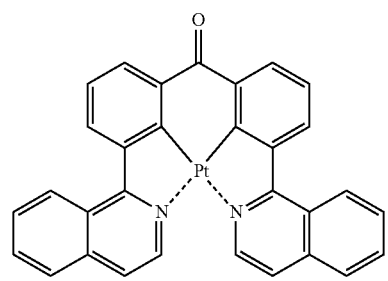
D10
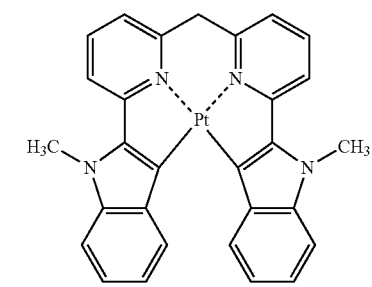
D11
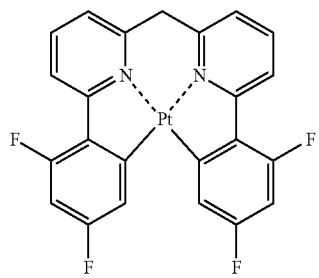
D12
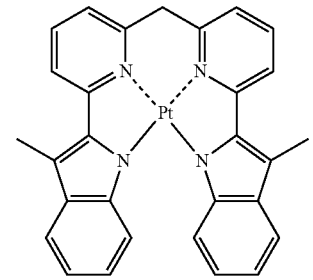
D13

-continued
D14
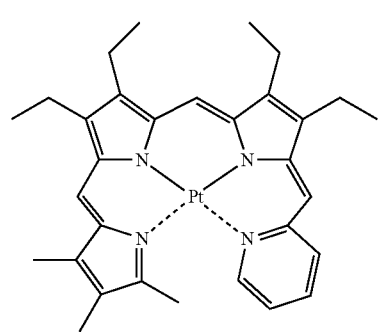
D15
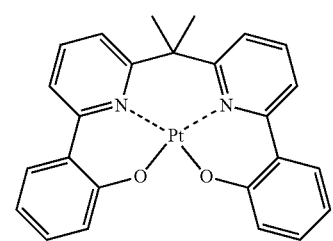
D16
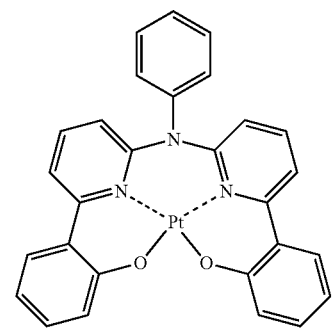
D17
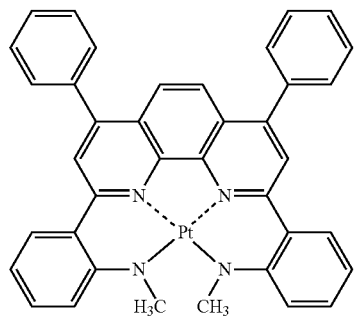
D18
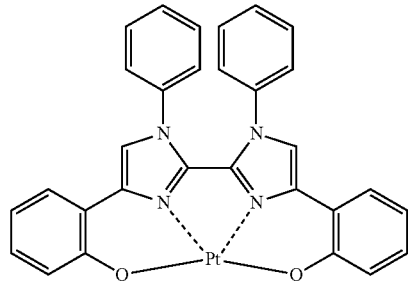
-continued
D19
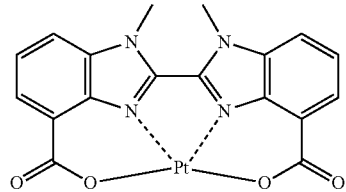
D20
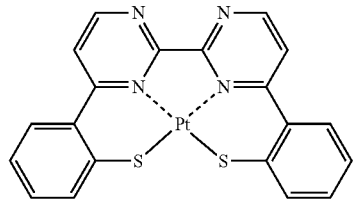
D21
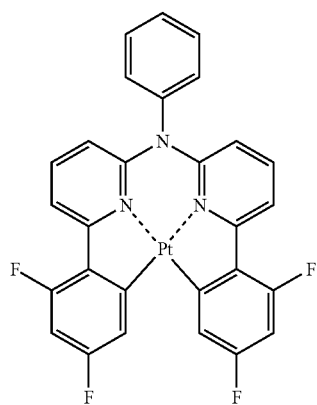
D22
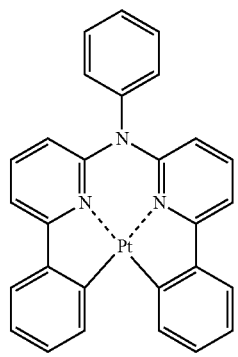
D23
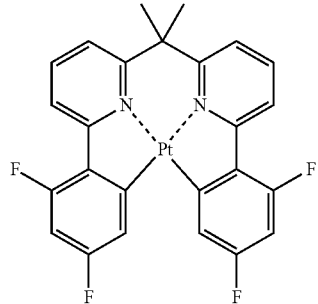

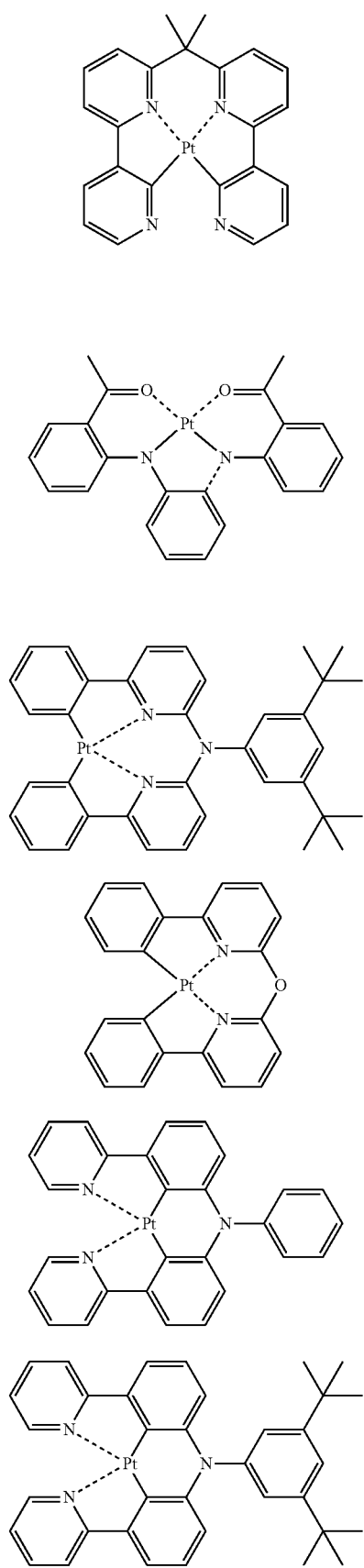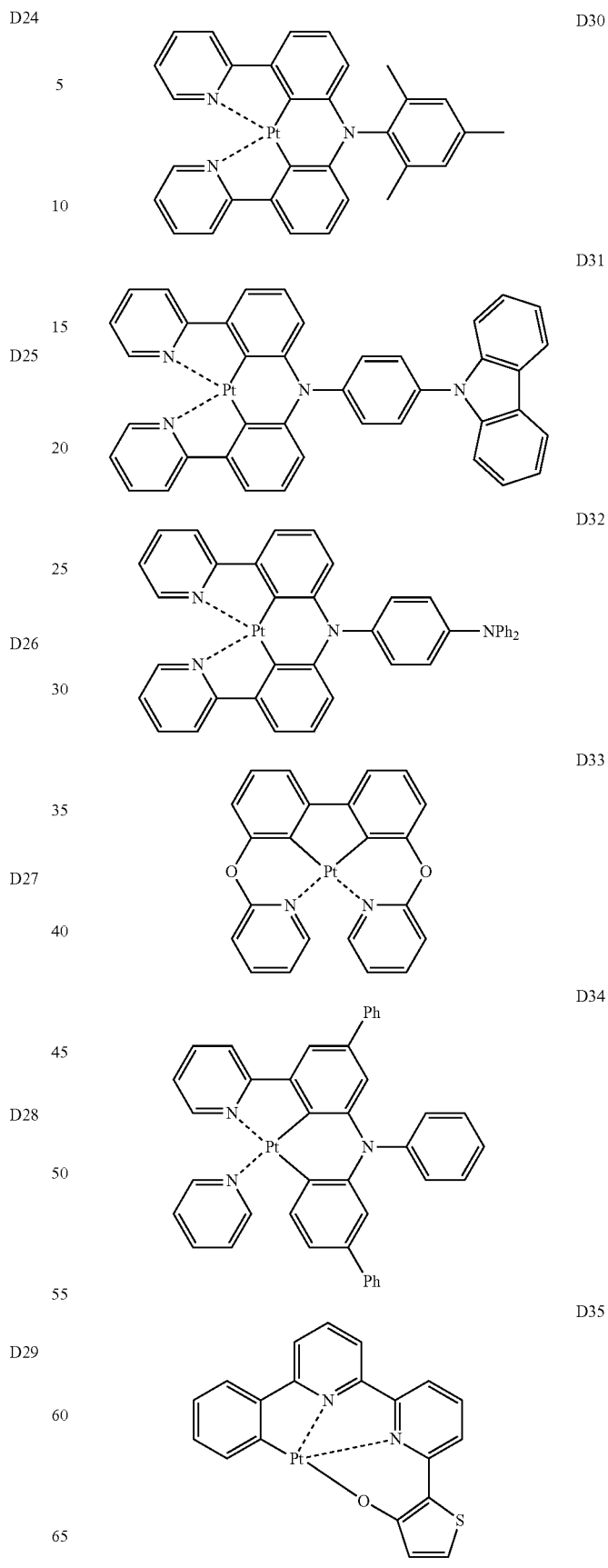

D36 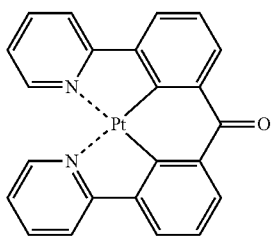
D41 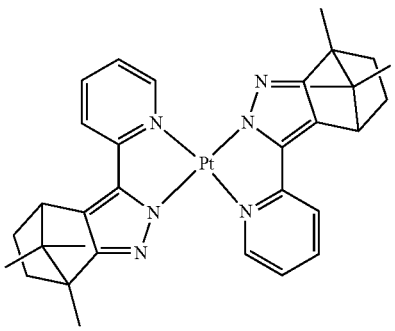
D37 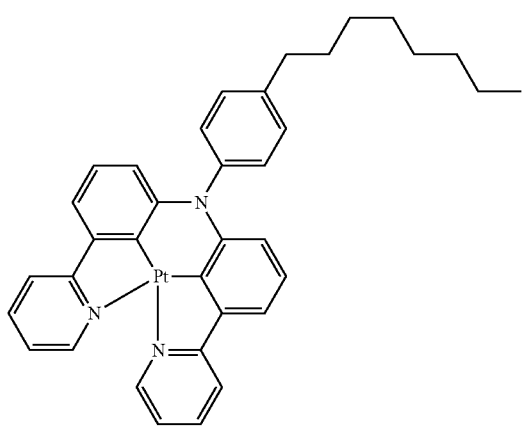
D42 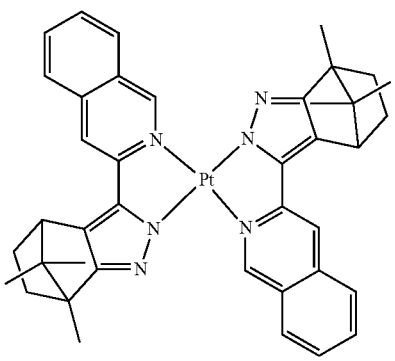
D38 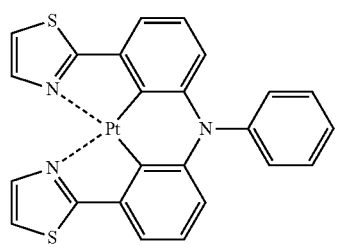
D43 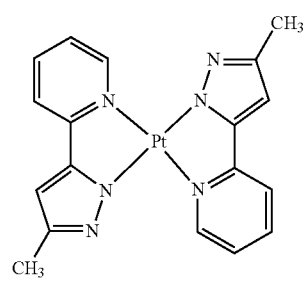
D39 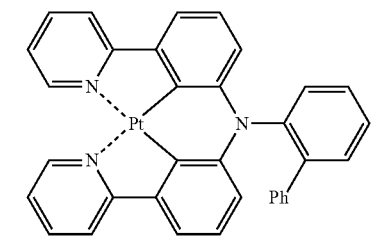
D44 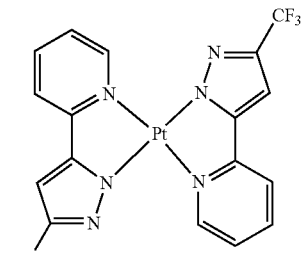
D40 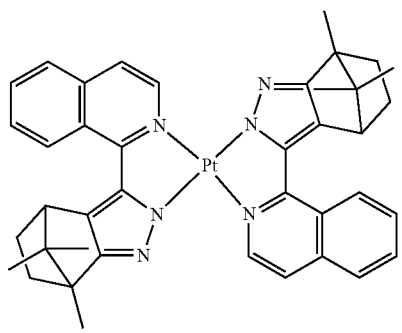
D45 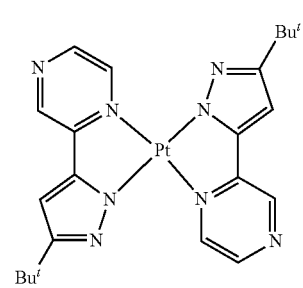

-continued

D46

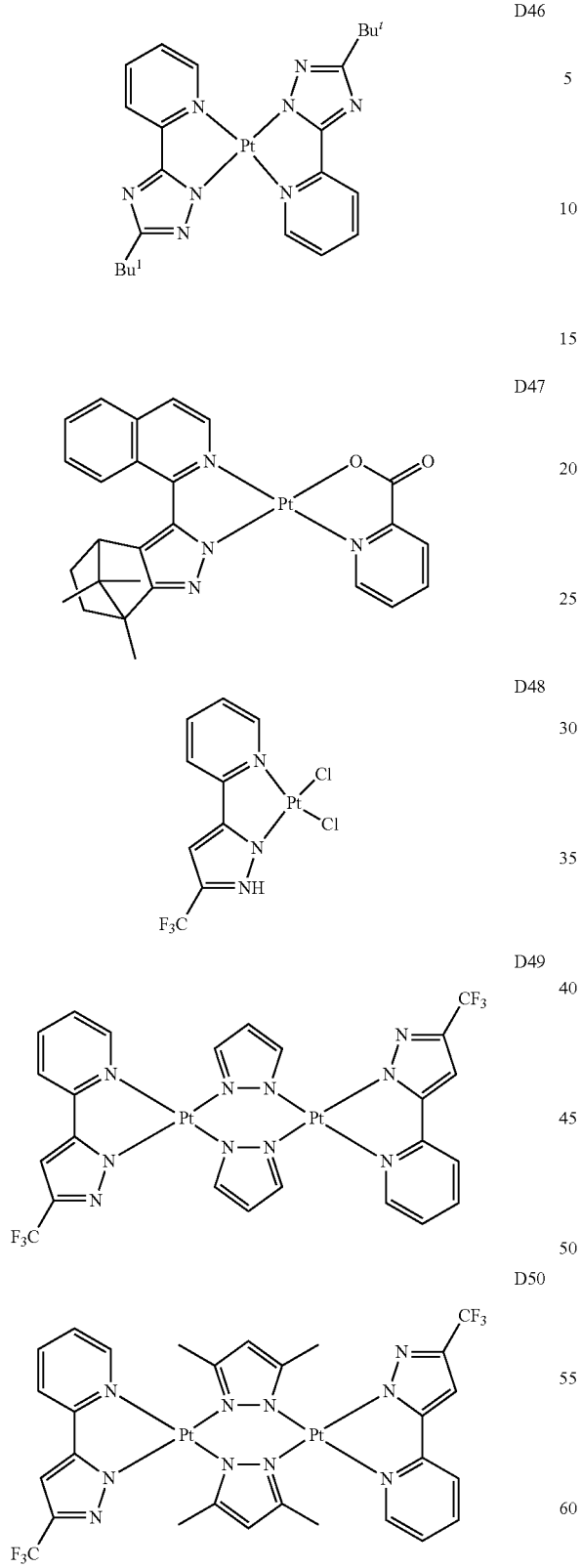

D47

D48

D49

D50

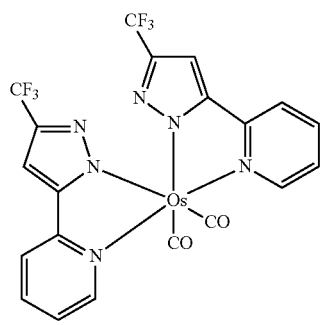

Os(fppz)₂(CO)₂

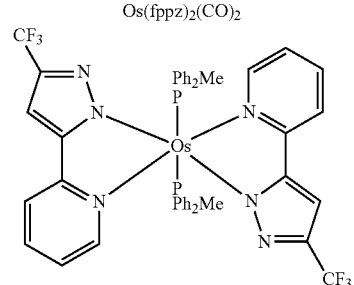

Os(fppz)₂(PPh₂Me)₂

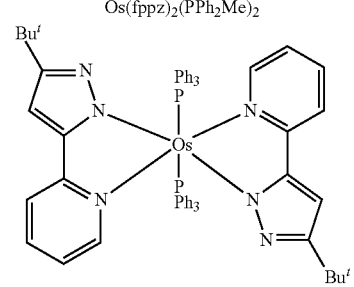

Os(bppz)₂(PPh₃)₂

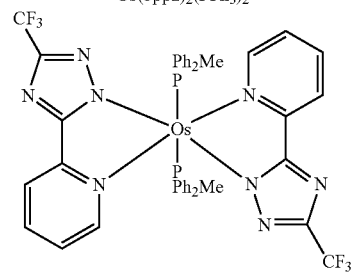

Os(fptz)₂(PPh₂Me)₂

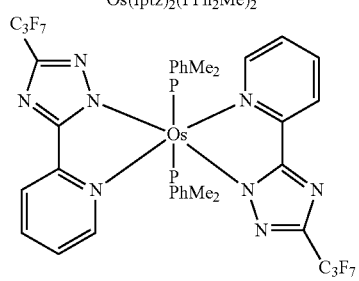

Os(hptz)₂(PPhMe₂)₂

Non-limiting examples of the dopant that may be used in the EML 25 are Os complexes represented by the following formulae:

When the EML 25 includes both a host and a dopant, the amount of the dopant may be, but is not limited to, from about 0.01 to about 15 parts by weight based on 100 parts by weight of the host.

A thickness of the EML 25 may be from about 100 Å to about 1000 Å, and in some embodiments, may be from about 200 Å to about 600 Å. In one embodiment, when the thickness of the EML 25 is within these ranges, the EML 25 has improved light-emitting ability without a substantial increase in driving voltage.

Then, an ETL 27A may be formed on the EML 25 using any of a variety of methods, such as vacuum deposition, spin coating, casting, or the like. When the ETL 27A is formed using vacuum deposition or spin coating, the deposition and coating conditions may be similar to those for the formation of the HIL 23A, though the deposition and coating conditions may vary depending on the material that is used to form the ETL 23A. A material for forming the ETL 27A may be any suitable material that can stably transport electrons injected from the second electrode 29. Non-limiting examples of materials for forming the ETL are a quinoline derivative, such as tris(8-quinolinorate)aluminum (Alq3), TAZ, BAlq, beryllium bis(benzoquinolin-10-olate) (Bebq$_2$), 9,10-di(naphthalene-2-yl)anthracene (ADN), Compound 201, and Compound 202, but are not limited thereto.

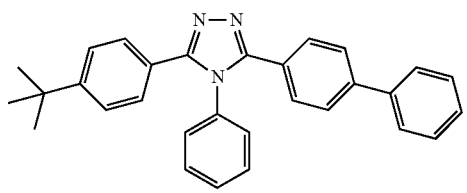

TAZ

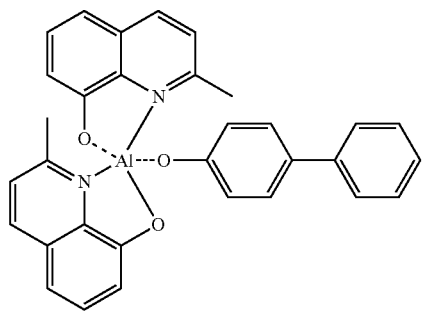

BAlq

Compound 201

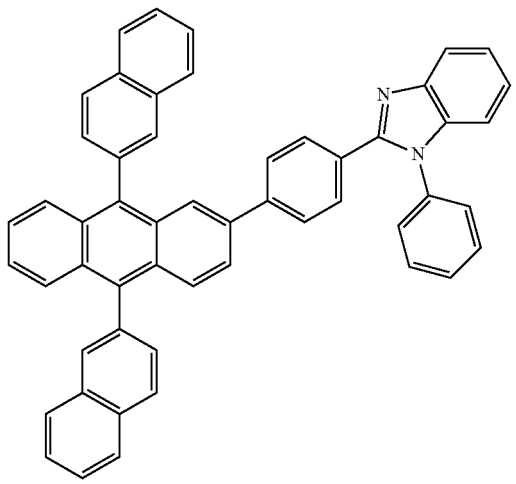

Compound 202

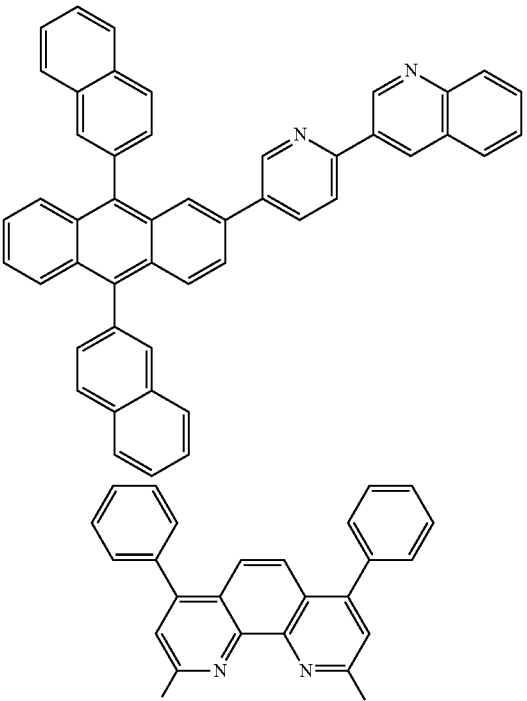

BCP

The thickness of the ETL 27A may be from about 100 Å to about 1,000 Å, and in some embodiments, may be from about 150 Å to about 500 Å. In one embodiment, when the thickness of the ETL 27A is within these ranges, the ETL 237A has satisfactory electron transporting ability without a substantial increase in driving voltage.

The ETL 27A may further include a metal-containing material, in addition to such an electron transporting organic material as described above.

The metal-containing material may include a lithium (Li) complex. Non-limiting examples of the Li complex are lithium quinolate (LiQ) and Compound 203 below:

Compound 203

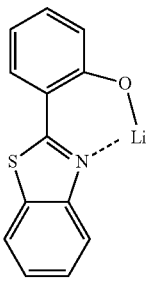

Then, an EIL 27B, which facilitates injection of electrons from the anode, may be formed on the ETL 27A. Any suitable electron-injecting material may be used to form the EIL 27B.

Non-limiting examples of materials for forming the EIL 27B are LiF, NaCl, CsF, Li$_2$O, and BaO. The deposition and coating conditions for forming the EIL 27B may be similar to those for the formation of the HIL 23A, though the deposition and coating conditions may vary according to the material that is used to form the EIL 27B.

The thickness of the EIL 28B may be from about 1 Å to about 100 Å, and in some embodiments, may be from about 3 Å to about 90 Å. In one embodiment, when the thickness of the EIL 27B is within these ranges, the EIL 27B has satisfactory electron injection ability without a substantial increase in driving voltage.

The EML 25 may include the second compound of Formula 100 described above. For example, the EML 25 may include the second compound of Formula 100A-H1 or 100B-H1.

Figure 3:
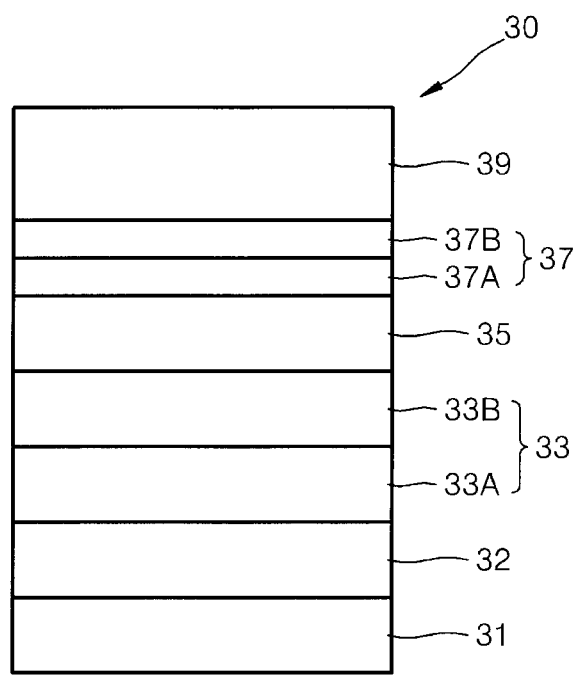
FIG. 3 is a schematic view of a structure of an organic light-emitting diode according to another embodiment of the present invention.

FIG. 3 is a schematic view of a structure of an organic light-emitting diode 30 according to another embodiment of the present invention. Referring to FIG. 3, the organic light emitting diode 30 has a structure including a substrate 31, a first electrode 32, a hole migration region 33, an EML 35, an electron migration region 37, and a second electrode 39 that are sequentially stacked on one another. The hole migration region 33 includes a HIL 33A and a HTL 33B that are sequentially stacked on the first electrode 32. The electron migration region 37 includes an ETL 37A and an EIL 37B that are sequentially stacked on the EML 35.

The above-detailed descriptions of the substrate 21, the first electrode 22, the HIL 23A, the ETL 27A, the EIL 27B, and the second electrode 29 may be referred to as detailed descriptions of the substrate 31, the first electrode 32, the HIL 33A, the ETL 37A, the EIL 38B, and the second electrode 39 of FIG. 3.

A material for the HTL 33B may be a first compound represented by Formula 1 above. The above-detailed description of Formula 1 above may be referred to here. For example, the HTL 33B may include a first compound of the Formula 1A, 1B, or 1C, wherein, in Formulae 1A, 1B and 1C, $Ar_{101}$ and $Ar_{102}$ may be, each independently, a group represented by one of Formulae 4-1 to 4-7; xa and xb may be, each independently, 1 or 2; $R_{101}$ may be a group represented by one of Formulae 6-1 to 6-8; $R_{109}$ may be a group represented by one of Formulae 6-1 to 6-11; $R_{111}$ and $R_{112}$ may be, each independently, one of a $C_1$-$C_{20}$ alkyl group; a $C_1$-$C_{20}$ alkyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and $R_{102}$ to $R_{108}$ and $R_{113}$ to $R_{119}$ may be hydrogen atoms.

In some embodiments, a material for the HTL 33B may be one of Compounds 1-1 to 1-19 above.

The thickness of the HTL 33B may be from about 50 Å to about 2000 Å, and in some embodiments, may be from about 100 Å to about 1500 Å. In one embodiment, when the thickness of the HTL 33B is within these ranges, the HTL 33B may have satisfactory hole transporting ability without a substantial increase in driving voltage.

At least one of the HIL 33A and the HTL 33B may further include a charge-generating material as described above.

The EML 35 may include a host and a dopant, the host including a second compound represented by Formula 100 above. The above-detailed description of Formula 100 above may be referred to here. For example, the EML 35 may include the second compound of Formula 100A-H1 or 100B-H1 as a host. The above-detailed descriptions of Formulae 100A-H1 and 100B-H1 may be referred to here. For example, the EML 35 may include Compound 2-5, 2-7, 2-23, or 2-30 as a host, but is not limited thereto.

The above-detailed descriptions on the dopant and thickness of the EML 25 of FIG. 2 may be referred to here as descriptions of the dopant and thickness of the EML 35 of FIG. 3.

Although described with reference to the organic light-emitting diodes 10, 20, and 30 of FIGS. 1, 2, and 3, the embodiments of the present invention are not limited thereto. Although not shown in FIGS. 2 and 3, a buffer layer may be further disposed between the second HTL 23B-2 and the EML 25 of FIG. 2, or between the HTL 33B and the EML 35 of FIG. 3 in order to compensate for an optical resonance distance according to the wavelength of light emitted from the EML 25 or 35 for higher efficiency. The buffer layer may include a suitable hole injection material, a suitable hole transporting material, the first compound of Formula 1 above, or the second compound of Formula 100 above.

When the EML 25 or 35 includes a phosphorescent dopant, a hole blocking layer (HBL) may be disposed between the EML 25 and the ETL 27A of FIG. 2, or between the EML 35 and the ETL 37A of FIG. 3, in order to prevent diffusion of triplet exitons or holes into the ETL 27A or 37A. When the HBL is formed using vacuum deposition or spin coating, the conditions for deposition and coating may be similar to those for the formation of the HIL, although the conditions for deposition and coating may vary according to the material that is used to form the HBL. Any suitable hole-blocking material may be used. Non-limiting examples of hole-blocking materials are oxadiazole derivatives, triazole derivatives, and phenanthroline derivatives. For example, bathocuproine (BCP) represented by the following formula may be used as a material for forming the HBL.

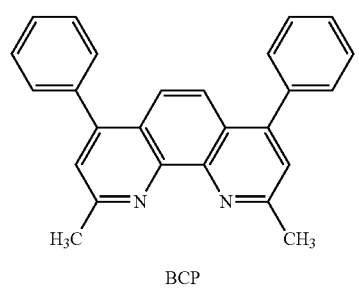 [SMILES: Cc1cc(-c2ccccc2)c2ccc3c(-c4ccccc4)cc(C)nc3c2n1 ; "BCP"]

BCP

The thickness of the HBL may be from about 20 Å to about 1000 Å, and in some embodiments, may be from about 30 Å to about 300 Å. In one embodiment, when the thickness of the HBL is within these ranges, the HBL has improved hole blocking ability without a substantial increase in driving voltage.

In some embodiments, the HIL 23A of FIG. 2 and/or the HIL 33A of FIG. 3 may not be included. However, embodiments of the present invention are not limited thereto, and may include any of a variety of structures.

As used herein, the unsubstituted $C_1$-$C_{60}$ alkyl group (or a $C_1$-$C_{60}$ alkyl group) may be a linear or branched C1-C60 alkyl group, including a methyl group, an ethyl group, a propyl group, an isobutyl group, a sec-butyl group, a pentyl group, an iso-amyl group, and a hexyl group. The substituted $C_1$-$C_{60}$ alkyl group may include at least one substituent selected from among a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and —N($Q_{11}$)($Q_{12}$) and —Si($Q_{11}$)($Q_{12}$)($Q_{13}$) (where $Q_{11}$ and $Q_{12}$ may be, each independently, a $C_6$-$C_{60}$ aryl group, or a $C_2$-$C_{60}$ heteroaryl group, and $Q_{13}$ to $Q_{15}$ may be, each independently, a $C_1$-$C_{60}$ alkyl group, a $C_1$-$C_{60}$ alkoxy group, a $C_6$-$C_{60}$ aryl group, or a $C_2$-$C_{60}$ heteroaryl group), but is not limited thereto.

As used herein, the unsubstituted $C_1$-$C_{60}$ alkoxy group (or a $C_1$-$C_{60}$ alkoxy group) is represented by —OA (where A indicates a $C_1$-$C_{60}$ alkyl group as described above), and may be, for example, a methoxy group, an ethoxy group, or an isopropoxy group. At least one hydrogen atoms of these alkyl groups may be substituted with those substituents described above in conduction with the substituted $C_1$-$C_{60}$ alkyl group.

As used herein, the unsubstituted $C_2$-$C_{60}$ alkenyl group (or a $C_2$-$C_{60}$ alkenyl group) refers to a $C_2$-$C_{60}$ alkyl group as described above with at least one carbon double bond in the middle or terminal thereof. Examples of the alkenyl group are an ethenyl group, a propenyl group, a butenyl group, and the like. At least one hydrogen atom in the unsubstituted $C_2$-$C_{60}$ alkenyl group may be substituted with those substituents described above in conjunction with the substituted $C_1$-$C_{60}$ alkyl group.

The unsubstituted $C_2$-$C_{60}$ alkynyl group is a $C_2$-$C_{60}$ alkyl group having at least one carbon-carbon triple bond in the center or at a terminal thereof. Examples of the unsubstituted $C_2$-$C_{60}$ alkynyl group are an ethenyl group, a propynyl group, and the like. At least one hydrogen atom in the alkynyl group may be substituted with those substituents described above in conjunction with the substituted $C_1$-$C_{60}$ alkyl group.

The unsubstituted $C_6$-$C_{60}$ aryl group is monovalent carbocyclic aromatic system having 6 to 60 carbon atoms including at least one aromatic ring. The unsubstituted $C_6$-$C_{60}$ arylene group is a divalent group having a divalent carbocyclic aromatic system having 6 to 60 carbon atoms including at least one aromatic ring. When the aryl group and the arylene group have at least two rings, they may be fused to each other via a single bond. At least one hydrogen atom in the aryl group and the arylene group may be substituted with those substituents described above in conjunction with the $C_1$-$C_{60}$ alkyl group.

Examples of the substituted or unsubstituted $C_6$-$C_{60}$ aryl group are a phenyl group, a $C_1$-$C_{10}$ alkylphenyl group (e.g., an ethylphenyl group), a $C_1$-$C_{10}$ alkylbiphenyl group (e.g., an ethylbiphenyl group), a halophenyl group (e.g., an o-, m- or p-fluorophenyl group and a dichlorophenyl group), a dicyanophenyl group, a trifluoromethoxyphenyl group, an o-, m- or p-tolyl group, an o-, m- or p-cumenyl group, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), a $C_1$-$C_{10}$ alkoxynaphthyl group (e.g., a methoxynaphthyl group), an anthracenyl group, an azulenyl group, a heptalenyl group, an acenaphthylenyl group, a phenalenyl group, a fluorenyl group, an anthraquinolinyl group, a methylanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, hexacenyl group, a rubicenyl group, a coronenyl group, a trinaphthylenyl group, a heptaphenyl group, a heptacenyl group, a pyranthrenyl group, and an ovalenyl group. Examples of the substituted $C_6$-$C_{60}$ aryl group may be inferred based on those of the unsubstituted $C_6$-$C_{60}$ aryl group and the substituted $C_1$-$C_{30}$ alkyl group described above. Examples of the substituted or unsubstituted $C_6$-$C_{60}$ arylene group may be inferred based on those examples of the substituted or unsubstituted $C_6$-$C_{60}$ aryl group described above.

The unsubstituted $C_2$-$C_{60}$ heteroaryl group is a monovalent group having at least one aromatic ring having at least one of the heteroatoms selected from the group consisting of N, O, P, and S. The unsubstituted $C_2$-$C_{60}$ heteroarylene group is a divalent group having at least one aromatic ring having at least one of the heteroatoms selected from the group consisting of N, O, P, and S. In this regard, when the heteroaryl group and the heteroarylene group have at least two rings, they may be fused to each other via a single bond. At least one hydrogen atom in the heteroaryl group and the heteroarylene group may be substituted with those substituents described with reference to the $C_1$-$C_{60}$ alkyl group.

Examples of the unsubstituted $C_2$-$C_{60}$ heteroaryl group are a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group and an imidazopyrimidinyl group. Examples of the substituted or unsubstituted $C_2$-$C_{50}$ heteroarylene group may be inferred based on those examples of the substituted or unsubstituted $C_2$-$C_{60}$ arylene group described above.

The substituted or unsubstituted $C_6$-$C_{60}$ aryloxy group indicates —$OA_2$ (where $A_2$ is a substituted or unsubstituted $C_6$-$C_{60}$ aryl group described above). The substituted or unsubstituted $C_6$-$C_{60}$ arylthio group indicates —$SA_3$ (where $A_3$ is a substituted or unsubstituted $C_6$-$C_{60}$ aryl group described above).

Hereinafter, the present invention will be described in more detail with reference to the following synthesis examples and other examples. However, these examples are for illustrative purposes only and are not intended to limit the scope of the present invention.

EXAMPLES

Synthesis Example 1

Synthesis of Compound 2-1

Compound 2-1 was synthesized according to the following reaction scheme:

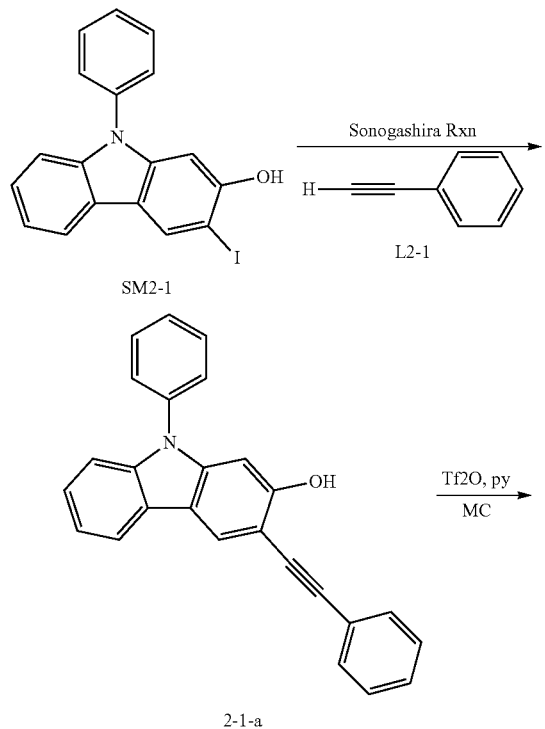

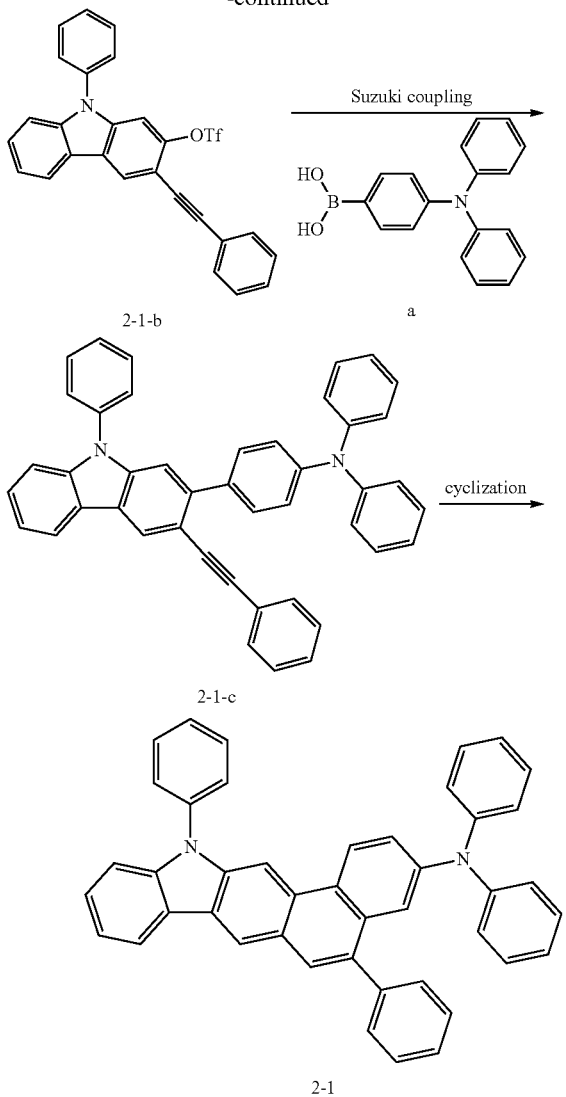

Synthesis of Intermediate 2-1-a 13.6 g (1.2 eq) of Intermediate SM2-1 (3-Iodo-9-phenyl-9H-carbazol-2-ol), 1.36 g (0.04 eq) of Pd(PPh$_3$)$_4$, 450 mg (0.08 eq) of CuI were put into a flask, which was then supplied with N$_2$ gas in a vacuum, and 200 mL of THF was added thereto and stirred. 2.2 mL (1.2 eq) of triethylamine and 1 eq of Intermediate L2-1 were slowly dropwise added thereinto, and then stirred in N$_2$ atmosphere at room temperature for about 2 hours. After removing the solvent using a rotary evaporator, the reaction solution was added with 100 mL of water, and then extracted three times with 100 mL of ethyl ether. An organic layer was collected, and then dried using magnesium sulfate to evaporate the solvent. The residue was separated and purified by silica gel column chromatography to obtain Intermediate 2-1-a.

Synthesis of Intermediate 2-1-b

After dissolving 5 g of Intermediate 2-1-a in 100 mL of methylene chloride (MC), the temperature was cooled down to 0° C., followed by adding 7.84 g of Tf$_2$O and 2 mL of pyridine and stirring at about 0° C. for about 1 hour. After increasing the temperature of the reaction solution to room temperature, the reaction solution was extracted three times with 100 mL of water and 100 mL of MC. An organic layer was collected, and then dried using magnesium sulfate to evaporate the solvent. The residue was separated and purified by silica gel column chromatography to obtain Intermediate 2-1-b.

Synthesis of Intermediate 2-1-c 5 g of Intermediate 2-1-b, 1.5 g (1.2 eq) of Compound a, 590 mg (0.05 eq) of Pd(PPh$_3$)$_4$, and 7.0 g (5 eq) of K$_2$CO$_3$ were dissolved in 100 mL of THF and 30 mL of distilled water, and then stirred under reflux for about 24 hours after a temperature increase to about 120° C. The reaction solution was cooled down to room temperature, and then extracted three times with 200 mL of water and 200 mL of diethylether. An organic layer was collected, and then dried using magnesium sulfate to evaporate the solvent. The residue was separated and purified by silica gel column chromatography to obtain Intermediate 2-1-c.

Synthesis of Compound 2-1

3 g of Intermediate 2-1-c was dissolved in 50 mL of MC, and 12.5 mL (20 eq) of trifluoroacetic acid was slowly dropwise added thereinto and stirred at room temperature for about 1 hour. After completion of the reaction, the reaction solution was extracted three times each with 100 mL of water and 100 mL of diethylether. An organic layer was collected, and then dried using magnesium sulfate to evaporate the solvent. The residue was separated and purified by silica gel column chromatography to obtain Compound 2-1.

Synthesis Example 2

Synthesis of Compound 2-5

Compound 2-5 was synthesized according to the following reaction scheme:

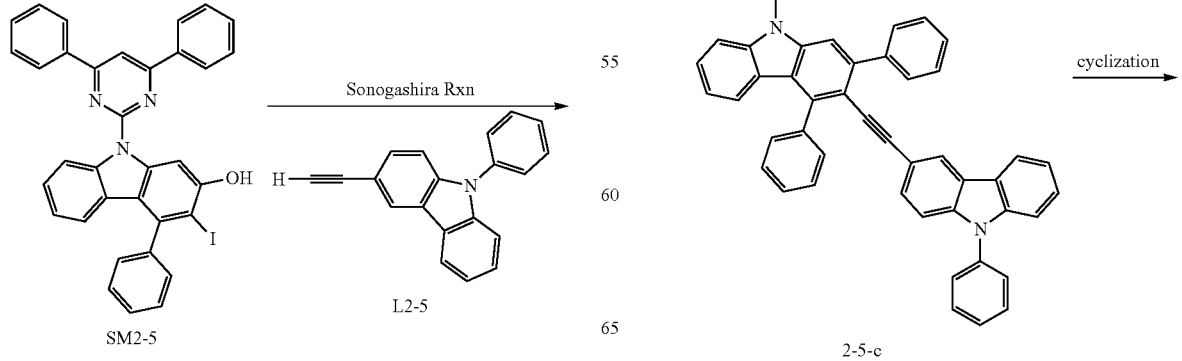

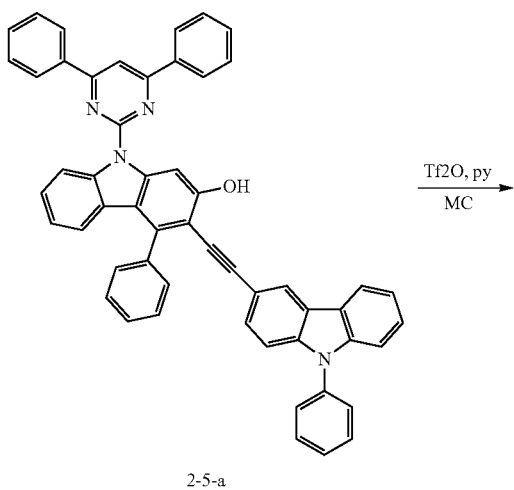

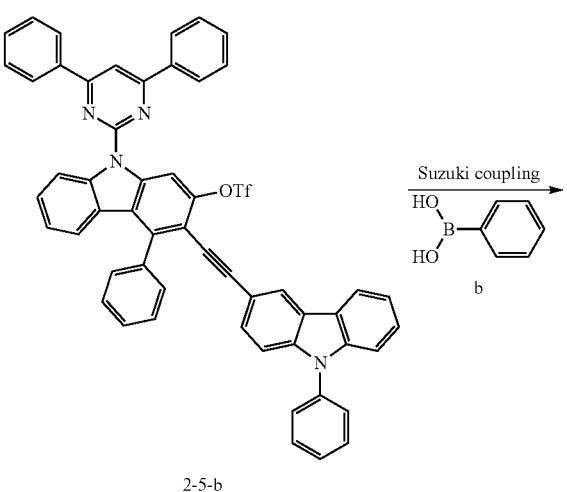

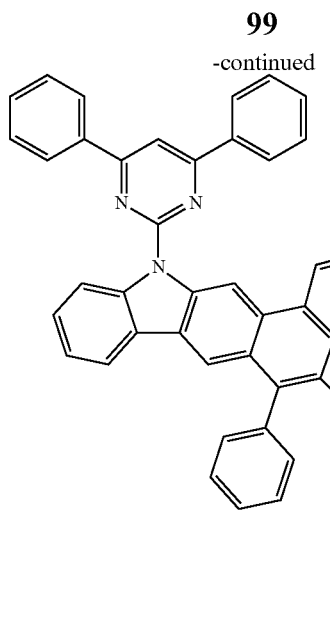

2-5

Synthesis of Intermediate 2-5-a

Intermediate 2-5-a was obtained in the same manner as in the synthesis of Intermediate 2-1-a, except that Intermediates SM2-5 and L2-5 instead of Intermediates SM2-1 and L2-1, respectively, were used.

Synthesis of Intermediate 2-5-b

Intermediate 2-5-b was obtained in the same manner as in the synthesis of Intermediate 2-1-b, except that Intermediate 2-5-a instead of Intermediate 2-1-a was used.

Synthesis of Intermediate 2-5-c

Intermediate 2-5-c was obtained in the same manner as in the synthesis of Intermediate 2-1-c, except that Intermediate 2-5-b and Compound b instead of Intermediate 2-1-b and Compound a, respectively, were used.

Synthesis of Compound 2-5

Intermediate 2-5 was obtained in the same manner as in the synthesis of Compound 2-1, except that Intermediate 2-5-c instead of Intermediate 2-1-c was used.

Synthesis Example 3

Synthesis of Compound 2-7

Compound 2-7 was synthesized according to the following reaction scheme:

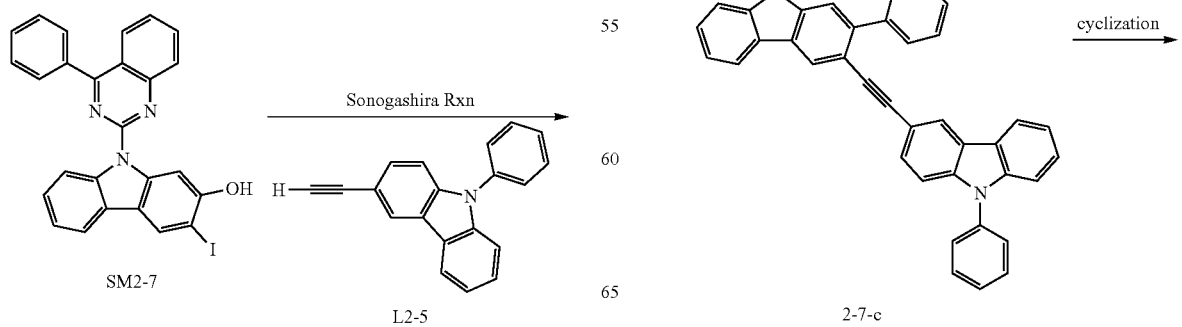

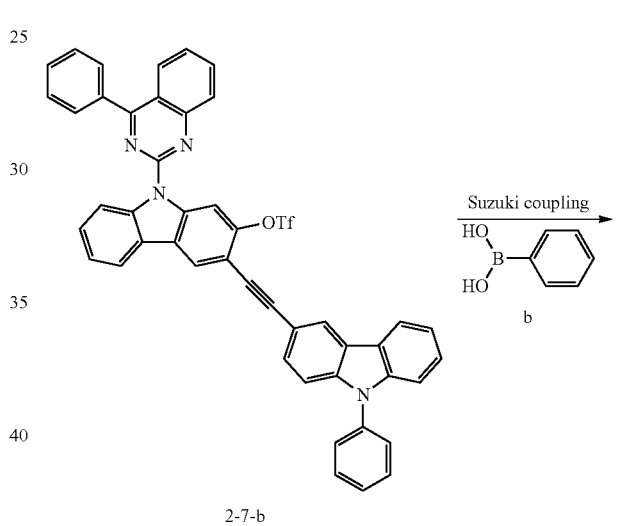

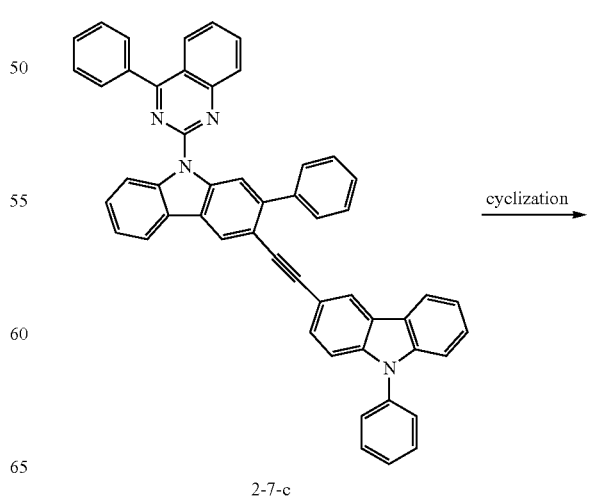

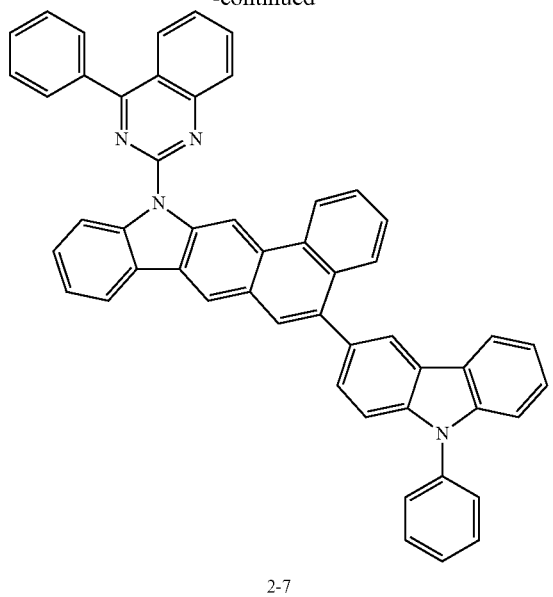

2-7

Synthesis of Intermediate 2-7-a

Intermediate 2-7-a was obtained in the same manner as in the synthesis of Intermediate 2-1-a, except that Intermediates SM2-7 and L2-5 instead of Intermediates SM2-1 and L2-1, respectively, were used.

Synthesis of Intermediate 2-7-b

Intermediate 2-7-b was obtained in the same manner as in the synthesis of Intermediate 2-1-b, except that Intermediate 2-7-a instead of Intermediate 2-1-a was used.

Synthesis of Intermediate 2-7-c

Intermediate 2-7-c was obtained in the same manner as in the synthesis of Intermediate 2-1-c, except that Intermediate 2-7-b and Compound b instead of Intermediate 2-1-b and Compound a, respectively, were used.

Synthesis of Compound 2-7

Compound 2-7 was obtained in the same manner as in the synthesis of Compound 2-1, except that Intermediate 2-7-c instead of Intermediate 2-1-c was used.

Synthesis Example 4

Synthesis of Compound 2-23

Compound 2-23 was synthesized according to the following reaction scheme:

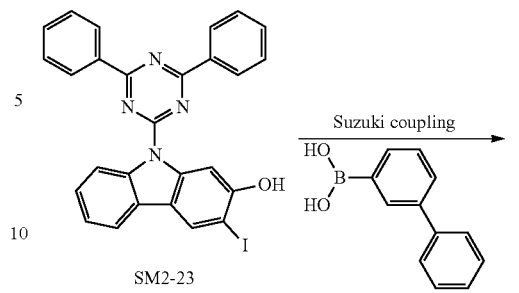

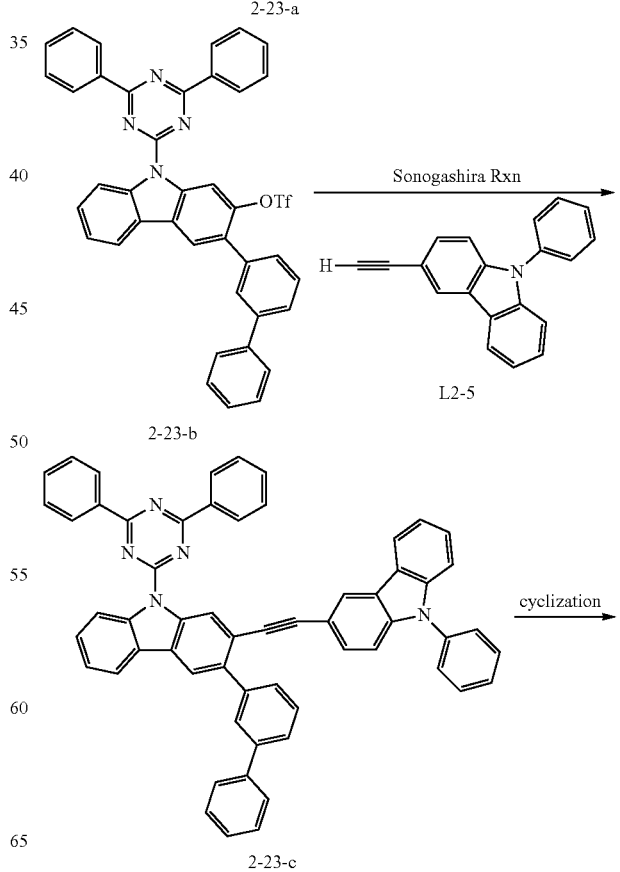

103

-continued

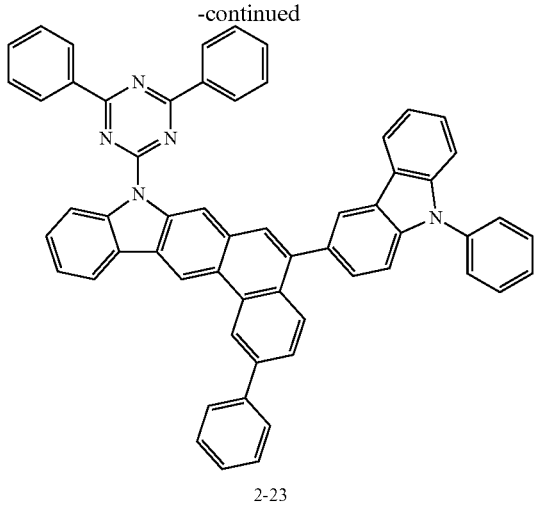

2-23

Synthesis of Intermediate 2-23-a 10 g of Intermediate SM2-23, 1.2 eq of Compound c, 1.5 mg (0.05 eq) of Pd(PPh$_3$)$_4$, and 18 g (5 eq) of K$_2$CO$_3$ were dissolved in 200 mL of THF and 60 mL of distilled water, and then stirred under reflux for about 24 hours after a temperature increase to about 120° C. The reaction solution was cooled down to room temperature, and then extracted three times with 200 mL of water and 200 mL of diethylether. An organic layer was collected, and then dried using magnesium sulfate to evaporate the solvent. The residue was separated and purified by silica gel column chromatography to obtain Intermediate 2-23-a.

Synthesis of Intermediate 2-23-b 5 g of Intermediate 2-23-a was dissolved in 100 mL of MC to obtain a solution, which was cooled down to about 0° C., followed by adding 8.4 g of Tf$_2$O and 2 mL of pyridine, and stirring at 0° C. for about 1 hour. After a temperature increase to room temperature, the reaction solution was extracted three times with 100 mL of water and 100 mL of MC. An organic layer was collected, and then dried using magnesium sulfate to evaporate the solvent. The residue was separated and purified by silica gel column chromatography to obtain Intermediate 2-23-b.

Synthesis of Intermediate 2-23-c 1.2 eq of Intermediate 2-23-b. 470 g (0.04 eq) of Pd(PPh$_3$)$_4$, and 160 mg (0.08 eq) of CuI were put into a flask, which was then supplied with N$_2$ gas in a vacuum, and 200 mL of THF was added thereto and stirred. 0.9 mL (1.2 eq) of triethylamine and 1 eq of Intermediate L2-5 were slowly dropwise added thereinto, and then stirred in N$_2$ atmosphere at room temperature for about 2 hours. After removing the solvent using a rotary evaporator, 100 mL of water was added to the reaction solution, which was then extracted three times with 100 mL of ethylether. An organic layer was collected, and then dried using magnesium sulfate to evaporate the solvent. The residue was separated and purified by silica gel column chromatography to obtain Intermediate 2-23-c.

104

Synthesis of Compound 2-23

3 g of Intermediate 2-23-c was dissolved in 50 mL of MC, and 7.4 mL (20 eq) of trifluoroacetic acid was slowly dropwise added thereinto and stirred at room temperature for about 1 hour. After completion of the reaction, the reaction solution was extracted three times with 100 mL of water and 100 mL of diethylether. An organic layer was collected, and then dried using magnesium sulfate to evaporate the solvent. The residue was separated and purified by silica gel column chromatography to obtain Compound 2-23.

Synthesis Example 5

Synthesis of Compound 2-27

Compound 2-27 was synthesized according to the following reaction scheme:

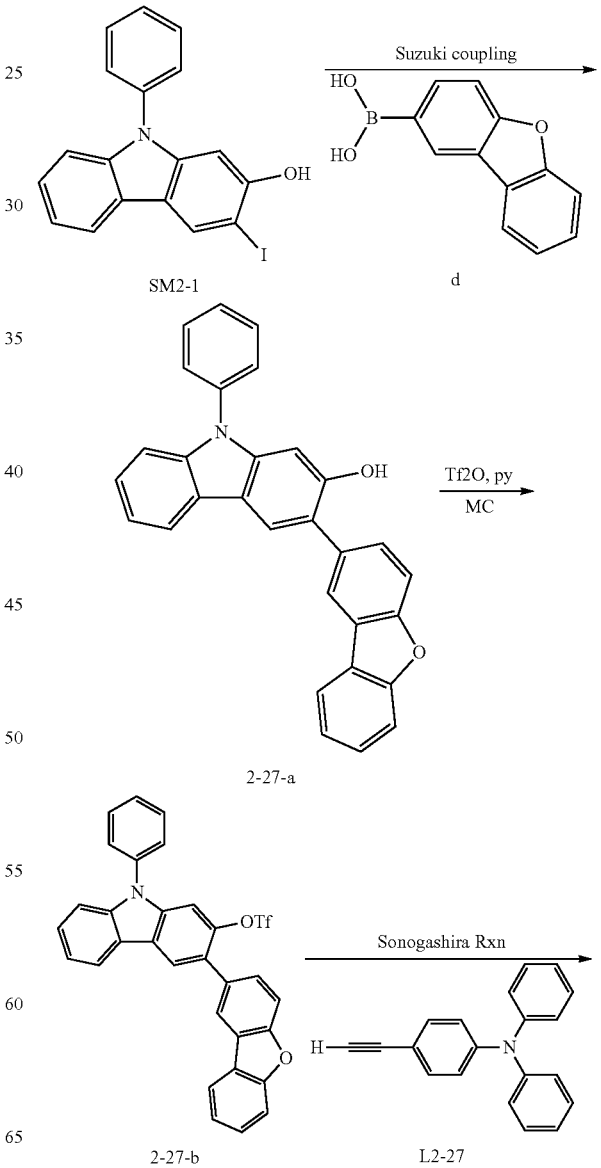

-continued

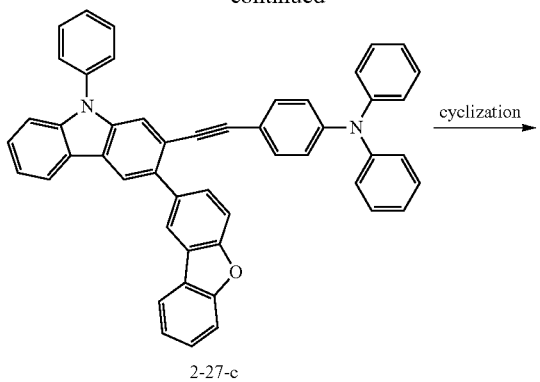

2-27-c cyclization →

2-27

Synthesis of Intermediate 2-27-a

Intermediate 2-27-a was obtained in the same manner as in the synthesis of Intermediate 2-23-a, except that Intermediate SM2-1 and Compound d instead of Intermediate SM2-23 and Compound c, respectively, were used.

Synthesis of Intermediate 2-27-b

Intermediate 2-27-b was obtained in the same manner as in the synthesis of Intermediate 2-23-b, except that Intermediate 2-27-a instead of Intermediate 2-23-a was used.

Synthesis of Intermediate 2-27-c

Intermediate 2-27-c was obtained in the same manner as in the synthesis of Intermediate 2-23-c, except that Intermediates 2-27-b and L2-27 instead of Intermediates 2-23-b and L2-5, respectively, were used.

Synthesis of Compound 2-27

Compound 2-27 was obtained in the same manner as in the synthesis of Compound 2-23, except that Intermediate 2-27-c instead of Intermediate 2-23-c was used.

Synthesis Example 6

Synthesis of Compound 2-30

Compound 2-30 was synthesized according to the following reaction scheme:

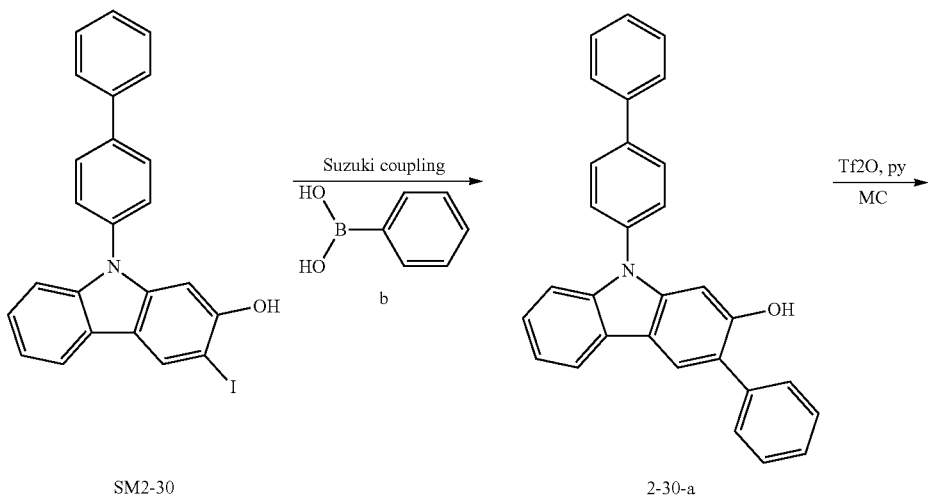

-continued

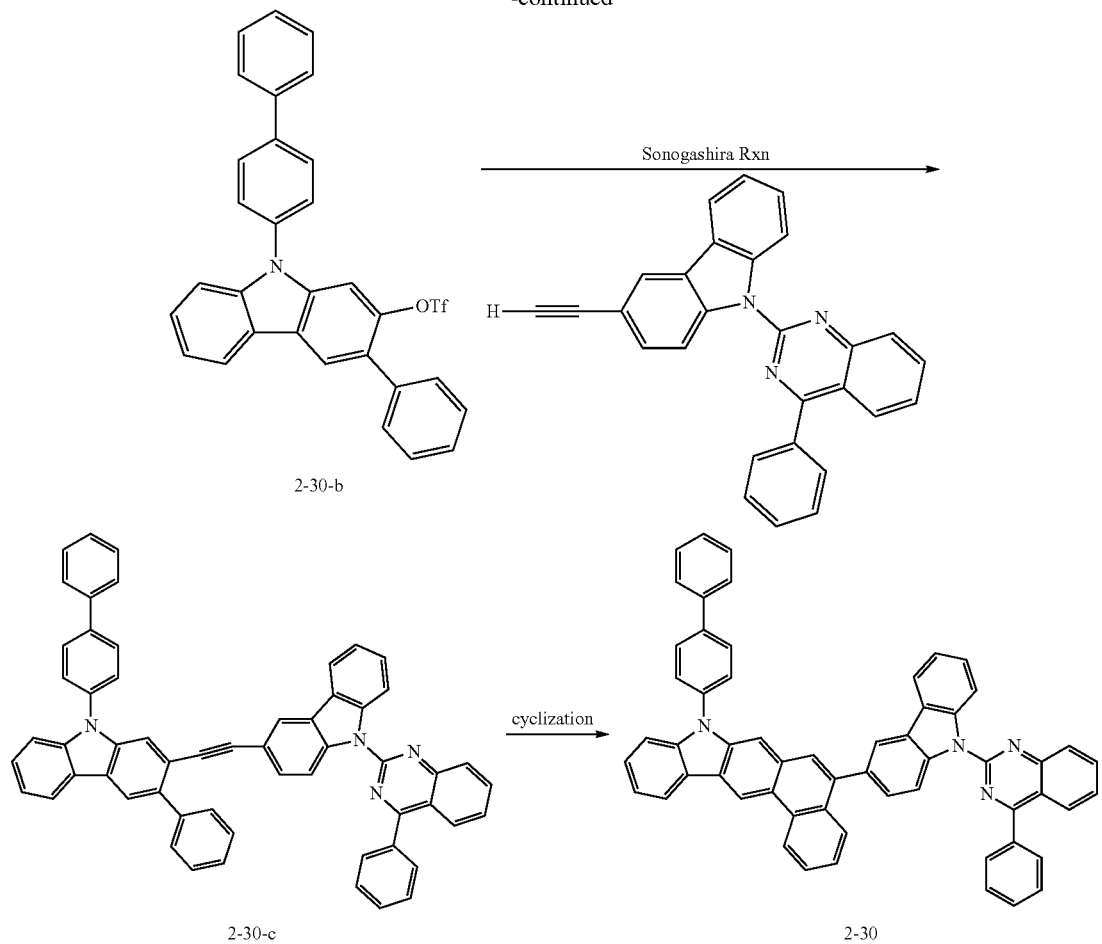

2-30-b 2-30-c 2-30

Synthesis of Intermediate 2-30-a

Intermediate 2-30-a was obtained in the same manner as in the synthesis of Intermediate 2-23-a, except that Intermediate SM2-30 and Compound b instead of Intermediate SM2-23 and Compound c, respectively, were used.

Synthesis of Intermediate 2-30-b

Intermediate 2-30-b was obtained in the same manner as in the synthesis of Intermediate 2-23-b, except that Intermediate 2-30-a instead of Intermediate 2-23-a was used.

Synthesis of Intermediate 2-30-c

Intermediate 2-30-c was obtained in the same manner as in the synthesis of Intermediate 2-23-c, except that Intermediates 2-30-b and L2-30 instead of Intermediates 2-23-b and L2-5, respectively, were used.

Synthesis of Compound 2-30

Compound 2-30 was obtained in the same manner as in the synthesis of Compound 2-23, except that Intermediate 2-30-c instead of Intermediate 2-23-c was used.

Example 1

To manufacture an anode, a glass substrate with deposited ITO/Ag/ITO layers (70/1000/70 Å) was cut to a size of 50 mm×50 mm×0.5 mm and then ultrasonicated in isopropyl alcohol for five minutes and in pure water for five minutes, and then cleaned by irradiation of ultraviolet rays for 30 minutes and exposure to ozone. The resulting glass substrate was loaded into a vacuum deposition device.

After 2-TNATA was vacuum-deposited on the anode to form an HIL having a thickness of 600 Å, Compound 1-8 was deposited on the HIL to form a first HTL having a thickness of about 600 Å, and then Compound 2-1 was deposited on the first HTL to form a second HTL having a thickness of about 750 Å.

CBP (host) and PtOEP (dopant) were co-deposited in a weight ratio of about 91:9 on the second HTL to form an EML having a thickness of about 400 Å, followed by depositing BCP on the EML to form a HBL having a thickness of about 50 Å. After depositing $Alq_3$ on the HBL to form an ETL having a thickness of about 350 Å, LiF was deposited on the ETL to form an EIL having a thickness of about 10 Å, followed by depositing Mg and Al in a weight ratio of about 90:10 on the EIL to form a cathode having a thickness of about 120 Å, thereby manufacturing an organic light-emitting device (emitting red light)

Example 2

An organic light-emitting device was manufactured in the same manner as in Example 1, except that Compound 1-17 instead of Compound 1-8 was used to form the first HTL.

Example 3

An organic light-emitting device was manufactured in the same manner as in Example 1, except that Compound 1-19 instead of Compound 1-8 was used to form the first HTL, and Compound 2-27 instead of Compound 2-1 was used to form the second HTL.

Example 4

An organic light-emitting device was manufactured in the same manner as in Example 1, except that, instead of forming the first and second HTLs, a HTL having a thickness of about 1350 Å was formed by depositing Compound 1-8 on the HIL, and Compound 2-7 instead of CBP was used as a host in forming the EML on the HTL

Example 5

An organic light-emitting device was manufactured in the same manner as in Example 4, except that Compound 1-17 instead of Compound 1-8 was used to form the HTL.

Example 6

An organic light-emitting device was manufactured in the same manner as in Example 4, except that Compound 1-19 instead of Compound 1-8 was used to form the HTL, and Compound 2-30 instead of Compound 2-7 was used as a host in forming the EML.

Example 7

To manufacture an anode, a glass substrate with deposited ITO/Ag/ITO layers (70 Å/1000 Å/70 Å) was cut to a size of 50 mm×50 mm×0.5 mm and then ultrasonicated in isopropyl alcohol and pure water each for five minutes, and then cleaned by irradiation of ultraviolet rays for 30 minutes and exposure to ozone. The resulting glass substrate was loaded into a vacuum deposition device.

2-TNATA was vacuum-deposited on the anode to form an HIL having a thickness of 600 Å, and then Compound 1-8 was deposited on the HIL to form a HTL having a thickness of 1000 Å.

Compound 2-5 (host) and Ir(ppy)$_3$ (dopant) were co-deposited in a weight ratio of about 91:9 on the HTL to form an EML having a thickness of about 250 Å, followed by depositing BCP on the EML to form a HBL having a thickness of about 50 Å. After depositing Alq$_3$ on the hole blocking layer to form an ETL having a thickness of about 350 Å, LiF was deposited on the ETL to form an EIL having a thickness of about 10 Å, followed by depositing Mg and Al in a weight ratio of about 90:10 on the EIL to form a cathode having a thickness of about 120 Å, thereby manufacturing an organic light-emitting device (emitting green light).

Example 8

An organic light-emitting device was manufactured in the same manner as in Example 7, except that Compound 1-17 instead of Compound 1-8 was used to form the HTL, and Compound 2-23 instead of Compound 2-5 was used as a host in forming the EML.

Example 9

An organic light-emitting device was manufactured in the same manner as in Example 7, except that Compound 1-19 instead of Compound 1-8 was used to form the HTL, and Compound 2-23 instead of Compound 2-5 was used as a host in forming the EML.

Comparative Example 1

An organic light-emitting device was manufactured in the same manner as in Example 7, except that Compound A represented by Formula A below, instead of Compound 1-8, was used to form the HTL, and CBP instead of Compound 2-5 was used as a host in forming the EML.

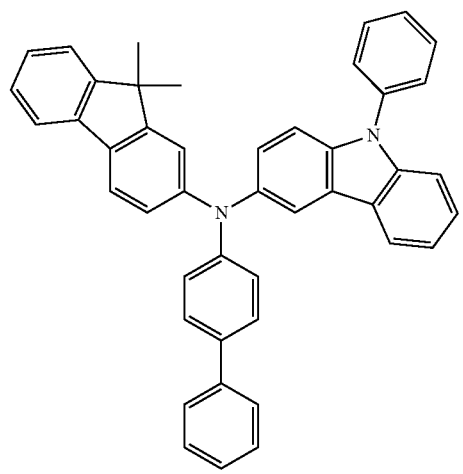

Formula A

Comparative Example 2

An organic light-emitting device was manufactured in the same manner as in Example 4, except that Compound A instead of Compound 1-8 was used to form the HTL, and CBP instead of Compound 2-7 was used as a host in forming the EML.

Evaluation Example 1

Driving voltages, current densities, luminances, emitting-light colors, efficiencies, and half-life spans (@10 mA/cm$^2$) of the organic light-emitting devices of Examples 1 to 8 and Comparative Examples 1 and 2 were measured using a PR650 (Spectroscan) Source Measurement Unit (available from Photo Research, Inc.). The results are shown in Tables 1 and 2 below. $LT_{97}$ was evaluated as the time taken until a measured initial luminance (assumed as 100%) was reduced to 97% during driving at about 10 mA/cm$^2$.

TABLE 1

| | HTL | | | | Driving voltage | Current density | Luminance |
|---|---|---|---|---|---|---|---|
| | First HTL | Second HTL | Host | Dopant | (V) | (mA/cm$^2$) | (cd/m$^2$) |
| Example 1 | Compound 1-8 | Compound 2-1 | CBP | PtOEP | 6.1 | 10 | 3,021 |
| Example 2 | Compound 1-17 | Compound 2-1 | CBP | PtOEP | 6.2 | 10 | 3,109 |
| Example 3 | Compound 1-19 | Compound 2-27 | CBP | PtOEP | 6.0 | 10 | 2,983 |
| Example 4 | Compound 1-8 | Compound 2-7 | | PtOEP | 6.3 | 10 | 3,240 |
| Example 5 | Compound 1-17 | Compound 2-7 | | PtOEP | 6.5 | 10 | 3,037 |
| Example 6 | Compound 1-19 | Compound 2-30 | | PtOEP | 6.0 | 10 | 3,172 |
| Example 7 | Compound 1-8 | Compound 2-5 | | Ir(ppy)$_3$ | 5.8 | 10 | 6,218 |
| Example 8 | Compound 1-17 | Compound 2-23 | | Ir(ppy)$_3$ | 5.9 | 10 | 6,431 |
| Example 9 | Compound 1-19 | Compound 2-23 | | Ir(ppy)$_3$ | 5.7 | 10 | 6,270 |
| Comparative Example 1 | Compound A | | CBP | Ir(ppy)$_3$ | 6.5 | 10 | 4,652 |
| Comparative Example 2 | Compound A | | CBP | PtOEP | 7.0 | 10 | 2,213 |

TABLE 2

| | HTL | | | | Efficiency | Emission | LT$_{97}$ |
|---|---|---|---|---|---|---|---|
| | First HTL | Second HTL | Host | Dopant | (cd/A) | color | (hr) |
| Example 1 | Compound 1-8 | Compound 2-1 | CBP | PtOEP | 30.2 | Red | 134 |
| Example 2 | Compound 1-17 | Compound 2-1 | CBP | PtOEP | 31.1 | Red | 130 |
| Example 3 | Compound 1-19 | Compound 2-27 | CBP | PtOEP | 29.8 | Red | 138 |
| Example 4 | Compound 1-8 | | Compound 2-7 | PtOEP | 32.4 | Red | 135 |
| Example 5 | Compound 1-17 | | Compound 2-7 | PtOEP | 30.4 | Red | 127 |
| Example 6 | Compound 1-19 | | Compound 2-30 | PtOEP | 31.7 | Red | 138 |
| Example 7 | Compound 1-8 | | Compound 2-5 | Ir(ppy)$_3$ | 62.2 | Green | 84 |
| Example 8 | Compound 1-17 | | Compound 2-23 | Ir(ppy)$_3$ | 64.3 | Green | 83 |
| Example 9 | Compound 1-19 | | Compound 2-23 | Ir(ppy)$_3$ | 62.7 | Green | 86 |
| Comparative Example 1 | Compound A | | CBP | Ir(ppy)$_3$ | 46.5 | Green | 63 |
| Comparative Example 2 | Compound A | | CBP | PtOEP | 22.1 | Red | 112 |

TABLE 2-continued
| | HTL | | | | | | |
|---|---|---|---|---|---|---|---|
| | First HTL | Second HTL | Host | Dopant | Efficiency (cd/A) | Emission color | LT$_{97}$ (hr) |
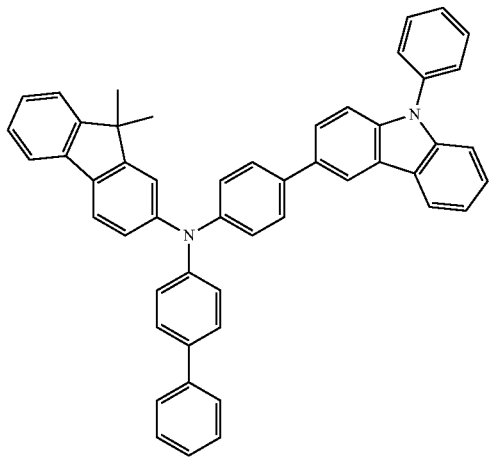
1-8
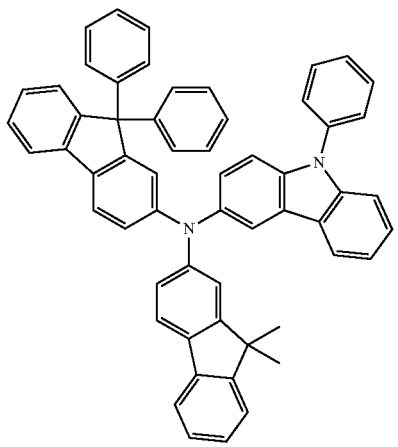
1-17
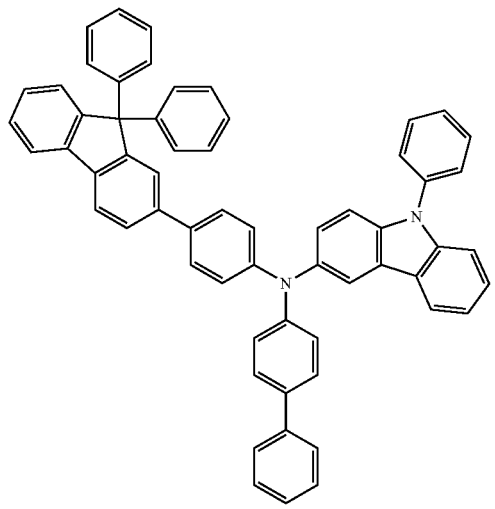
1-19

TABLE 2-continued
| | HTL | | | | | | |
|---|---|---|---|---|---|---|---|
| | First HTL | Second HTL | Host | Dopant | Efficiency (cd/A) | Emission color | $LT_{97}$ (hr) |
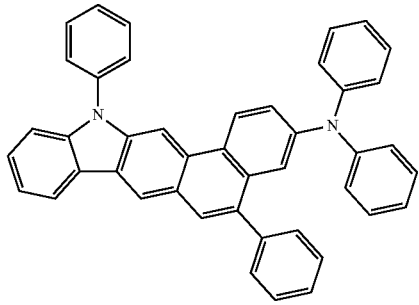
2-1
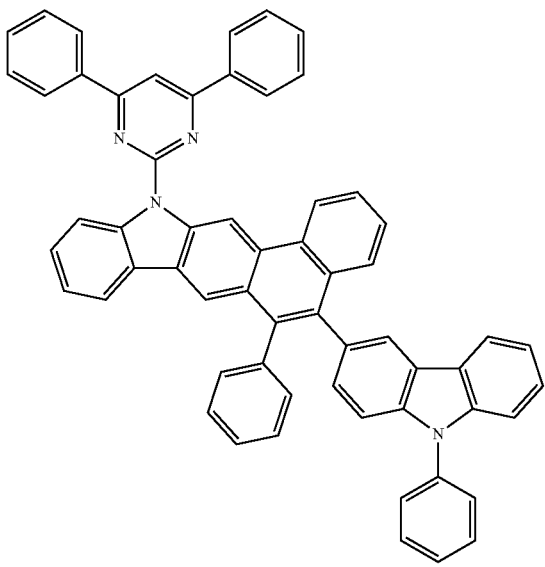
2-5
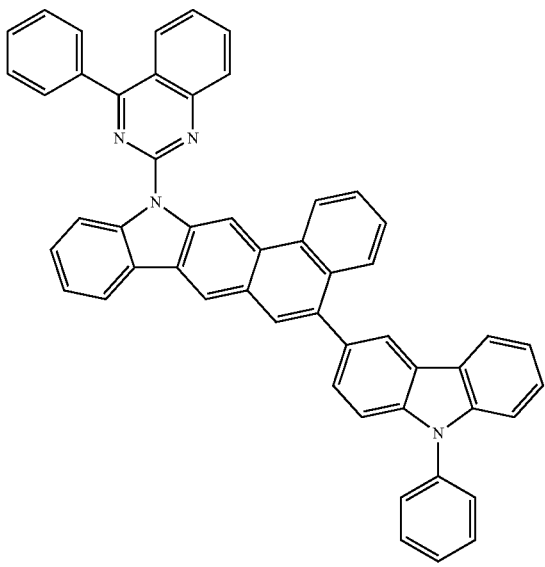
2-7

TABLE 2-continued
| First HTL | Second HTL | Host | Dopant | Efficiency (cd/A) | Emission color | LT$_{97}$ (hr) |
|---|---|---|---|---|---|---|
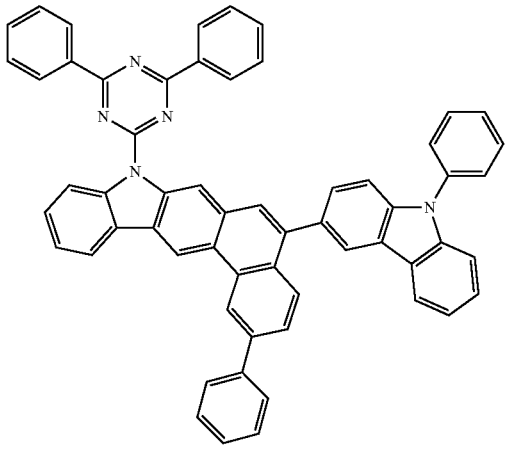
2-23
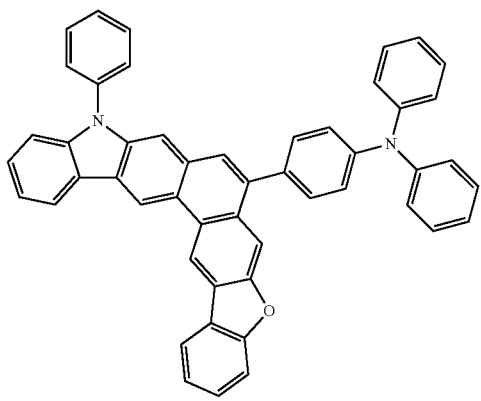
2-27
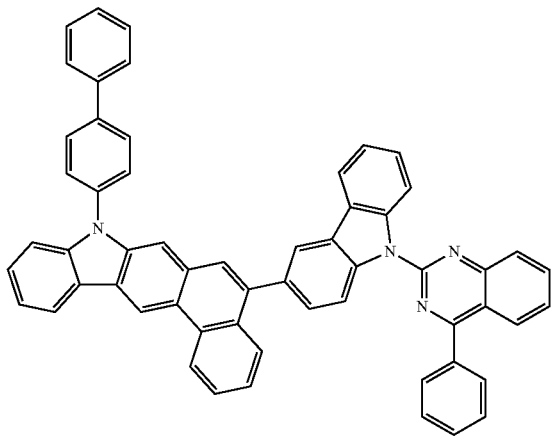
2-30

Referring to Tables 1 and 2, the organic light-emitting devices of Examples 1 to 6 were found to have lower driving voltages, higher luminances, higher efficiencies, higher color purities, and longer lifetimes than those of the organic light-emitting device of Comparative Example 2. The organic light-emitting devices of Examples 6 to 9 were found to have lower driving voltages, higher luminances, higher efficiencies, higher color purities, and longer lifetimes than those of the organic light-emitting device of Comparative Example 1.

As described above, according to the one or more of the above embodiments of the present invention, an organic light-emitting device (including a first compound of Formula 1 and a second compound of Formula 100) has a low driving voltage, high luminance, high efficiency, and long lifetime.

It should be understood that the example embodiments described herein should be considered in a descriptive sense only and not for purposes of limitation. Descriptions of features or aspects within each embodiment should typically be considered as available for other similar features or aspects in other embodiments. It will be understood by those of ordinary skill in the art that various changes in form and details may be made therein without departing from the spirit and scope of the present disclosure as defined by the following claims and equivalents thereof.

What is claimed is:

1. An organic light-emitting device comprising:
a substrate;
a first electrode on the substrate;
a second electrode facing the first electrode;
an emission layer between the first electrode and the second electrode;
a hole migration transfer region between the first electrode and the emission layer; and
an electron migration region between the emission layer and the second electrode,
wherein the hole migration region comprises a first compound represented by Formula 1 and a second compound represented by Formula 100 below, optionally the emission layer comprises the second compound, and the second compound in the hole migration region and the second compound in the emission layer are the same or different from each other:

Formula 1

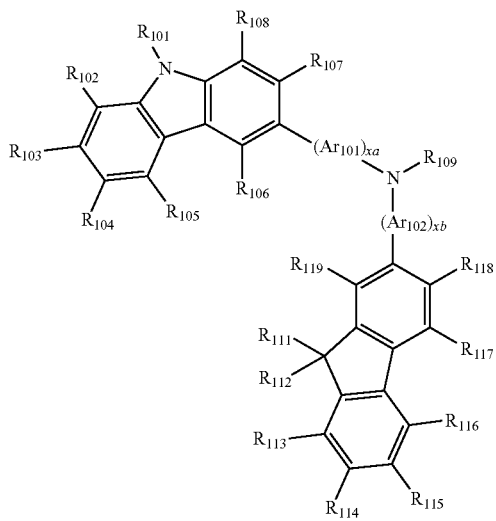

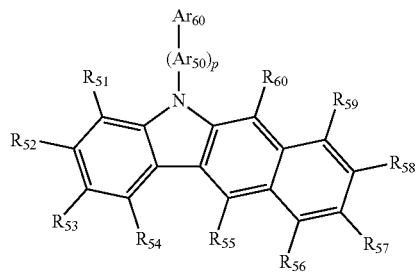

Formula 100 wherein, in Formula 1,
$Ar_{101}$ and $Ar_{102}$ are, each independently, a substituted or unsubstituted $C_3$-$C_{10}$ cycloalkylene group, a substituted or unsubstituted $C_2$-$C_{10}$ heterocyclooalkylene group, a substituted or unsubstituted $C_3$-$C_{10}$ cycloalkenylene group, a substituted or unsubstituted $C_2$-$C_{10}$ heterocyclooalkenylene group, a substituted or unsubstituted $C_6$-$C_{60}$ arylene group, or a substituted or unsubstituted $C_2$-$C_{60}$ heteroarylene group;
xa and xb are, each independently, an integer from 0 to 5;
$R_{101}$ and $R_{109}$ are, each independently, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, or a substituted or unsubstituted $C_2$-$C_{60}$ heteroaryl group; and
$R_{102}$ to $R_{108}$, and $R_{111}$ to $R_{119}$ are, each independently, a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —N($Q_1$)($Q_2$), or —Si($Q_3$)($Q_4$)($Q_5$) (where $Q_1$ to $Q_5$ are, each independently, a $C_1$-$C_{60}$ alkyl group, a $C_1$-$C_{60}$ alkoxy group, a $C_6$-$C_{60}$ aryl group, or a $C_2$-$C_{60}$ heteroaryl group), and
in Formula 100,
i) $R_{56}$ and $R_{57}$ are linked to each other to form a substituted or unsubstituted $C_3$-$C_{60}$ cyclic moiety, or a substituted or unsubstituted $C_2$-$C_{60}$ heterocyclic moiety, and $R_{51}$ to $R_{55}$ and $R_{58}$ to $R_{60}$ are, each independently, a substituent represented by —($Ar_{51}$)$_q$—($Ar_{61}$); or
ii) $R_{58}$ and $R_{59}$ are linked to each other to form a substituted or unsubstituted $C_3$-$C_{60}$ cyclic moiety, or a substituted or unsubstituted $C_2$-$C_{60}$ heterocyclic moiety, and $R_{51}$ to $R_{57}$ and $R_{60}$ are, each independently, a substituent represented by —($Ar_{51}$)$_q$—($Ar_{61}$);
$Ar_{50}$ and $Ar_{51}$ are, each independently, a substituted or unsubstituted $C_3$-$C_{10}$ cycloalkylene group, a substituted or unsubstituted $C_2$-$C_{10}$ heterocyclooalkylene group, a substituted or unsubstituted $C_3$-$C_{10}$ cycloalkenylene group, a $C_2$-$C_{10}$ heterocyclooalkenylene group, a substituted or unsubstituted $C_6$-$C_{60}$ arylene group, or a substituted or unsubstituted $C_2$-$C_{60}$ heteroarylene group;

$Ar_{60}$ and $Ar_{61}$ are, each independently, selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, a substituted or unsubstituted $C_2$-$C_{60}$ heteroaryl group, —N($Q_{21}$)($Q_{22}$), and —Si($Q_{23}$)($Q_{24}$)($Q_{25}$) (where $Q_{21}$ and $Q_{22}$ are, each independently, selected from among a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, and a substituted or unsubstituted $C_2$-$C_{60}$ heteroaryl group; and $Q_{23}$ to $Q_{25}$ are, each independently, selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof a phosphoric acid group or a salt thereof, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, and a substituted or unsubstituted $C_2$-$C_{60}$ heteroaryl group); and p and q are, each independently, an integer from 0 to 5, wherein when p is 0, $Ar_{60}$ is directly linked to nitrogen in Formula 100.

2. The organic light-emitting device of claim 1, wherein $Ar_{101}$ and $Ar_{102}$ in Formula 1 are, each independently, represented by one of Formulae 3-1 to 3-24:

Formula 3-1
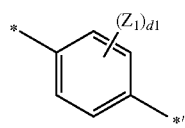

Formula 3-2
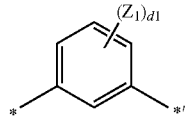

Formula 3-3
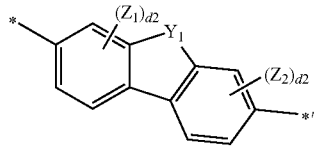

Formula 3-4
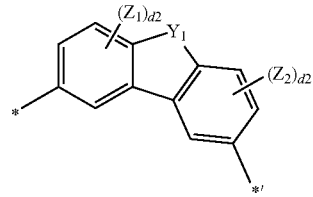

Formula 3-5
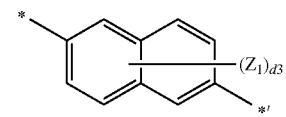

Formula 3-6
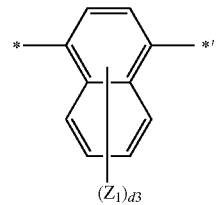

Formula 3-7
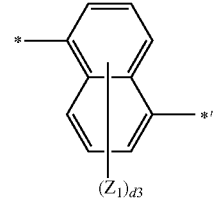

Formula 3-8
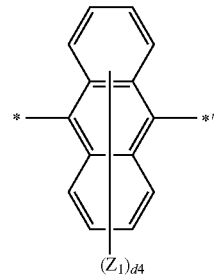

Formula 3-9
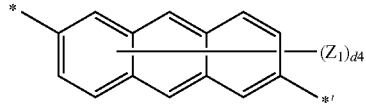

Formula 3-10
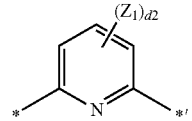

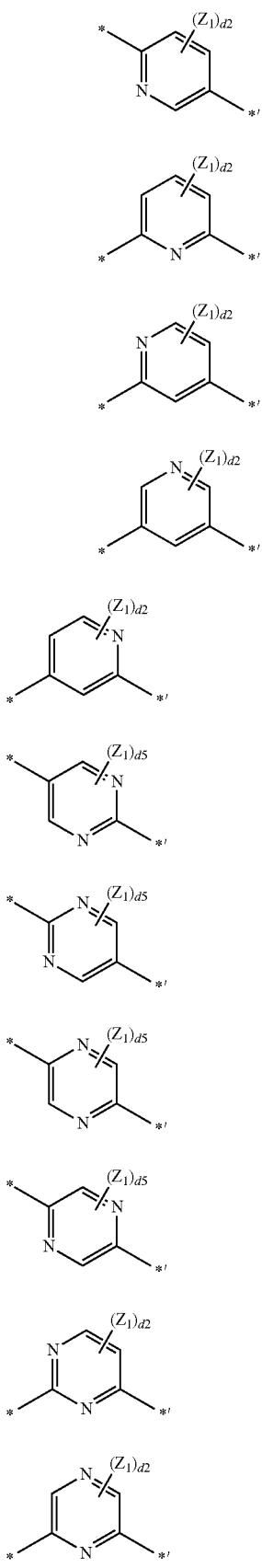

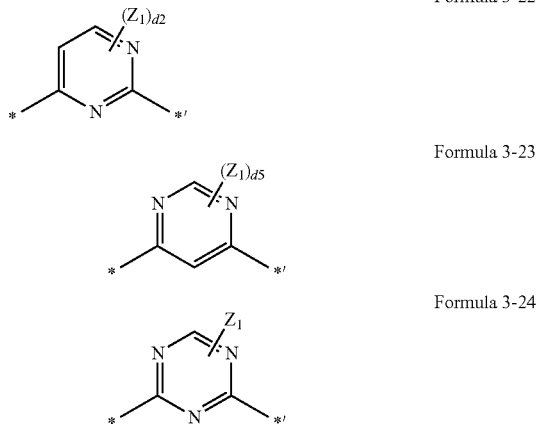

wherein, in Formulae 3-1 to 3-24, $Y_1$ is O, S, $C(R_{21})(R_{22})$, or $N(R_{23})$;

$Z_1$, $Z_2$, and $R_{21}$ to $R_{23}$ are, each independently, selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof; and a phosphoric acid group or a salt thereof, a $C_6$-$C_{20}$ aryl group and a $C_2$-$C_{20}$ heteroaryl group;

a $C_6$-$C_{20}$ aryl group and a $C_2$-$C_{20}$ heteroaryl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and —$N(Q_{11})(Q_{12})$, and —$Si(Q_{13})(Q_{14})(Q_{15})$ (where $Q_{11}$ to $Q_{15}$ are, each independently, a $C_1$-$C_{20}$ alkyl group, a $C_1$-$C_{20}$ alkoxy group, a $C_6$-$C_{20}$ aryl group, or a $C_2$-$C_{20}$ heteroaryl group);

d1 is an integer from 1 to 4;
d2 is an integer from 1 to 3;
d3 is an integer from 1 to 6;
d4 is an integer from 1 to 8; and
d5 is 1 or 2.

3. The organic light-emitting device of claim 1, wherein $Ar_{101}$ and $Ar_{102}$ in Formula 1 are, each independently, represented by one of Formulae 4-1 to 4-7:

Formula 4-1

Formula 4-2

Formula 4-3

Formula 4-4

Formula 4-5

Formula 4-6

Formula 4-7

4. The organic light-emitting device of claim 1, wherein, in Formula 1, i) xa=0 and xb=0; ii) xa=1 and xb=0; iii) xa=2 and xb=0; iv) xa=0 and xb=1; v) xa=0 and xb=2; or vi) xa=1 and xb=1.

5. The organic light-emitting device of claim 1, wherein, Formula 1, $R_{101}$ and $R_{109}$ are, each independently, represented by one of Formulae 5-1 to 5-22:

Formula 5-1

Formula 5-2

Formula 5-3

Formula 5-4

Formula 5-5

Formula 5-6

Formula 5-7

Formula 5-8

127
-continued

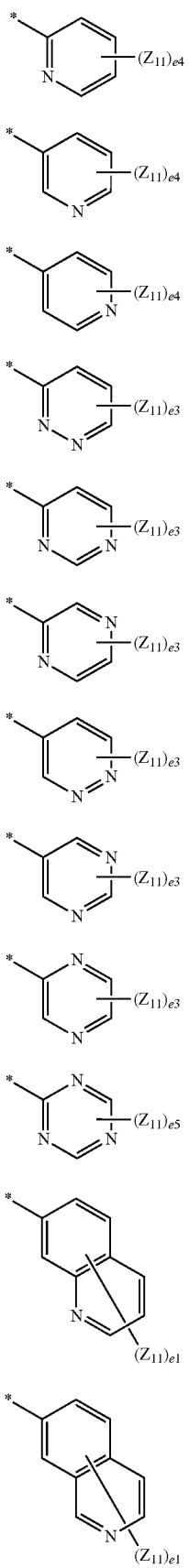

128
-continued

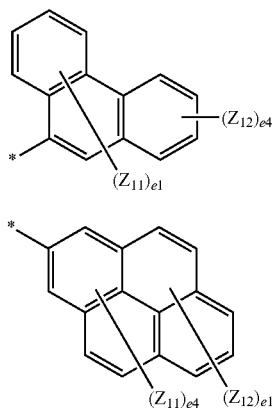

Formula 5-9

Formula 5-10

Formula 5-11

Formula 5-12

Formula 5-13

Formula 5-14

Formula 5-15

Formula 5-16

Formula 5-17

Formula 5-18

Formula 5-19

Formula 5-20

Formula 5-21

Formula 5-22 wherein, in Formulae 5-1 to 5-22,
$Y_2$ is O, S, $C(R_{25})(R_{26})$, or $N(R_{27})$;
$Z_{11}$ to $Z_{14}$, and $R_{25}$ to $R_{27}$ are, each independently, selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a $C_6$-$C_{20}$ aryl group and a $C_2$-$C_{20}$ heteroaryl group;

a $C_6$-$C_{20}$ aryl group and a $C_2$-$C_{20}$ heteroaryl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ an alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and —$N(Q_{11})(Q_{12})$, and —$Si(Q_{13})(Q_{14})(Q_{15})$ (where $Q_{11}$ to $Q_{15}$ are, each independently, a $C_1$-$C_{20}$ alkyl group, a $C_1$-$C_{20}$ alkoxy group, a $C_6$-$C_{20}$ aryl group, or a $C_2$-$C_{20}$ heteroaryl group;

e1 is an integer from 1 to 5;
e2 is an integer from 1 to 7;
e3 is an integer from 1 to 3;
e4 is an integer from 1 to 4; and
e5 is 1 or 2.

6. The organic light-emitting device of claim 1, wherein $R_{101}$ in Formula 1 is represented by one of Formulae 6-1 to 6-8, and $R_{109}$ in Formula 1 is represented by one of Formulae 6-1 to 6-11:

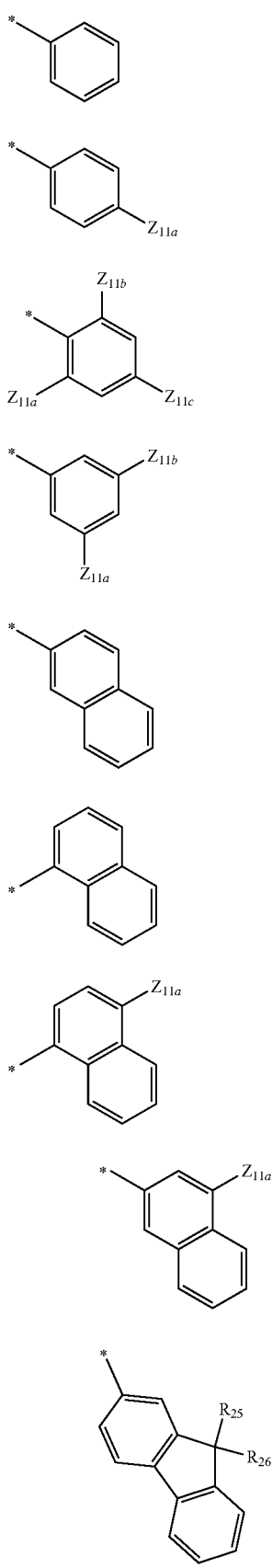

Formula 6-1

Formula 6-2

Formula 6-3

Formula 6-4

Formula 6-5

Formula 6-6

Formula 6-7

Formula 6-8

Formula 6-9

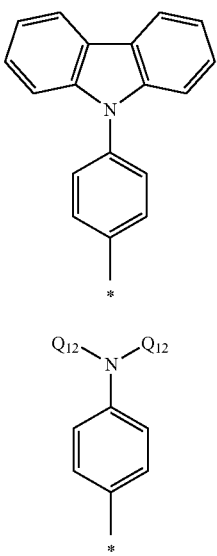

Formula 6-10

Formula 6-11 wherein, in Formulae 6-1 to 6-11, $Z_{11a}$ to $Z_{11c}$, and $R_{25}$ and $R_{26}$ are, each independently, selected from among a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and $Q_{11}$ and $Q_{12}$ are, each independently, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group.

7. The organic light-emitting device of claim 1, wherein $R_{111}$ and $R_{112}$ in Formula 1 are, each independently, selected from among a $C_1$-$C_{20}$ alkyl group;

a $C_1$-$C_{20}$ alkyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group.

8. The organic light-emitting device of claim 1, wherein the second compound is a compound represented by Formula 100A or 100B below:

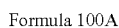

Formula 100A

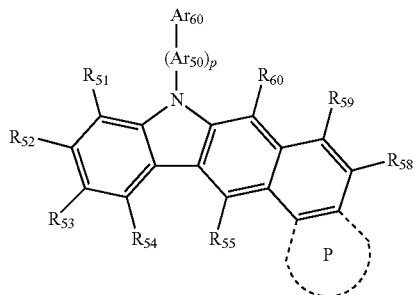

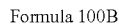

Formula 100B

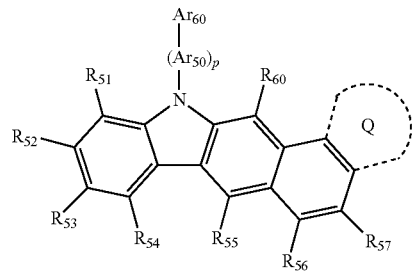

wherein, in Formulae 100A and 100B,

P ring and Q ring are, each independently, selected from among i) benzene, naphthalene, fluorene, carbazole, dibenzofuran, and dibenzothiophene; and ii) benzene, naphthalene, fluorene, carbazole, dibenzofuran, and dibenzothiophene, substituted with at least one selected from among a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a C1-C20 alkyl group, and a C1-C20 alkoxy group, a C1-C20 alkyl group, and a C1-C60 alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a C1-C20 alkyl group, a C1-C20 alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —N($Q_{11}$)($Q_{12}$) (where $Q_{11}$ and $Q_{12}$ are, each independently, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group).

9. The organic light-emitting device of claim 1, wherein the second compound is a compound represented by one of Formulae 100A-1 to 100A-8 and 100B-1 to 100B-9:

Formula 100A-1
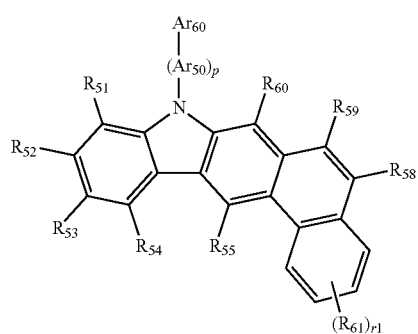
Formula 100A-2
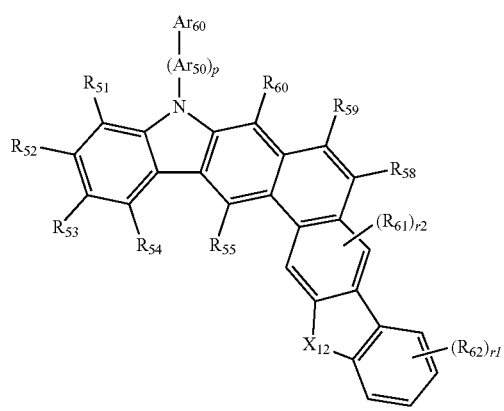
Formula 100A-3
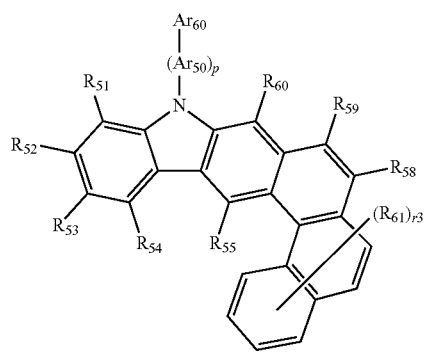
Formula 100A-4
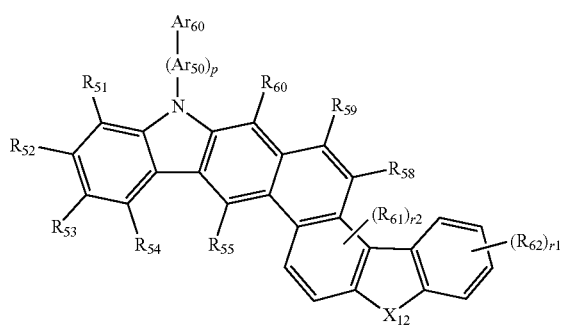
Formula 100A-5
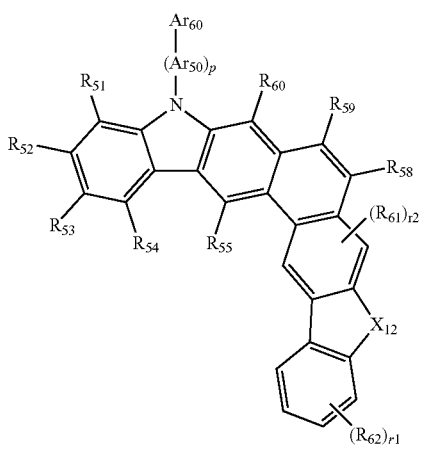
Formula 100A-6
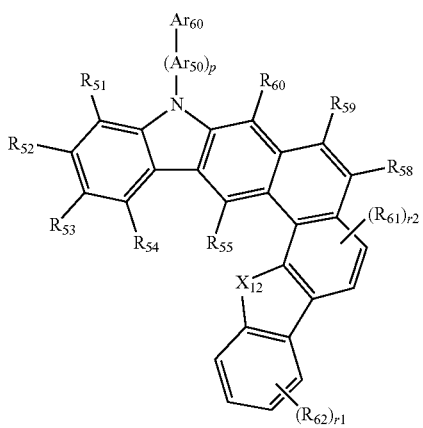
Formula 100A-7
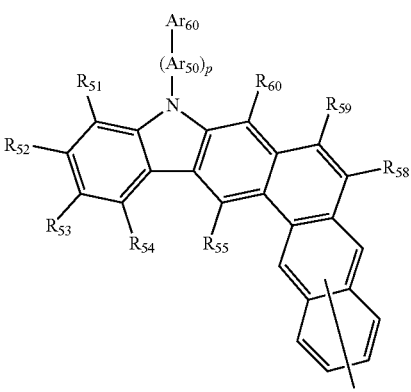
Formula 100A-8
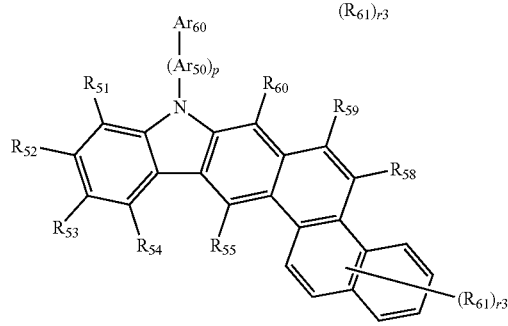

Formula 100B-1

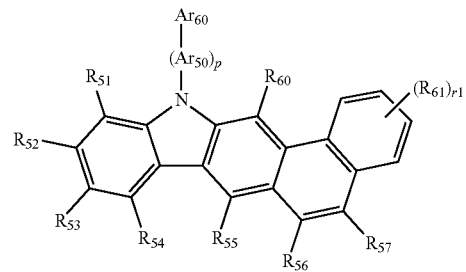

Formula 100B-2

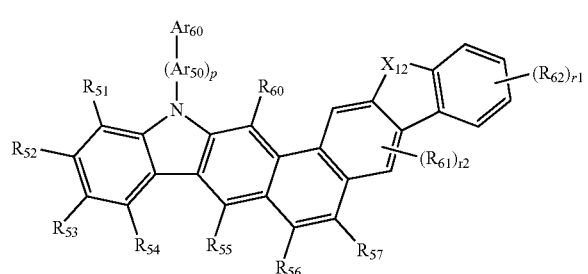

Formula 100B-3

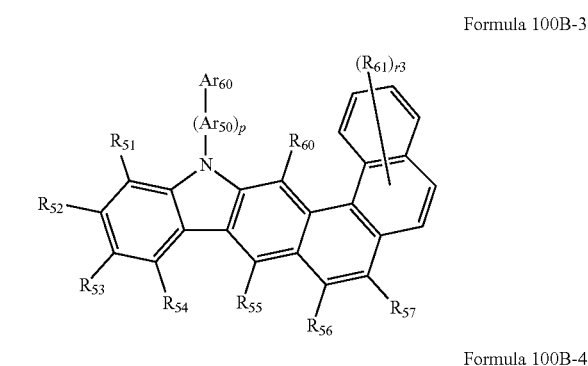

Formula 100B-4

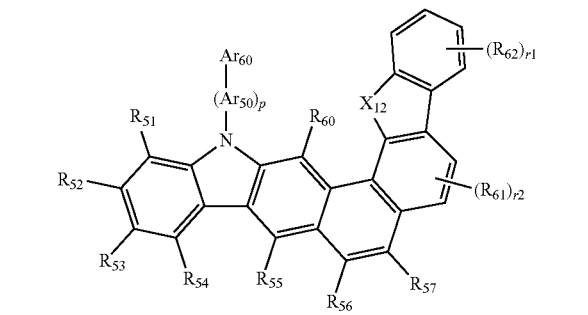

Formula 100B-5

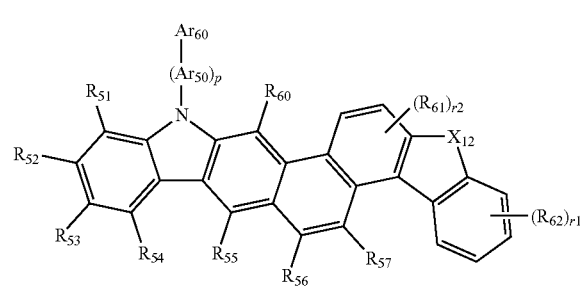

Formula 100B-6

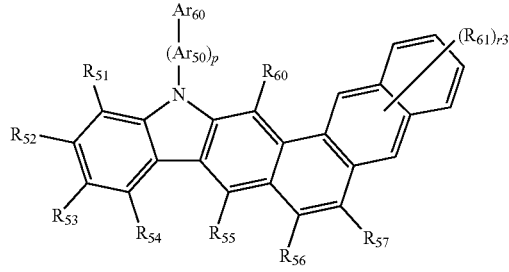

Formula 100B-7

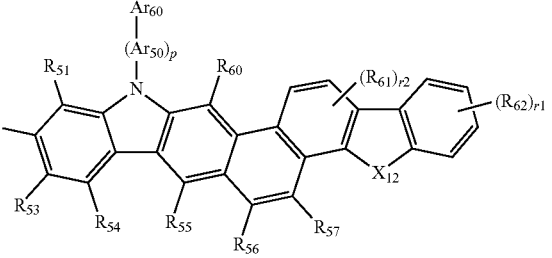

Formula 100B-8

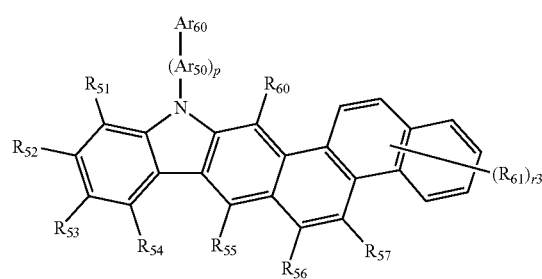

Formula 100B-9

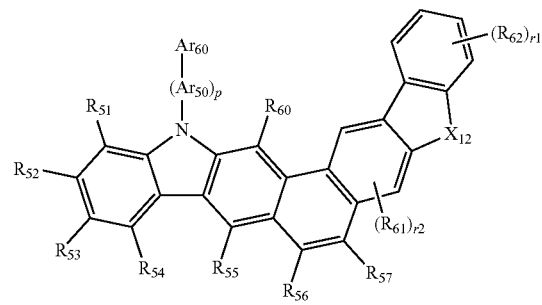

wherein, in Formulae 100A-1 to 100A-8 and 100B-1 to 100B-9, $X_{12}$ is O, S, $C(R_{71})(R_{72})$, or $N(R_{73})$;

$R_{61}$, $R_{62}$, and $R_{71}$ to $R_{73}$ are, each independently, selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, substituted with at least one of a deuterium atom, a halogen atom, a hydroxyl group, a cyano group, a nitro group, an amino group, an amidino group, a hydrazine, a hydrazone, a carboxyl group or a salt thereof; sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and —$N(Q_{11})(Q_{12})$, and —$Si(Q_{11})(Q_{12})(Q_{13})$ (where $Q_{11}$ and $Q_{12}$ are, each independently, a $C_6$-$C_{60}$ aryl group or a $C_2$-$C_{60}$ heteroaryl group, and $Q_{13}$ to $Q_{15}$ are, each independently, a $C_1$-$C_{60}$ alkyl group, a $C_1$-$C_{60}$ alkoxy group, a $C_6$-$C_{60}$ aryl group, or a $C_2$-$C_{60}$ heteroaryl group);

r1 is an integer from 1 to 4;
r2 is 1 or 2; and
r3 is an integer from 1 to 6.

10. The organic light-emitting device of claim 1, wherein $Ar_{50}$ and $Ar_{51}$ in Formula 100 are, each independently, selected from among,
  i) a phenylene group, a naphthylene group, a fluorenylene group, a pyridinylene group, a pyrazinylene group, a pyrimidinylene group, a pyridazinylene group, a quinolinylene group, a carbazolylene group, a triazinylene group, a dibenzofuranylene group, and a dibenzothiophenylene group, and
  ii) a phenylene group, a naphthylene group, a fluorenylene group, a pyridinylene group, a pyrazinylene group, a pyrimidinylene group, a pyridazinylene group, a quinolinylene group, a carbazolylene group, a triazinylene group, a dibenzofuranylene group, and a dibenzothiophenylene group, substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group.

11. The organic light-emitting device of claim 1, wherein $Ar_{60}$ and $Ar_{61}$ in Formula 100 are, each independently, selected from among groups represented by Formulae 103-1 to 103-16 below:

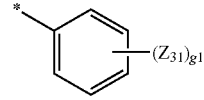

Formula 103-1

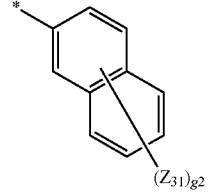

Formula 103-2

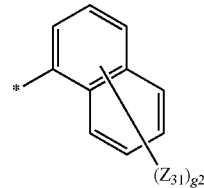

Formula 103-3

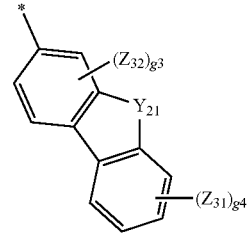

Formula 103-4

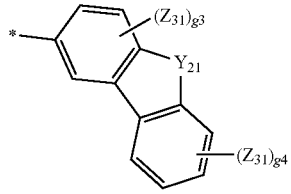

Formula 103-5

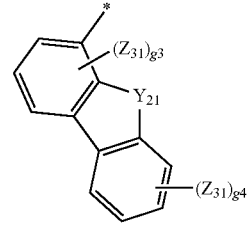

Formula 103-6

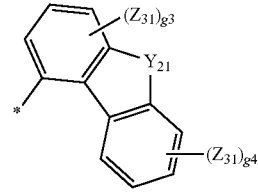

Formula 103-7

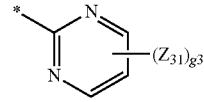

Formula 103-8

-continued

Formula 103-9
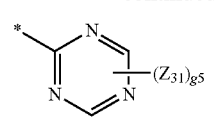

Formula 103-10
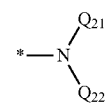

Formula 103-11
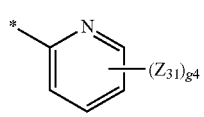

Formula 103-12
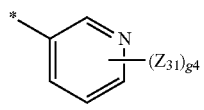

Formula 103-13
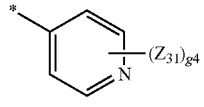

Formula 103-14
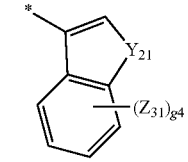

Formula 103-15
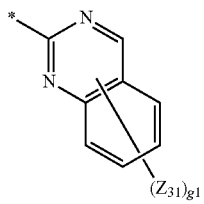

Formula 103-16
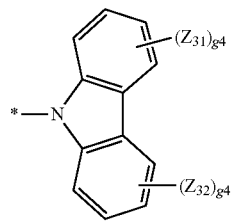

wherein, in Formulae 103-1 to 103-16, $Y_{21}$ is O, S, $C(Z_{41})(Z_{42})$, or $N(Z_{43})$;

$Z_{31}$, $Z_{32}$, and $Z_{41}$ to $Z_{43}$ are, each independently, selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group;

$Q_{21}$ and $Q_{22}$ are, each independently, selected from among a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group;

g1 is an integer from 1 to 5;

g2 is an integer from 1 to 7;

g3 is an integer from 1 to 3;

g4 is an integer from 1 to 4; and g5 is 1 or 2.

12. The organic light-emitting device of claim 1, wherein the first compound is one of Compounds 1-1 to 1-19 below:

1-1
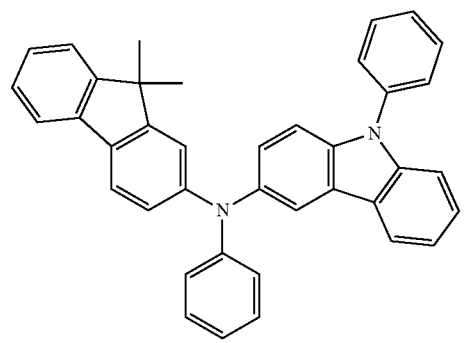

1-2
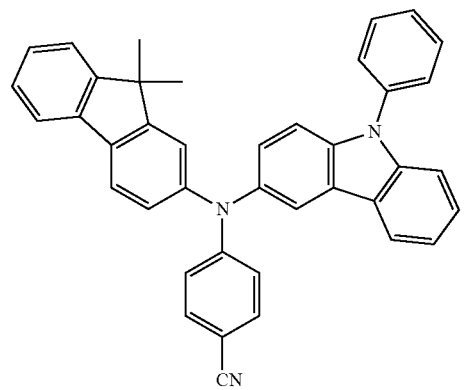

1-3
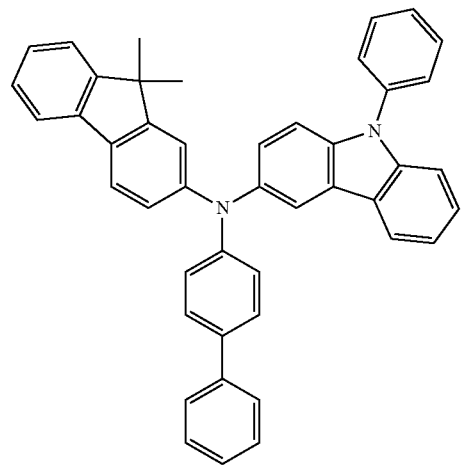

1-4
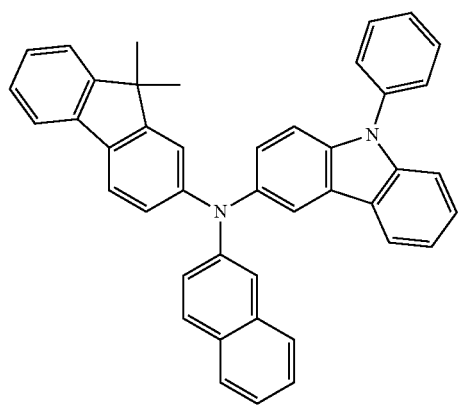
1-5
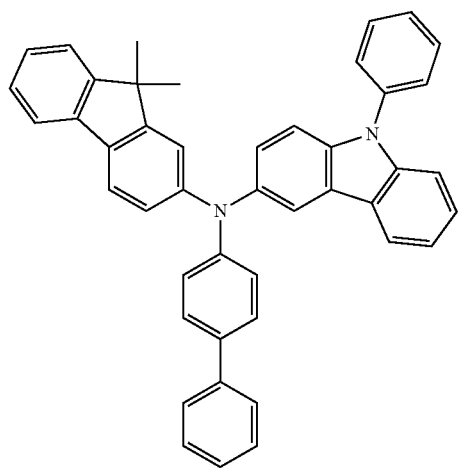
1-6
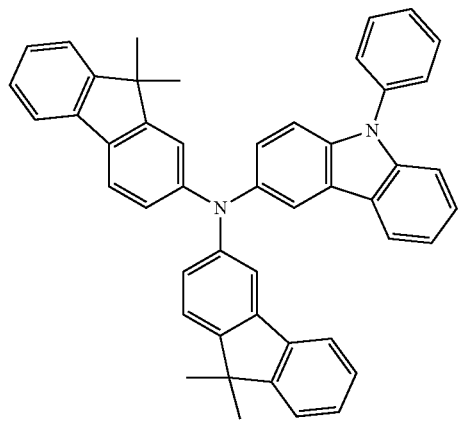
1-7
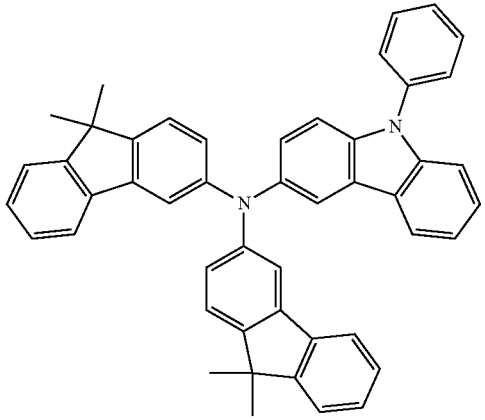
1-8
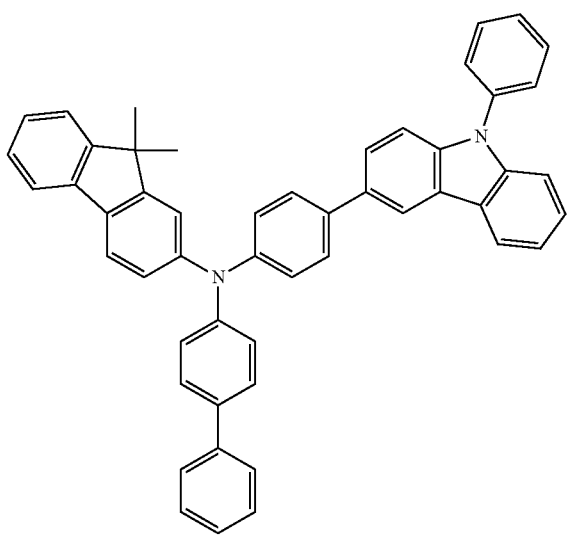
1-9
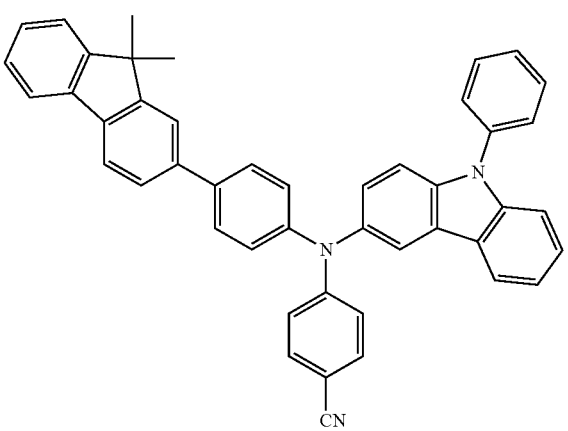

1-10
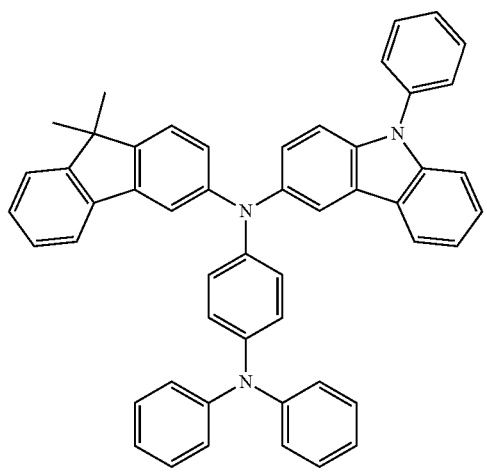
1-13
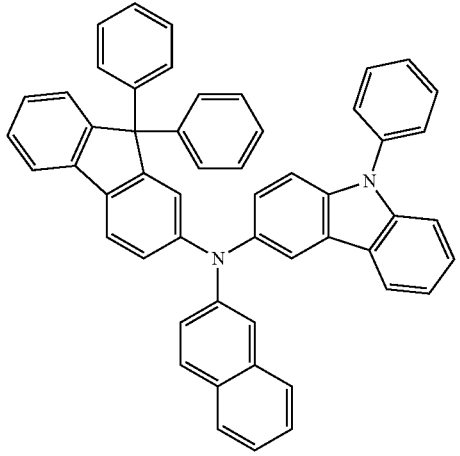
1-11
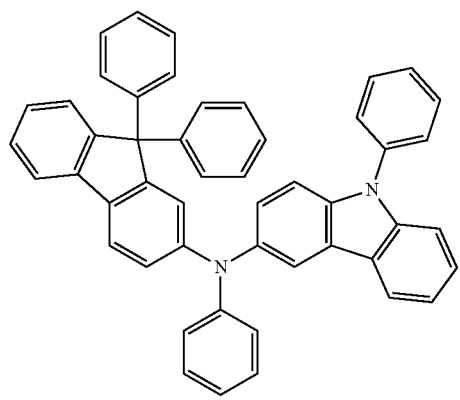
1-14
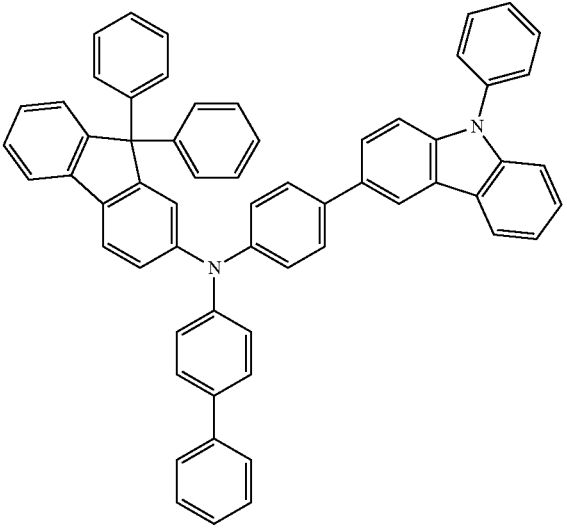
1-12
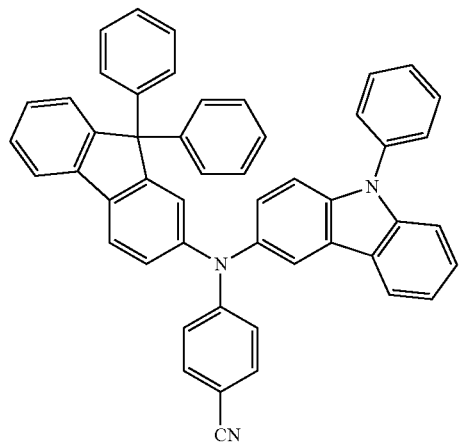
1-15
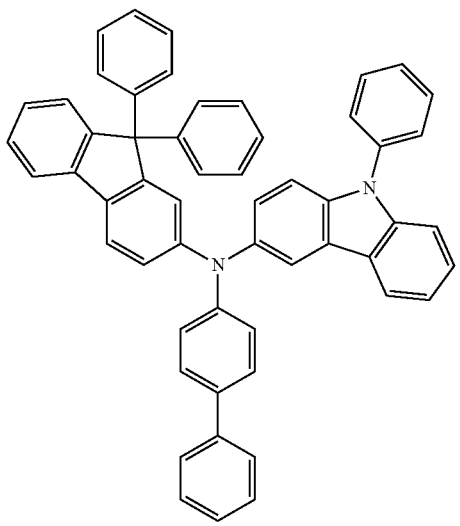

1-16
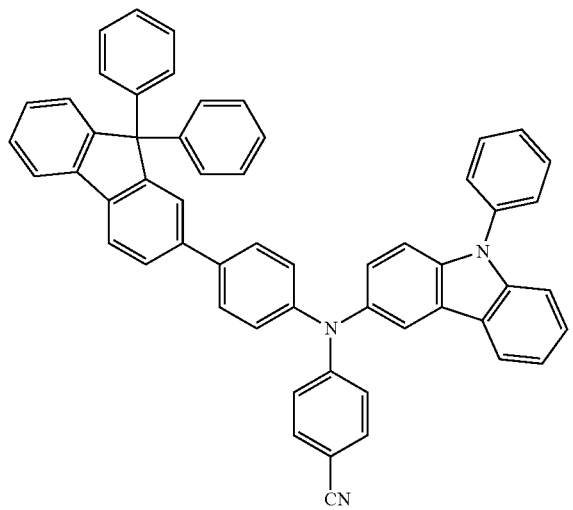
1-17
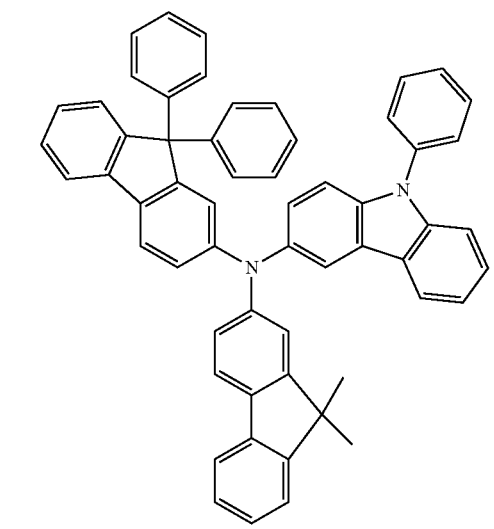
1-18
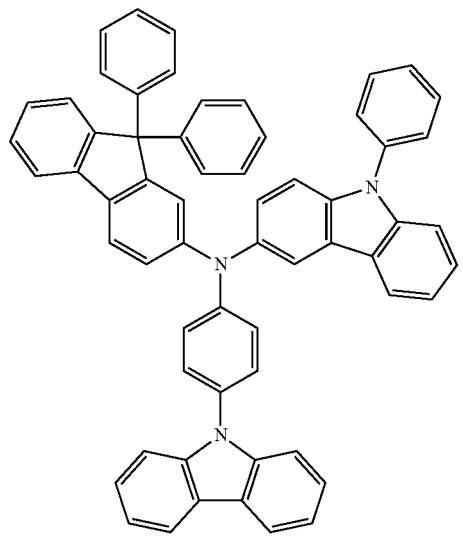
1-19
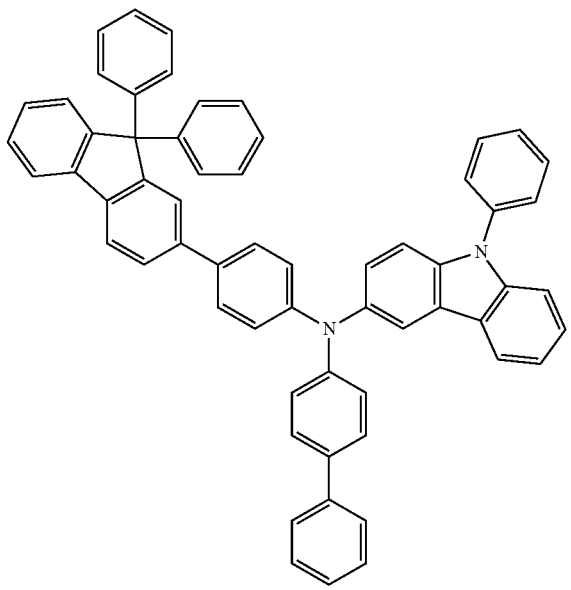
13. The organic light-emitting device of claim 1, wherein the second compound is one of Compounds 2-1 to 2-30:
2-1
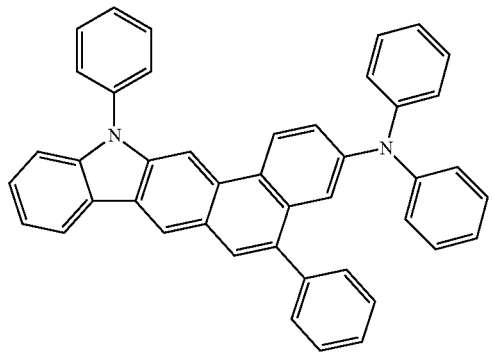
2-2
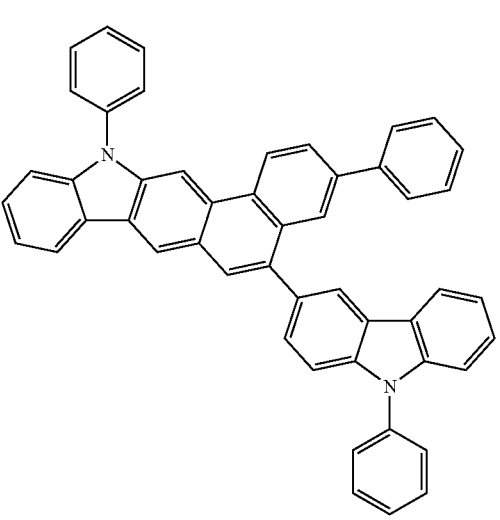

2-3
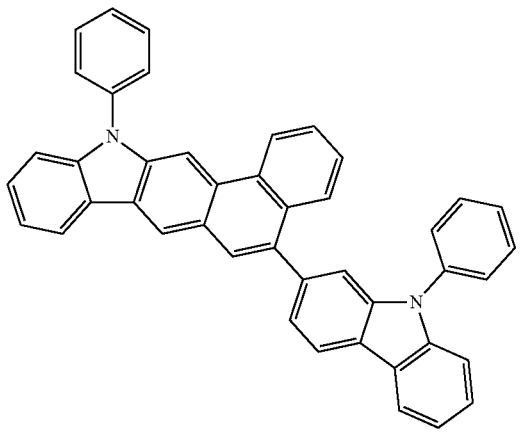
2-4
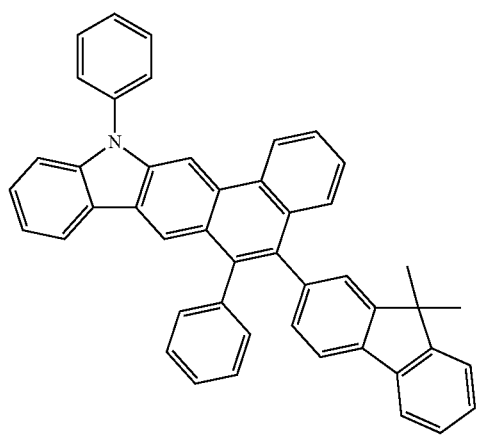
2-5
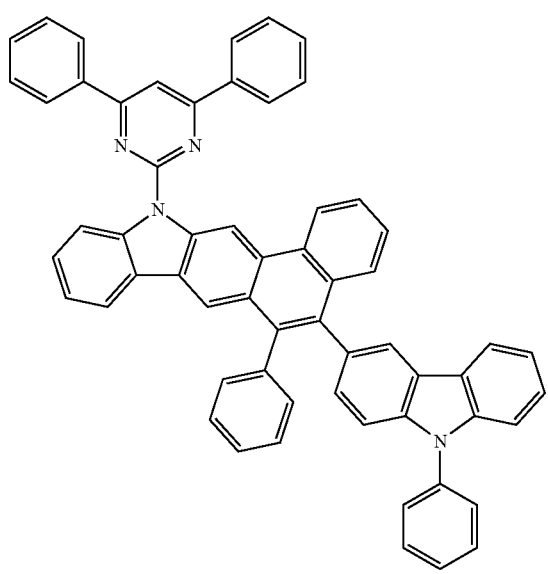
2-6
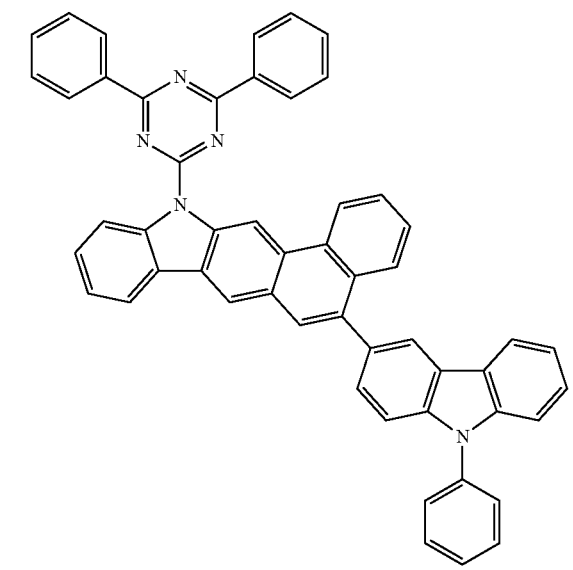
2-7
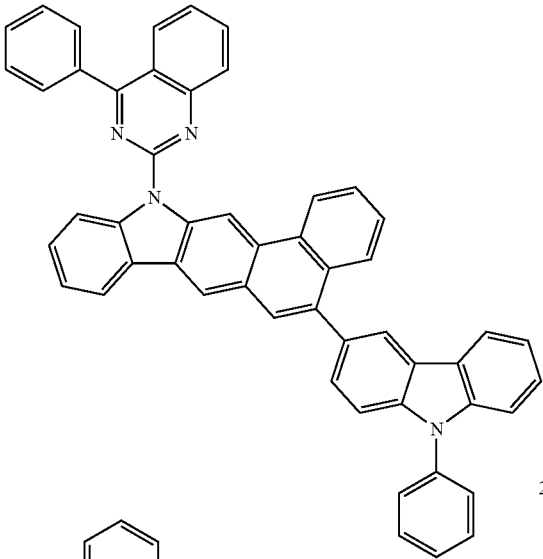
2-8
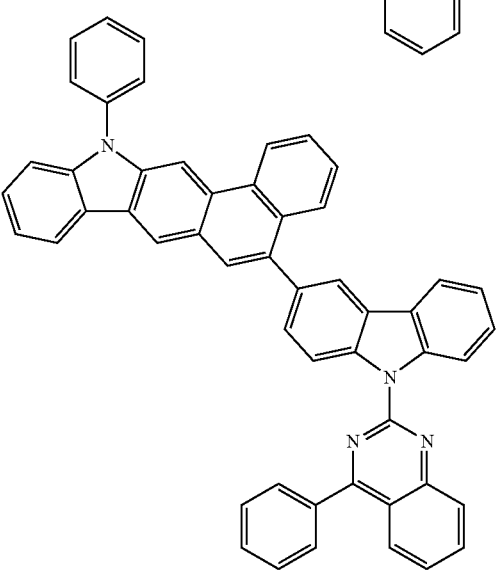

-continued
2-9
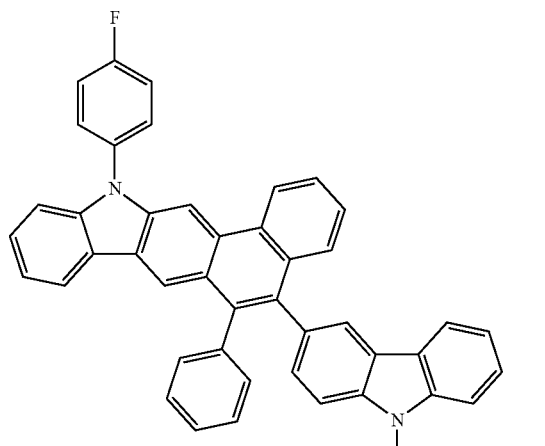
2-10
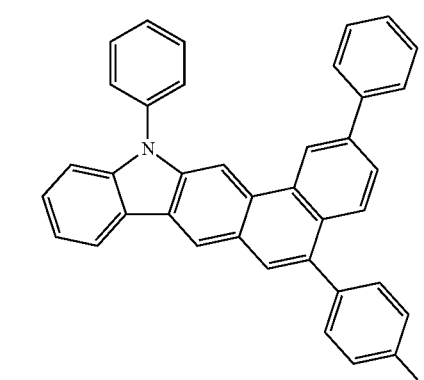
2-11
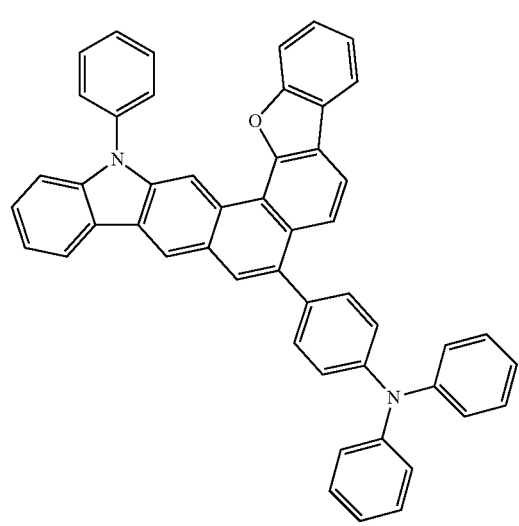
-continued
2-12
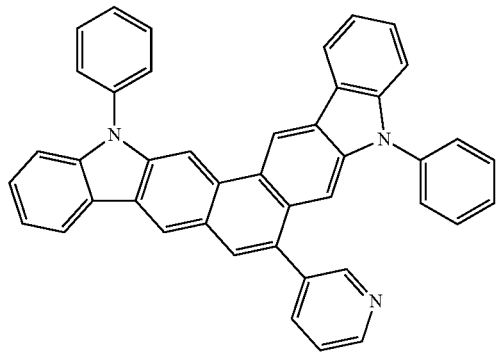
2-13
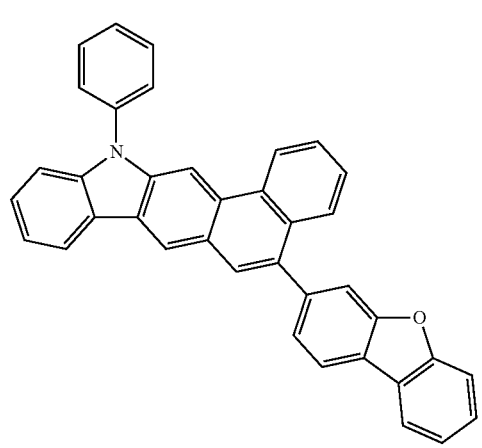
2-14
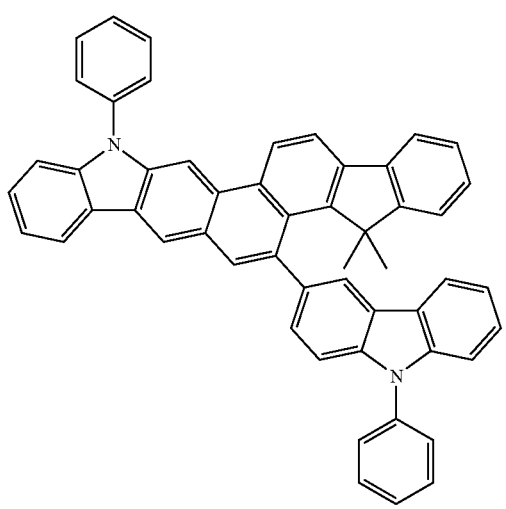

-continued
2-15
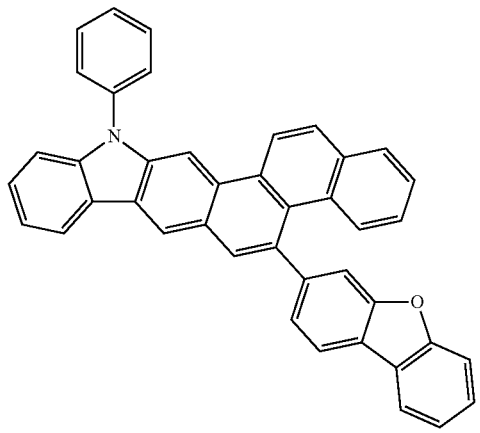
2-16
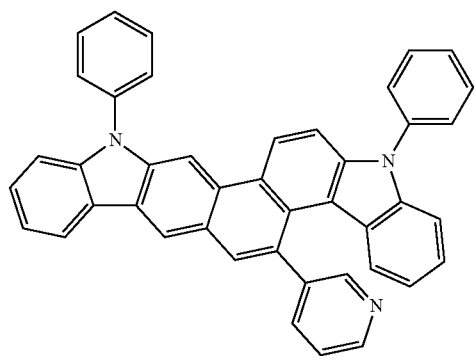
2-17
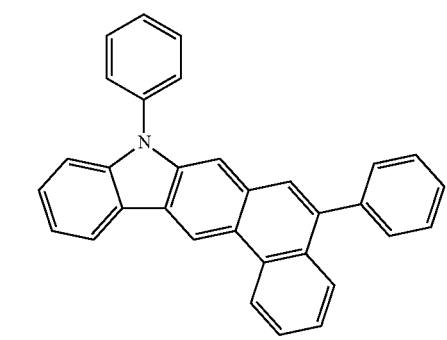
2-18
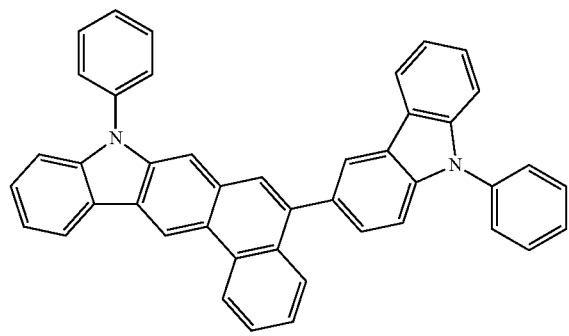
-continued
2-19
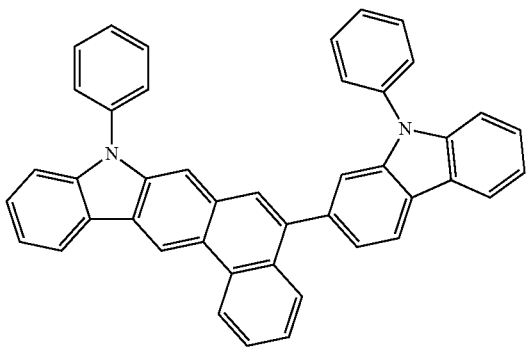
2-20
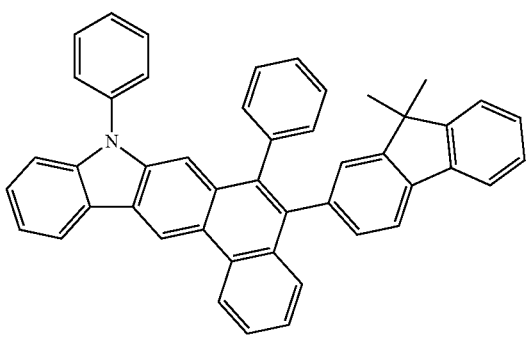
2-21
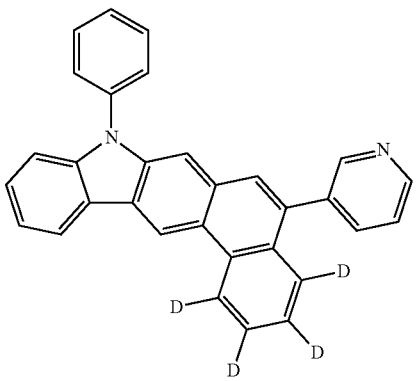
2-22
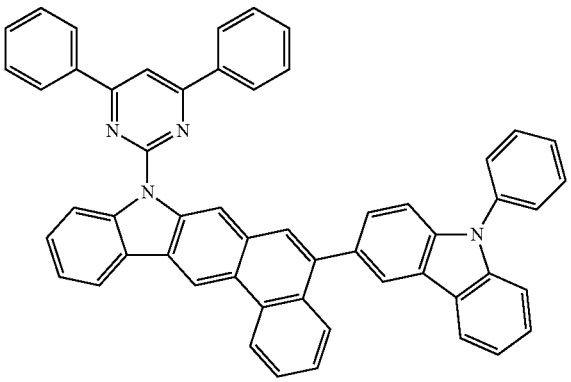

2-23

2-24

2-25

2-26

2-27

2-28

2-29

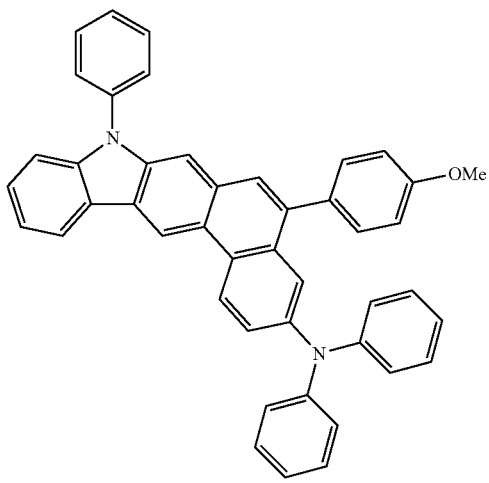

2-30

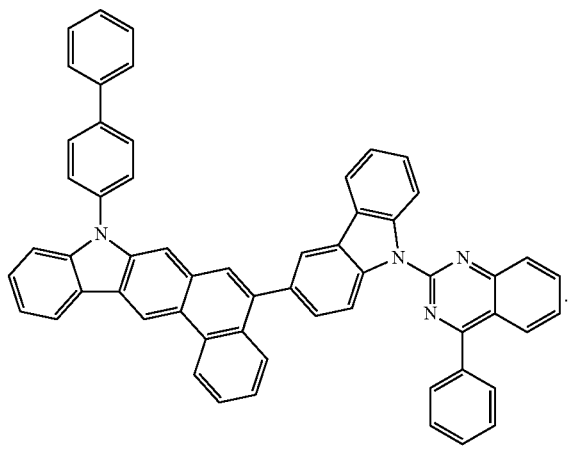

14. The organic light-emitting device of claim 1, wherein the hole migration region comprises i) a first hole transport layer, and ii) a second hole transport layer between the first hole transport layer and the emission layer, the first compound is in the first hole transport layer, and the second compound is in the second hole transport layer.

15. The organic light-emitting device of claim 14, wherein the second compound in the hole migration region is a compound represented by Formula 100A-HLT or 100B-HLT below:

Formula 100A-HLT

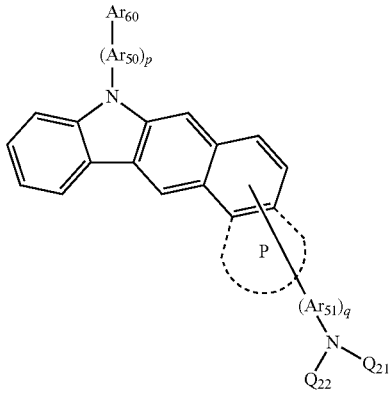

Formula 100B-HLT

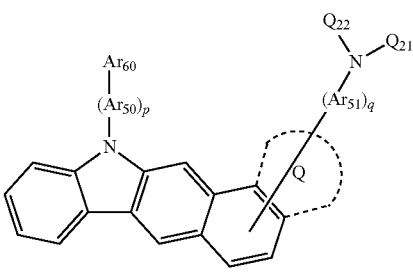

wherein, in Formulae 100A-HLT and 100B-HLT,

P ring and Q ring are, each independently, selected from among i) benzene, naphthalene, fluorene, carbazole, dibenzofuran, and dibenzothiophene; and ii) benzene, naphthalene, fluorene, carbazole, dibenzofuran, and dibenzothiophene, substituted with at least one selected from among, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group, and a $C_1$-$C_{60}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —$N(Q_{11})(Q_{12})$ (where $Q_{11}$ and $Q_{12}$ are, each independently, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group), $Ar_{50}$ and $Ar_{51}$ are, each independently, selected from among i) a phenylene group, a naphthylene group, a fluorenylene group, a pyridinylene group, a pyrazinylene group, a pyrimidinylene group, a pyridazinylene group, a quinolinylene group, a carbazolylene group, a triazinylene group, a dibenzofuranylene group, and a dibenzothiophenylene group, and ii) a phenylene group, a naphthylene group, a fluorenylene group, a pyridinylene group, a pyrazinylene group, a pyrimidinylene group, a pyridazinylene group, a quinolinylene group, a carbazolylene group, a triazinylene group, a dibenzofuranylene group, and a dibenzothiophenylene group, substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group;

p and q are, each independently, 0, 1, or 2; and $Ar_{61}$, $Q_{21}$, and $Q_{22}$ are, each independently, selected from among a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group.

16. The organic light-emitting device of claim 1, wherein the second compound in the emission layer is a compound represented by Formula 100A-H1 or 100B-H1 below:

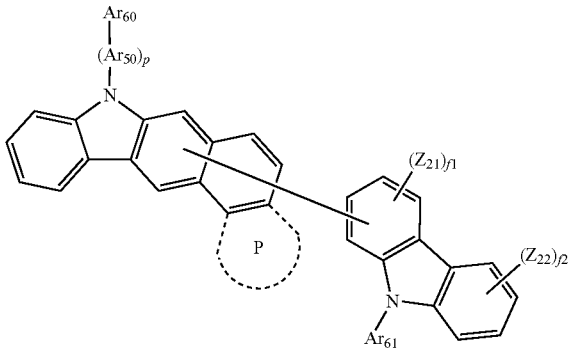

Formula 100A-H1

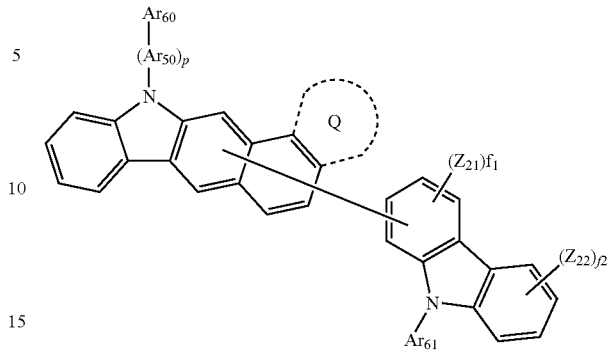

Formula 100B-H1 wherein, in Formulae 100A-H1 and 100B-H1,

P ring and Q ring are, each independently, selected from among, i) benzene, naphthalene, fluorene, carbazole, dibenzofuran and dibenzothiophene; and ii) benzene, naphthalene, fluorene, carbazole, dibenzofuran, and dibenzothiophene, substituted with at least one selected from among a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group, and a $C_1$-$C_{60}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinoinlyl group, and —$N(Q_{11})(Q_{12})$ (where $Q_{11}$ and $Q_{12}$ are, each independently, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group), $Ar_{50}$ and $Ar_{51}$ are, each independently, selected from among, i) a phenylene group, a naphthylene group, a fluorenylene group, a pyridinylene group, a pyrazinylene group, a pyrimidinylene group, a pyridazinylene group, a quinolinylene group, a carbazolylene group, a triazinylene group, a dibenzofuranylene group, and a dibenzothiophenylene group, and ii) a phenylene group, a naphthylene group, a fluorenylene group, a pyridinylene group, a pyrazinylene group, a pyrimidinylene group, a pyridazinylene group, a quinolinylene group, a carbazolylene group, a triazinylene group, a dibenzofuranylene group, and a dibenzothiophenylene group, substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group;

p and q are, each independently, 0, 1, or 2;

$Z_{21}$ to $Z_{22}$ are, each independently, selected from among a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group;

f1 and f2 are, each independently, 0, 1, or 2; and $Ar_{60}$ and $Ar_{61}$ are, each independently, selected from among groups represented by Formulae 103-1 to 103-16 below:

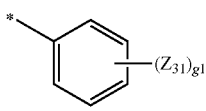

Formula 103-1

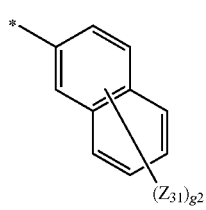

Formula 103-2

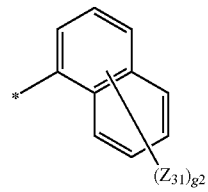

Formula 103-3

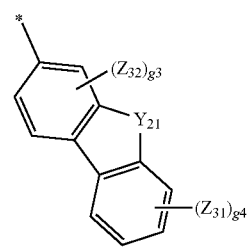

Formula 103-4

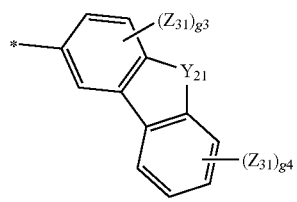

Formula 103-5

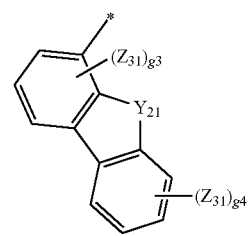

Formula 103-6

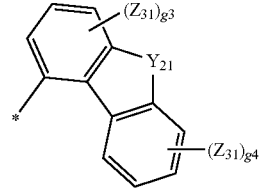

Formula 103-7

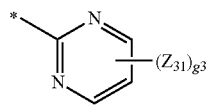

Formula 103-8

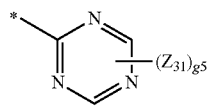

Formula 103-9

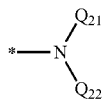

Formula 103-10

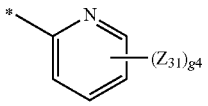

Formula 103-11

-continued

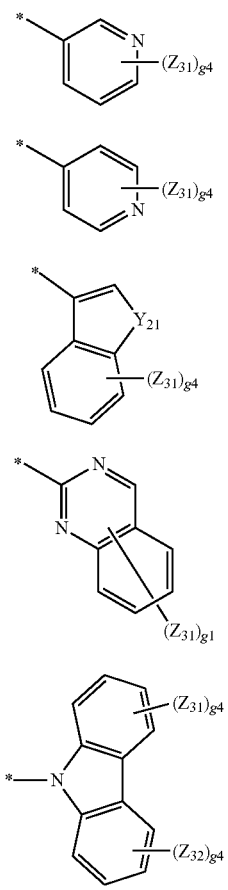

wherein, in Formulae 103-1 to 103-16, $Y_{21}$ is O, S, $C(Z_{41})(Z_{42})$, or $N(Z_{43})$;

$Z_{31}$, $Z_{32}$, and $Z_{41}$ to $Z_{43}$ are, each independently, selected from among a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group;

$Q_{21}$ and $Q_{22}$ are, each independently, selected from among a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group;

g1 is an integer from 1 to 5;
g2 is an integer from 1 to 7;
g3 is an integer from 1 to 3;
g4 is an integer from 1 to 4; and
g5 is 1 or 2.

17. An organic light-emitting device comprising:
a substrate;
a first electrode on the substrate;
a second electrode facing the first electrode;
an emission layer between the first electrode and the second electrode;
a hole migration transfer region between the first electrode and the emission layer, and
an electron migration region between the emission layer and the second electrode,
wherein the hole migration region comprises a first compound represented by Formula 1, the emission layer comprises a host comprising a second compound represented by Formula 100 below and a dopant, and the amount of the dopant is from about 0.01 to about 15 parts by weight based on 100 parts by weight of the host:

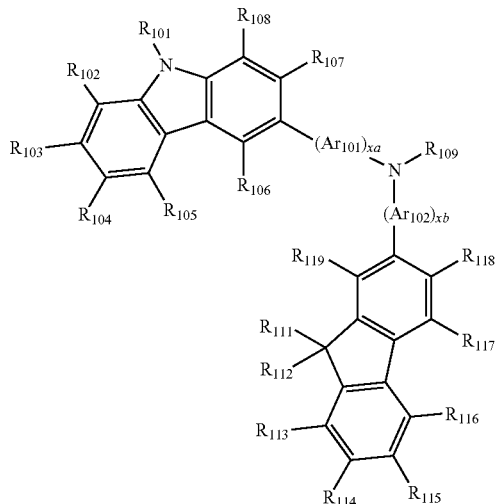

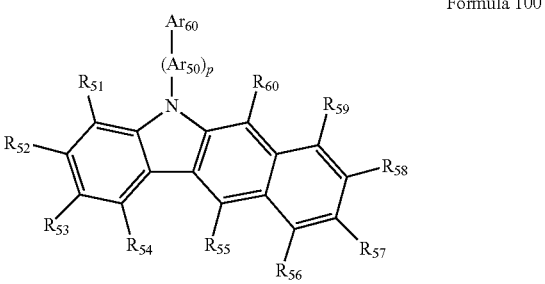

wherein, in Formula 1, $Ar_{101}$ and $Ar_{102}$ are, each independently, a substituted or unsubstituted $C_3$-$C_{10}$ cycloalkylene group, a substituted or unsubstituted $C_2$-$C_{10}$ heterocyclooalkylene group, a substituted or unsubstituted $C_3$-$C_{10}$ cycloalkenylene group, a substituted or unsubstituted $C_2$-$C_{10}$ heterocyclooalkenylene group, a substituted or unsubstituted $C_6$-$C_{60}$ arylene group, or a substituted or unsubstituted $C_2$-$C_{60}$ heteroarylene group;

xa and xb are, each independently, an integer from 0 to 5;

$R_{101}$ and $R_{109}$ are, each independently, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, or a substituted or unsubstituted $C_2$-$C_{60}$ heteroaryl group; and $R_{102}$ to $R_{108}$, and $R_{111}$ to $R_{119}$ are, each independently, a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —N($Q_1$)($Q_2$), or —Si($Q_3$)($Q_4$)($Q_5$) (where $Q_1$ to $Q_5$ are, each independently, a $C_1$-$C_{60}$ alkyl group, a $C_1$-$C_{60}$ alkoxy group, a $C_6$-$C_{60}$ aryl group, or a $C_2$-$C_{60}$ heteroaryl group), and in Formula 100, i) $R_{56}$ and $R_{57}$ are linked to each other to form a substituted or unsubstituted $C_3$-$C_{60}$ cyclic moiety, or a substituted or unsubstituted $C_2$-$C_{60}$ heterocyclic moiety, and $R_{51}$ to $R_{55}$ and $R_{58}$ to $R_{60}$ are, each independently, a substituent represented by —($Ar_{51}$)$_q$—($Ar_{61}$); or ii) $R_{58}$ and $R_{59}$ are linked to each other to form a substituted or unsubstituted $C_3$-$C_{60}$ cyclic moiety, or a substituted or unsubstituted $C_2$-$C_{60}$ heterocyclic moiety, and $R_{51}$ to $R_{57}$ and $R_{60}$ are, each independently, a substituent represented by —($Ar_{51}$)$_q$—($Ar_{61}$);

$Ar_{50}$ and $Ar_{51}$ are, each independently, a substituted or unsubstituted $C_3$-$C_{10}$ cycloalkylene group, a substituted or unsubstituted $C_2$-$C_{r0}$ heterocyclooalkylene group, a substituted or unsubstituted $C_3$-$C_{10}$ cycloalkenylene group, a $C_2$-$C_{10}$ heterocyclooalkenylene group, a substituted or unsubstituted $C_6$-$C_{60}$ arylene group, or a substituted or unsubstituted $C_2$-$C_{60}$ heteroarylene group;

$Ar_{60}$ and $Ar_{61}$ are, each independently, selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, a substituted or unsubstituted $C_2$-$C_{60}$ heteroaryl group, —N($Q_{21}$)($Q_{22}$), and —Si($Q_{23}$)($Q_{24}$)($Q_{25}$) (where $Q_{21}$ and $Q_{22}$ are, each independently, selected from among a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, and a substituted or unsubstituted $C_2$-$C_{60}$ heteroaryl group; and $Q_{23}$ to $Q_{25}$ are, each independently, selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, and a substituted or unsubstituted $C_2$-$C_{60}$ heteroaryl group); and p and q are, each independently, an integer from 0 to 5, wherein when p is 0, $Ar_{60}$ is directly linked to nitrogen in Formula 100.

18. The organic light-emitting device of claim 17, wherein the second compound is a compound represented by Formula 100A or 100B below:

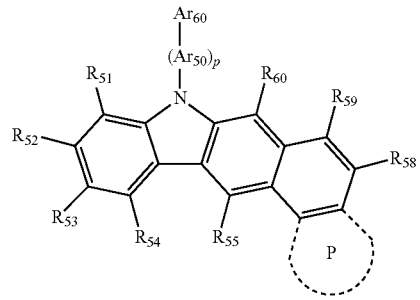

Formula 100A

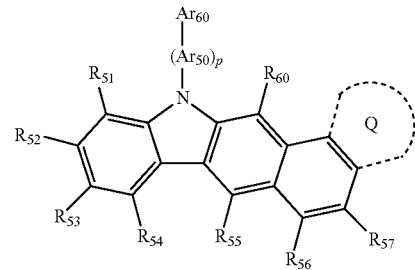

Formula 100B wherein, in Formulae 100A and 100B,

P ring and Q ring are, each independently, selected from among i) benzene, naphthalene, fluorene, carbazole, dibenzofuran, and dibenzothiophene; and ii) benzene, naphthalene, fluorene, carbazole, dibenzofuran, and dibenzothiophene, substituted with at least one selected from among a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group, and a $C_1$-$C_{60}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —$N(Q_{11})(Q_{12})$ (where $Q_{11}$ and $Q_{12}$ are, each independently, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group).

19. The organic light-emitting device of claim 17, wherein the second compound is a compound represented by one of Formulae 100A-1 to 100A-8 and 100B-1 to 100B-9:

Formula 100A-1

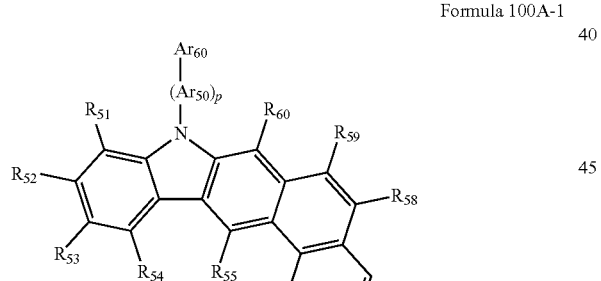

Formula 100A-2

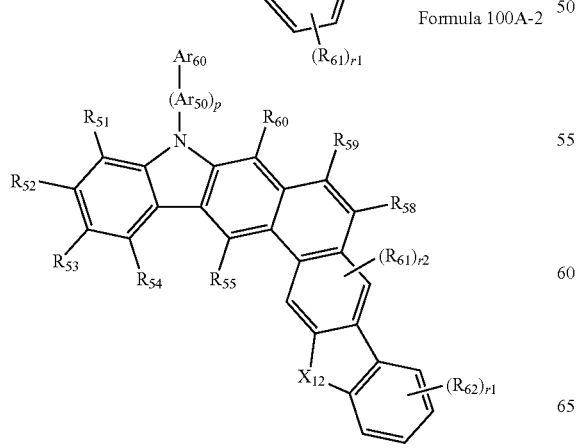

Formula 100A-3

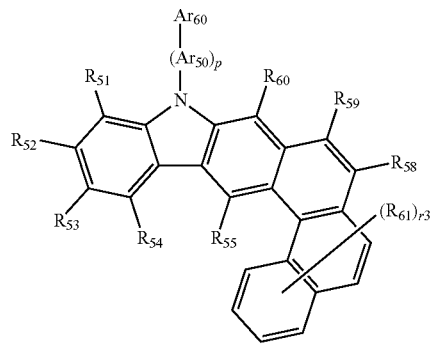

Formula 100A-4

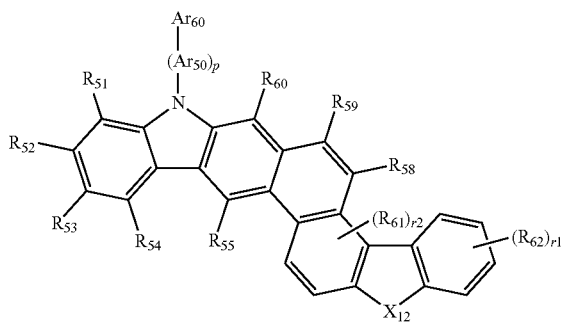

Formula 100A-5

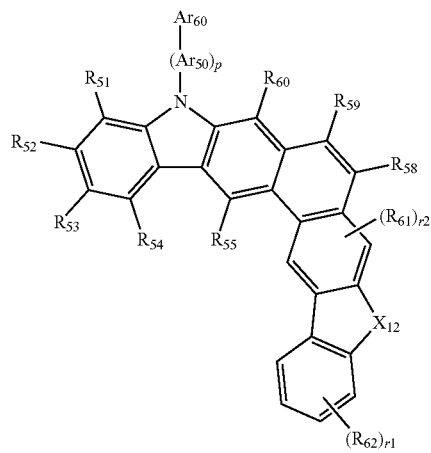

Formula 100A-6

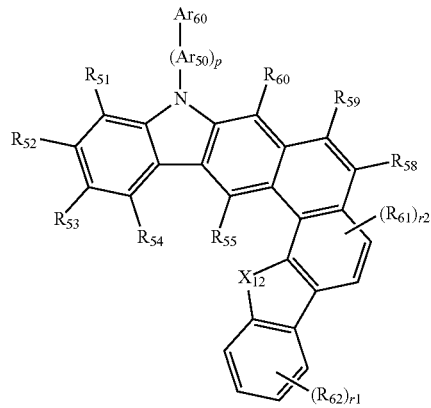

-continued
Formula 100A-7
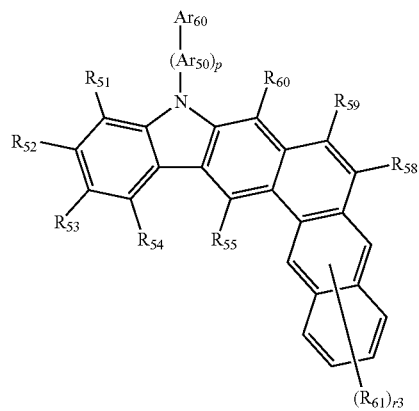
Formula 100A-8
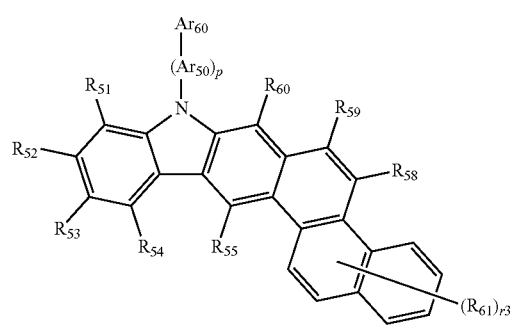
Formula 100B-1
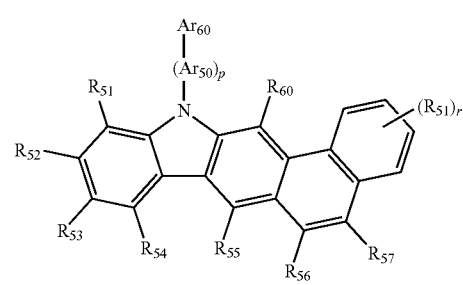
Formula 100B-2
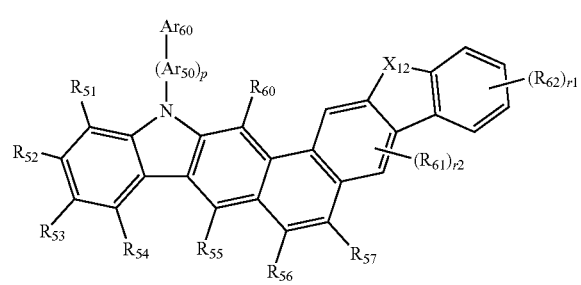
-continued
Formula 100B-3
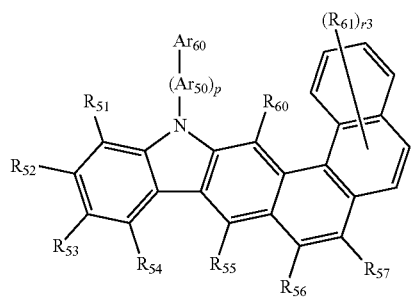
Formula 100B-4
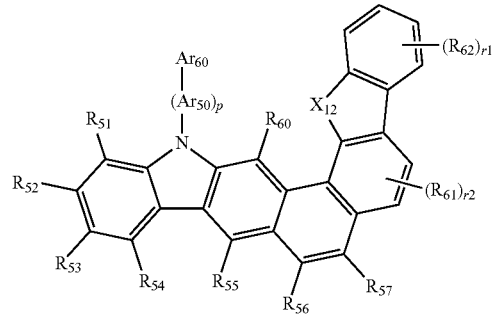
Formula 100B-5
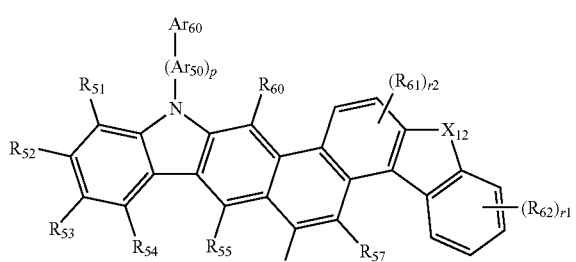
Formula 100B-6
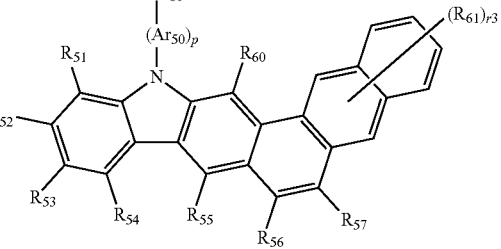
Formula 100B-7
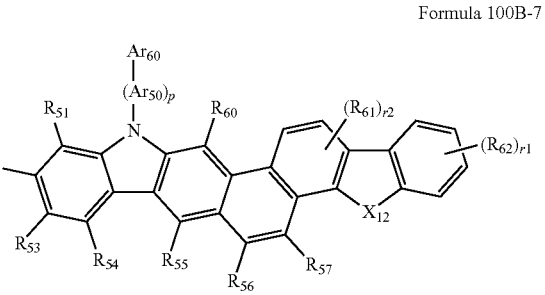

-continued

Formula 100B-8

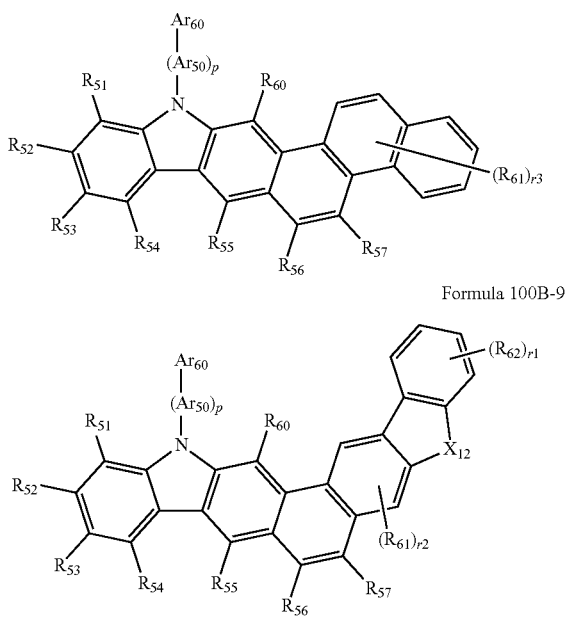

Formula 100B-9 wherein, in Formulae 100A-1 to 100A-8 and 100B-1 to 100B-9, $X_{12}$ is O, S, $C(R_{71})(R_{72})$, or $N(R_{73})$;

$R_{61}$, $R_{62}$, and $R_{71}$ to $R_{73}$ are, each independently, selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof; a phosphoric acid group or a salt thereof; a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and —$N(Q_{11})(Q_{12})$, and —$Si(Q_{11})(Q_{12})(Q_{13})$ (where $Q_{11}$ and $Q_{12}$ are, each independently a $C_6$-$C_{60}$ aryl group or a $C_2$-$C_{60}$ heteroaryl group, and $Q_{13}$ to $Q_{15}$ are, each independently, a $C_1$-$C_{60}$ alkyl group, a $C_1$-$C_{60}$ alkoxy group, a $C_6$-$C_{60}$ aryl group, or a $C_2$-$C_{60}$ heteroaryl group);

r1 is an integer from 1 to 4;

r2 is 1 or 2; and r3 is an integer from 1 to 6.

20. The organic light-emitting device of claim 17, wherein the second compound is a compound represented by Formula 100A-H1 or 100B-H1 below:

Formula 100A-H1

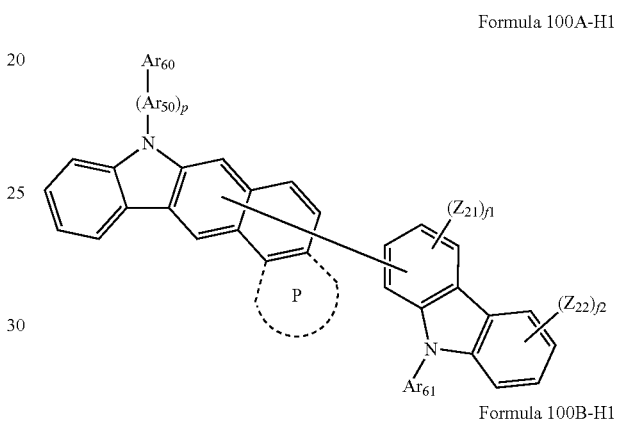

Formula 100B-H1

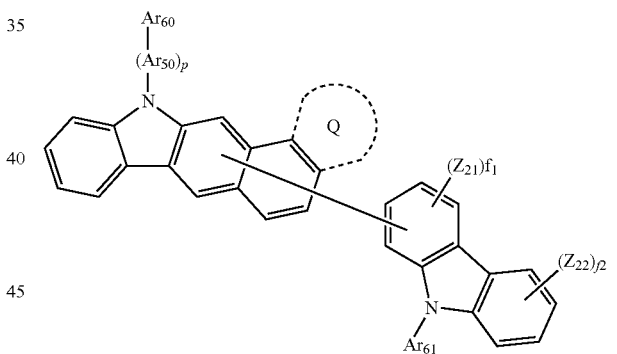

wherein, in Formulae 100A-H1 and 100B-H1,

P ring and Q ring are, each independently, selected from among, i) benzene, naphthalene, fluorene, carbazole, dibenzofuran, and dibenzothiophene; and ii) benzene, naphthalene, fluorene, carbazole, dibenzofuran, and dibenzothiophene, substituted with at least one selected from among a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group, and a $C_1$-$C_{60}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinoinlyl group, and —$N(Q_{11})(Q_{12})$ (where $Q_{11}$ and $Q_{12}$ are, each independently, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group), $Ar_{50}$ and $Ar_{51}$ are, each independently, selected from among, i) a phenylene group, a naphthylene group, a fluorenylene group, a pyridinylene group, a pyrazinylene group, a pyrimidinylene group, a pyridazinylene group, a quinolinylene group, a carbazolylene group, a triazinylene group, a dibenzofuranylene group, and a dibenzothiophenylene group, and ii) a phenylene group, a naphthylene group, a fluorenylene group, a pyridinylene group, a pyrazinylene group, a pyrimidinylene group, a pyridazinylene group, a quinolinylene group, a carbazolylene group, a triazinylene group, a dibenzofuranylene group, and a dibenzothiophenylene group, substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group;

p and q are, each independently, 0, 1, or 2;

$Z_{21}$ to $Z_{22}$ are, each independently, selected from among a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group;

f1 and f2 are, each independently, 0, 1, or 2; and $Ar_{60}$ and $Ar_{61}$ are, each independently, selected from among groups represented by Formulae 103-1 to 103-16 below:

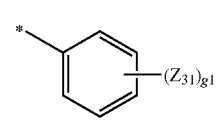

Formula 103-1

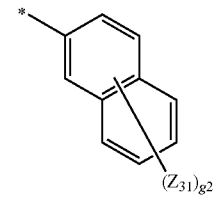

Formula 103-2

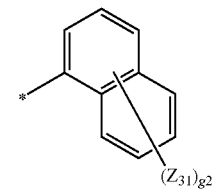

Formula 103-3

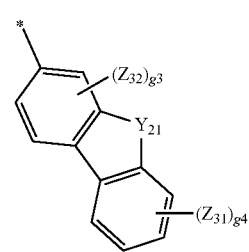

Formula 103-4

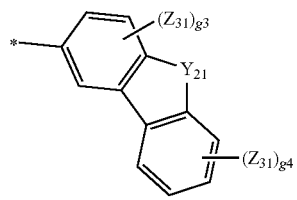

Formula 103-5

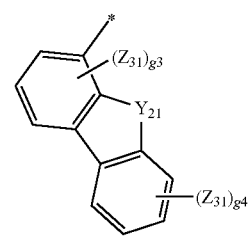

Formula 103-6

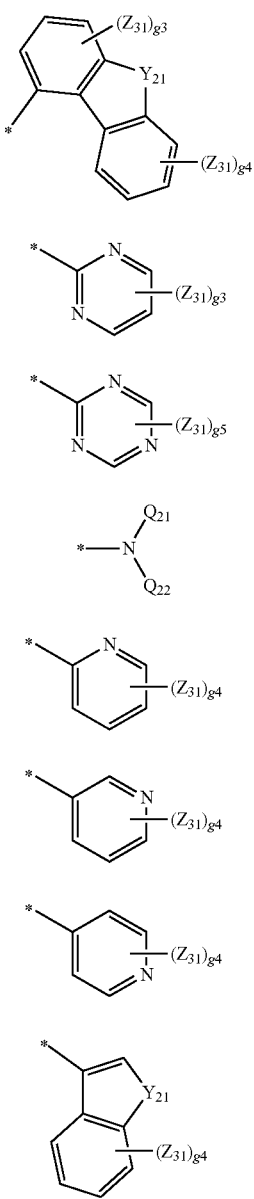
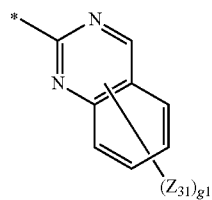
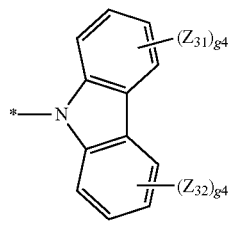

wherein, in Formulae 103-1 to 103-16, $Y_{21}$ is O, S, $C(Z_{41})(Z_{42})$, or $N(Z_{43})$;

$Z_{31}$, $Z_{32}$, and $Z_{41}$ to $Z_{43}$ are, each independently, selected from among a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group;

$Q_{21}$ and $Q_{22}$ are, each independently, selected from among a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group;

g1 is an integer from 1 to 5;
g2 is an integer from 1 to 7;
g3 is an integer from 1 to 3;
g4 is an integer from 1 to 4; and
g5 is 1 or 2.

* * * * *